United States Patent
Yamazaki et al.

(10) Patent No.: US 8,053,294 B2
(45) Date of Patent: Nov. 8, 2011

(54) MANUFACTURING METHOD OF THIN FILM TRANSISTOR BY CONTROLLING GENERATION OF CRYSTAL NUCLEI OF MICROCRYSTALLINE SEMICONDUCTOR FILM

(75) Inventors: Shunpei Yamazaki, Tokyo (JP); Yasuhiro Jinbo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/424,557

(22) Filed: Apr. 16, 2009

(65) Prior Publication Data
US 2009/0261330 A1 Oct. 22, 2009

(30) Foreign Application Priority Data

Apr. 21, 2008 (JP) .................................. 2008-110393

(51) Int. Cl.
| | |
|---|---|
| *H01L 21/00* | (2006.01) |
| *H01L 21/84* | (2006.01) |
| *H01L 29/10* | (2006.01) |
| *H01L 29/76* | (2006.01) |
| *H01L 31/036* | (2006.01) |
| *H01L 31/112* | (2006.01) |
| *H01L 27/108* | (2006.01) |
| *H01L 29/00* | (2006.01) |
| *H01L 29/12* | (2006.01) |
| *H01L 27/14* | (2006.01) |
| *H01L 29/04* | (2006.01) |
| *H01L 29/15* | (2006.01) |

(52) U.S. Cl. ............ 438/158; 438/151; 257/66; 257/71; 257/72

(58) Field of Classification Search .................. None
See application file for complete search history.

(56) References Cited

U.S. PATENT DOCUMENTS 4,409,134 A 10/1983 Yamazaki
(Continued)

FOREIGN PATENT DOCUMENTS

EP 0 449 539 A2 10/1991
(Continued)

OTHER PUBLICATIONS

Ehara et al., "Nitrogen-Doping Effects on Electrical Properties of Hydrogenated Microcrystalline Silicon as Studied by Electron Paramagnetic Resonance and Conductivity", 2000, Jpn. J. Appl. Phys. vol. 39, pp. 31-34.*

(Continued)

*Primary Examiner* — N Drew Richards
*Assistant Examiner* — Michael Jung
(74) *Attorney, Agent, or Firm* — Nixon Peabody, LLP; Jeffrey L. Costellia

(57) ABSTRACT

It is an object to control quality of a microcrystalline semiconductor film or a semiconductor film including crystal grains so that operation characteristics of a semiconductor element typified by a TFT can be improved. It is another object to improve characteristics of a semiconductor element typified by a TFT by controlling a deposition process of a microcrystalline semiconductor film or a semiconductor film including crystal grains. In addition, it is another object to increase on-state current of a thin film transistor and to reduce off-state current of the thin film transistor. In a semiconductor layer including a plurality of crystalline regions in an amorphous structure, generation positions and generation density of crystal nuclei from which the crystalline regions start to grow are controlled, whereby quality of the semiconductor layer is controlled. In addition, after generation of crystal nuclei from which the crystalline regions start to grow in the semiconductor layer, an impurity element serving as a donor is added to the semiconductor layer, whereby crystallinity of the semiconductor layer is increased and the resistivity of the semiconductor layer is reduced.

17 Claims, 24 Drawing Sheets

U.S. PATENT DOCUMENTS

| | | | |
|---|---|---|---|
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,023,075 A | 2/2000 | Yamazaki |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,468,839 B2 | 10/2002 | Inoue et al. |
| 6,483,124 B2 | 11/2002 | Flewitt |
| 6,737,676 B2 | 5/2004 | Yamazaki |
| 6,756,258 B2 | 6/2004 | Zhang et al. |
| 6,835,523 B1 | 12/2004 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 2001/0019154 A1* | 9/2001 | Yamazaki et al. ............ 257/347 |
| 2002/0009819 A1 | 1/2002 | Flewitt |
| 2005/0014319 A1* | 1/2005 | Yamazaki et al. ............ 438/197 |
| 2005/0022864 A1 | 2/2005 | Fujioka et al. |
| 2005/0085003 A1 | 4/2005 | Kishimoto et al. |
| 2005/0214455 A1 | 9/2005 | Li et al. |
| 2007/0295399 A1 | 12/2007 | Carlson |
| 2009/0242889 A1* | 10/2009 | Nakayama ...................... 257/57 |
| 2009/0261328 A1* | 10/2009 | Miyairi et al. .................. 257/57 |
| 2010/0096631 A1* | 4/2010 | Miyairi et al. .................. 257/57 |
| 2010/0099217 A1 | 4/2010 | Isa et al. |

FOREIGN PATENT DOCUMENTS

| | | |
|---|---|---|
| EP | 0 535 979 A2 | 4/1993 |
| EP | 1 505 174 A1 | 2/2005 |
| JP | 57-071126 | 5/1982 |
| JP | 58-092217 | 6/1983 |
| JP | 62-062073 | 3/1987 |
| JP | 62-062073 | 12/1987 |
| JP | 01-144682 A | 6/1989 |
| JP | 02-001174 A | 1/1990 |
| JP | 02-053941 | 2/1990 |
| JP | 02-053941 B2 | 11/1990 |
| JP | 04-242724 | 8/1992 |
| JP | 05-102454 A | 4/1993 |
| JP | 06-326312 | 11/1994 |
| JP | 2000-277439 | 10/2000 |
| JP | 2001-007024 | 1/2001 |
| JP | 2004-014958 | 1/2004 |
| JP | 2005-049832 | 2/2005 |
| JP | 2005-167051 | 6/2005 |
| JP | 2005-322845 A | 11/2005 |
| WO | WO 02/07207 A1 | 1/2002 |

OTHER PUBLICATIONS

Arai et al., 41.2: Micro Silicon Technology for Active Matrix OLED Display, SID Digest '07 : SID International Symposium Digest of Technical Papers, vol. XXXVIII , pp. 1370-1373, 2007.

Kim et al, 42.1: A Novel Four-Mask-Count Process Architecture for TFT-LCDS, SID Digest '00 : SID International Symposium Digest of Technical Papers, pp. 1006-1009, 2000.

Song et al., 34.1: Advanced Four-Mask-Process Architecture for the A-SI TFT Array Manufacturing Method, SID Digest '02 : SID International Symposium Digest of Technical Papers, pp. 1038-1041, 2002.

Choi et al., P-16: Novel Four-Mask Process in the FFS TFT-LCD With Optimum Multiple-Slit Design Applied by the Use of a Gray-Tone Mask, SID Digest '05 : SID International Symposium Digest of Technical Papers, pp. 284-287, 2005.

Fujiwara et al., Stress-Induced Nucleation of Microcrystalline Silicon From Amorphous Phase, Jpn. J. Appl. Phys., 41/Part1, 2821-2828, 2002.

Kamei et al., A Significant Reduction of Impurity Contents in Hydrogenated Microcrystalline Silicon Films for Increased Grain Size and Reduced Defect Density, Jpn. J. Appl. Phys., 37/Part2, L265-L268, 1998.

Lee et al., How to Achieve High Mobility Thin Film Transistors by Direct Deposition of Silicon Using 13.56 MHz RF PECVD?, Int. Electron Devices Meeting Tech. Digest, p. 295-298, 2006.

Czhang et al., Directly Deposited Nanocrystalline Silicon Thin-Film Transistors With Ultra High Mobilities, Appl. Phys. Lett., 89, pp. 252101-1-252101-3, 2006.

Fujiwara et al., Real-time spectroscopic ellipsometry studies of the nucleation and grain growth processes in microcrystalline silicon thin films, Phys. Rev. B, 63, 115306-1-115306-9, 2001.

Fujiwara et al., Microcrystalline silicon nucleation sites in the sub-surface of hydrogenated amorphous silicon, Sur. Sci., 497, pp. 333-340, 2002, Lee et al., "Stability of NC-SI:H TFTS With Silicon Nitride Gate Dielectric," IEEE Transactions on Electron Devices, 2007, vol. 54, No. 1, pp. 45-51.

"International Search Report (Application No. PCT/JP2009/057816) Dated Jun. 23, 2009".

"Written Opinion (Application No. PCT/JP2009/057816) Dated Jun. 23, 2009".

"International Search Report (Application No. PCT/JP2009/057711) Dated Jun. 30, 2009".

"Written Opinion (Application No. PCT/JP2009/057711) Dated Jun. 30, 2009".

* cited by examiner (A-1)

(A-2)

(B-1)

(B-2)

MANUFACTURING METHOD OF THIN FILM TRANSISTOR BY CONTROLLING GENERATION OF CRYSTAL NUCLEI OF MICROCRYSTALLINE SEMICONDUCTOR FILM

BACKGROUND OF THE INVENTION

1. Field of the Invention

The present invention relates to a thin film transistor and a manufacturing method thereof, and a semiconductor device and a display device which include the thin film transistor.

2. Description of the Related Art

Thin film transistors (hereinafter also referred to as "TFTs") are already widely used in a field of liquid crystal displays. A TFT is a kind of field-effect transistor and is named after the fact that a thin semiconductor film for forming a channel is formed. At present, a technique for manufacturing a TFT using amorphous silicon or polycrystalline silicon as the thin semiconductor film has already been put into practical use.

A semiconductor material called "microcrystalline silicon" has been known for a long time together with amorphous silicon and polycrystalline silicon, and there has also been a report on microcrystalline silicon related to a field-effect transistor (e.g., see Patent Document 1: U.S. Pat. No. 5,591,987). However, TFTs using microcrystalline silicon has been buried between an amorphous silicon transistor and a polycrystalline silicon transistor up to today; thus, there has been a delay in practical use, and reports thereof are made merely at an academic society level (e.g., see Non-Patent Document 1: Toshiaki Arai et al., "SID '07 DIGEST" 2007, pp. 1370-1373).

A microcrystalline silicon film can be formed over a substrate made of glass or the like, by decomposing source gases with plasma (weakly-ionized plasma) by a plasma CVD method; however, it has been considered that it is difficult to control generation of crystal nuclei and crystal growth because reaction proceeds in a non-equilibrium state.

Various researches have been made on microcrystalline silicon. According to a hypothesis, growth mechanism of microcrystalline silicon is as follows: first, a portion of an amorphous phase, in which atoms are aligned randomly, grows over a substrate, and then nuclei of crystals start to grow (see Non-Patent Document 2: Hiroyuki Fujiwara et al., "Japanese Journal of Applied Physics (Jpn. J. Appl. Phys.)" vol. 41, 2002, pp. 2821-2828). In Non-Patent Document 2, it is considered that the density of microcrystalline silicon nuclei can be controlled with the concentration of a hydrogen gas used in forming a film because peculiar silicon-hydrogen bonds are observed on an amorphous surface when nuclei of microcrystalline silicon start to grow.

Further, influence on a growing surface of a microcrystalline silicon film due to an impurity element such as oxygen or nitrogen has also been considered. There is knowledge that by reducing the concentration of the impurity element, the crystal grain diameter of a microcrystalline silicon film is increased, and thus the defect density (especially, the defective charge density) is reduced (see Non-Patent Document 3: Toshihiro Kamei et al., "Japanese Journal of Applied Physics (Jpn. J. Appl. Phys.)" vol. 37, 1998, pp. L265-L268).

Further, there is a point of view that in order to improve operation characteristics of a TFT, the purity of a microcrystalline silicon film should be improved, and a microcrystalline silicon film in which the concentrations of oxygen, nitrogen, and carbon are $5 \times 10^{16}$ cm$^{-3}$, $2 \times 10^{18}$ cm$^{-3}$, and $1 \times 10^{18}$ cm$^{-3}$, respectively, and effective mobility is improved was reported (see Non-Patent Document 4: C.-H. Lee, et al., "International Electron Devices Meeting Technical Digest (Int. Electron Devices Meeting Tech. Digest), 2006, pp 295-298). In addition, a microcrystalline semiconductor film in which a deposition temperature by a plasma CVD method is 150° C., the concentration of oxygen is reduced to $1 \times 10^{16}$ cm$^{-3}$, and effective mobility is improved was reported (see Non-Patent Document 5: Czang-Ho Lee et al., "Applied Physics Letters (Appl. Phys. Lett.), vol. 89, 2006, p 252101).

SUMMARY OF THE INVENTION

However, in a method for forming a microcrystalline silicon film in such a manner that after an amorphous silicon film is formed, a photothermal conversion layer formed using a metal material is provided and laser irradiation is performed, crystallinity can be improved; however, in terms of productivity, there is no advantage over a polycrystalline silicon film formed by laser annealing.

Finding in a model of growth of microcrystalline silicon that peculiar silicon-hydrogen bonding is observed on an amorphous surface when nuclei of microcrystalline silicon start to grow is effective; however, nuclei generation positions and nuclei generation density cannot be controlled directly.

Further, even if the purity of a microcrystalline silicon film is improved and the impurity concentration is reduced, whereby a microcrystalline silicon film the crystal grain diameter of which is increased and the defect density of which (especially, the defective charge density) is reduced can be obtained, it means only change in physical property values of a microcrystalline silicon film and it does not always improve element characteristics of a TFT or the like. A semiconductor element is operated by intentionally controlling flow of carriers of electrons or holes which flow through a semiconductor; however, there is no effect unless quality of a microcrystalline silicon film in a place where the carriers flow can be improved in consideration of the place.

In view of the above, it is an object of one embodiment of the present invention to control quality of a microcrystalline semiconductor film or a semiconductor film including crystal grains so that operation characteristics of a semiconductor element typified by a TFT can be improved. It is another object of one embodiment of the present invention to improve characteristics of a semiconductor element typified by a TFT by controlling a deposition process of a microcrystalline semiconductor film or a semiconductor film including crystal grains. In addition, it is another object of one embodiment of the present invention to increase on-state current of a thin film transistor and to reduce off-state current of the thin film transistor.

One embodiment of the present invention is that in a semiconductor layer including a plurality of crystalline regions in an amorphous structure, generation positions and generation density of crystal nuclei from which the crystalline regions start to grow are controlled, whereby quality of the semiconductor layer is controlled. Another embodiment of the present invention is that in a thin film transistor in which a semiconductor layer including a plurality of crystalline regions in an amorphous structure is used as a channel formation region, generation positions and generation density of crystal nuclei from which the crystalline regions start to grow are controlled in accordance with a region where carries flow. Further, another embodiment of the present invention is that after generation of crystal nuclei from which the crystalline regions start to grow in the semiconductor layer, an impurity element capable of serving as a donor is added to the semiconductor layer, whereby crystallinity of the semiconductor layer is increased and the resistivity of the semiconductor layer is reduced.

A semiconductor layer including a plurality of crystalline regions in an amorphous structure is formed using, as a reactive gas, a gas in which a semiconductor source gas and a dilution gas are mixed at a mixture rate at which a microcrystalline semiconductor can be generated. The reactive gas is introduced into an ultrahigh vacuum treatment chamber where a concentration of oxygen is reduced, and a predetermined pressure is maintained to generate glow discharge plasma. Accordingly, a film is deposited over a substrate which is placed in the treatment chamber. In an early stage of deposition, an impurity element which disturbs generation of crystal nuclei is included in the treatment chamber to start deposition of a film and the concentration of the impurity element is reduced gradually, whereby crystal nuclei are generated and crystalline regions are formed based on the crystal nuclei.

It is preferable to use nitrogen or a nitride as an impurity element which disturbs generation of crystal nuclei. In the case of making nitrogen contained in the semiconductor layer, the concentration of nitrogen in the semiconductor layer, which is measured by secondary ion mass spectrometry (SIMS), is $1\times10^{20}$ cm$^{-3}$ to $1\times10^{21}$ cm$^{-3}$. The peak concentration of nitrogen in the vicinity of the interface between a gate insulating layer and the semiconductor layer, which is measured by secondary ion mass spectrometry, is $3\times10^{20}$ cm$^{-3}$ to $1\times10^{21}$ cm$^{-3}$ and the concentration of nitrogen is reduced in a thickness direction of the semiconductor layer from the vicinity of the interface between the gate insulating layer and the semiconductor layer, whereby nuclei generation positions, from which the crystalline regions start to grow, and nuclei generation density are controlled.

Note that as for an impurity element which suppresses generation of crystal nuclei, an impurity element in silicon (e.g., nitrogen) which does not trap carriers is selected. On the other hand, the concentration of an impurity element (e.g., oxygen) which reduces the coordination number of silicon and generates dangling bonds is reduced. That is, it is preferable that the concentration of oxygen be less than or equal to $5\times10^{18}$ cm$^{-3}$.

In addition, after formation of the above crystal nuclei, a gas including an impurity element capable of serving as a donor is introduced into the treatment chamber together with or separately from a semiconductor source gas capable of generating a microcrystalline semiconductor, so that the growth rate of the above crystal nuclei to be a microcrystalline semiconductor is increased and the electric conductivity at an upper portion of the above semiconductor layer is increased. Accordingly, carriers flow in the region. For this reason, a thin film transistor which is one embodiment of the present invention has a buried channel structure.

The element capable of serving as a donor is an element belonging to Group 15 of the periodic table. Specifically, phosphorus, arsenic, antimony, bismuth, or the like is given. Further, the concentration of the impurity element serving as a donor is $1\times10^{16}$/cm$^3$ to $3\times10^{18}$/cm$^3$, preferably $1\times10^{17}$/cm$^3$ to $3\times10^{18}$/cm$^3$.

A thin film transistor which is one embodiment of the present invention has a semiconductor layer including a plurality of crystalline regions in an amorphous structure and a buffer layer including an amorphous semiconductor, over the semiconductor layer. The buffer layer is provided on a side opposite to the side on which the semiconductor layer is in contact with a gate insulating layer and provided on the side of a so-called back channel. In other words, the buffer layer is provided between a pair of semiconductor layers including an impurity element imparting one conductivity type, which form source and drain regions, which is provided so that a plurality of crystalline regions of the semiconductor layer including the plurality of crystalline regions in an amorphous structure is embedded and the semiconductor layer is not exposed on the back channel side.

Further, the concentration is measured by secondary ion mass spectrometry when descriptions of other measurement methods are not made.

In a semiconductor layer including a plurality of crystalline regions in an amorphous structure, generation density and generation positions of the crystalline regions can be controlled. Further, an impurity element serving as a donor is included in an upper portion of the semiconductor layer. By using such a semiconductor layer as a channel formation region of a thin film transistor, on-state current can be increased. In addition, by providing a buffer layer over the semiconductor layer, the off-state current of the thin film transistor can be reduced.

BRIEF DESCRIPTION OF THE DRAWINGS

FIGS. 8A-1 and 8A-2 and FIGS. 8B-1 and 8B-2 are drawings illustrating an example of a method for manufacturing a thin film transistor according to embodiments.

DETAILED DESCRIPTION OF THE INVENTION

Embodiment

Figure 1A:
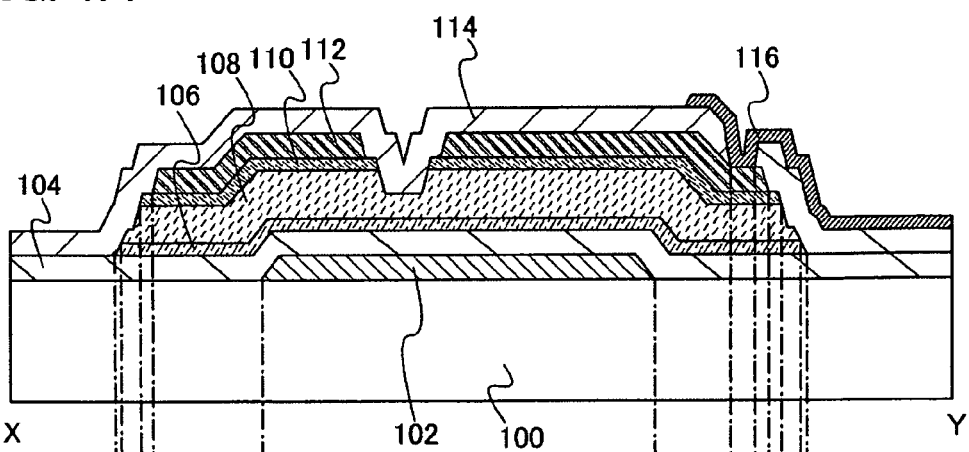
FIGS. 1A and 1B are drawings illustrating an example of a thin film transistor according to embodiments.

Hereinafter, the embodiments will be described with reference to the drawings. However, the present invention is not limited to the following description. This is because it is easily understood by those skilled in the art that modes and details thereof can be modified in various ways without departing from the spirit and scope of the present invention. Thus, the present invention should not be interpreted as being limited to the following description of the embodiments. Note that in the description on structures of the present invention, which is made with reference to the drawings, the same reference numerals are commonly used to denote the same components in different drawings. The same hatching pattern is applied to similar portions, and the similar portions are not especially denoted by reference numerals in some cases.

Embodiment 1

In this embodiment, an example of a mode of a thin film transistor will be described with reference to drawings.

Figure 1B:
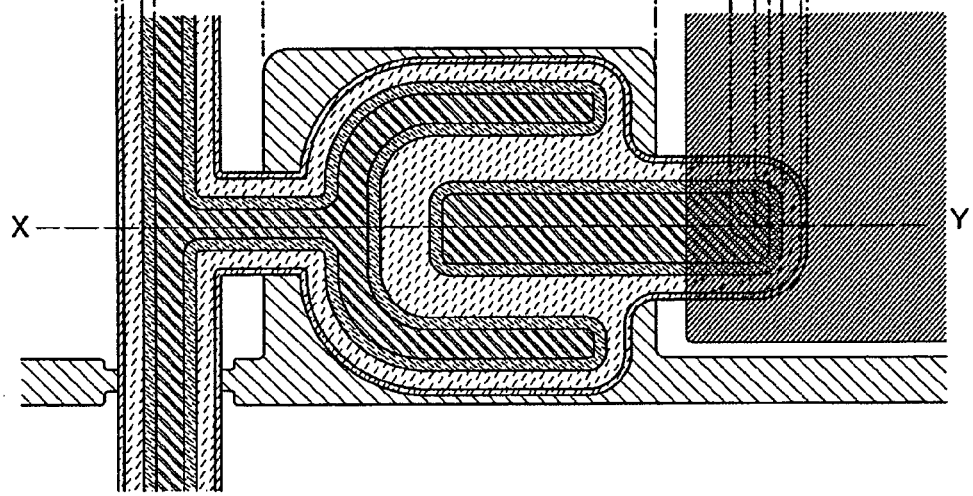

FIGS. 1A and 1B are a top view and a cross-sectional view of a thin film transistor according to this embodiment, respectively. The thin film transistor illustrated in FIG. 1A includes a gate electrode layer 102 over a substrate 100; a gate insulating layer 104 covering the gate electrode layer 102; a semiconductor layer 106 to which an impurity element serving as a donor is added and which is provided over and in contact with the gate insulating layer 104; a buffer layer 108 over the semiconductor layer 106 to which an impurity element serving as a donor is added; and source and drain regions 110 provided over and in contact with the buffer layer 108. Further, the thin film transistor includes wiring layers 112 provided over and in contact with the source and drain regions 110. The wiring layers 112 form source and drain electrodes. The thin film transistor includes, over the wiring layers 112, an insulating layer 114 which functions a protective film. Further, each layer is patterned into a desired shape.

Note that the thin film transistor illustrated in FIGS. 1A and 1B can be applied to a pixel transistor provided in a pixel portion of a liquid crystal display device. Therefore, in an example illustrated in FIGS. 1A and 1B, an opening is provided in the insulating layer 114 and a pixel electrode layer 116 is provided over the insulating layer 114, so that the pixel electrode layer 116 and one of the wiring layers 112 are connected to each other.

Further, one of the source and drain electrodes is formed so as to have a U shape (a reversed C shape or a horseshoe shape), and surrounds the other of the source and drain electrodes. The distance between the source and drain electrodes is kept almost constant (see FIG. 1B).

The source and drain electrodes of the thin film transistor have the above shape, whereby a channel width of the thin film transistor can be increased, and thus the amount of current is increased. In addition, variation in electric characteristics can be reduced. Further, decrease in reliability due to deviation of a mask pattern in a manufacturing process can be suppressed. However, without limitation thereto, one of the source and drain electrodes does not necessarily have a U shape.

Here, the semiconductor layer 106 to which an impurity element serving as a donor is added which is one of main features of this embodiment is described. The semiconductor layer 106 to which an impurity element serving as a donor is added functions as a channel formation region of the thin film transistor. In the semiconductor layer 106 to which an impurity element serving as a donor is added, crystal grains including a crystalline semiconductor exist in a semiconductor layer having an amorphous structure in a dispersed manner (see FIG. 2A).

The semiconductor layer 106 to which an impurity element serving as a donor is added includes a first region 106a and a second region 106b. The first region 106a has an amorphous structure. The second region 106b has a plurality of crystal grains 121 existing in a dispersed manner and a semiconductor layer 122 having an amorphous structure between the plurality of crystal grains 121. In the second region 106b, an impurity element serving as a donor is included in the above crystal grains 121 and the semiconductor layer 122 having an amorphous structure. Further, the concentration of the impurity element serving as a donor which is contained in the above crystal grains 121 and the semiconductor layer 122 having an amorphous structure in the second region 106b, is $1 \times 10^{16}/cm^3$ to $3 \times 10^{18}/cm^3$, preferably $1 \times 10^{17}/cm^3$ to $3 \times 10^{18}/cm^3$. Accordingly, the crystal grain diameter of the crystal grain 121 is increased and the electric conductivity of the second region 106b is increased. Thus, the on-state current and field-effect mobility of a thin film transistor using the semiconductor layer 106 to which an impurity element serving as a donor is added as a channel formation region can be increased. Note that if the concentration of the impurity element serving as a donor is greater than $3 \times 10^{18}/cm^3$, carriers easily flow to the second region 106b when the thin film transistor is turned off. Thus, the off-state current increases, which is not preferable. In addition, if the concentration of the impurity element serving as a donor is lower than $1 \times 10^{17}/cm^3$, the crystal grain diameter of the crystal grain 121 cannot be expected to be increased and the electric conductivity of the second region 106b cannot be increased. Accordingly, the on-state current and field-effect mobility of a thin film transistor using the second region 106b as a channel formation region cannot be expected to be increased.

Figure 2A:
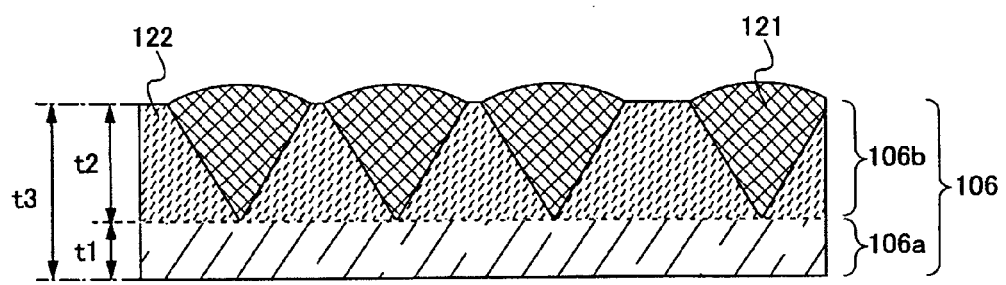
FIGS. 2A and 2B are drawings illustrating a semiconductor layer included in a thin film transistor according to embodiments.
Figure 2B:
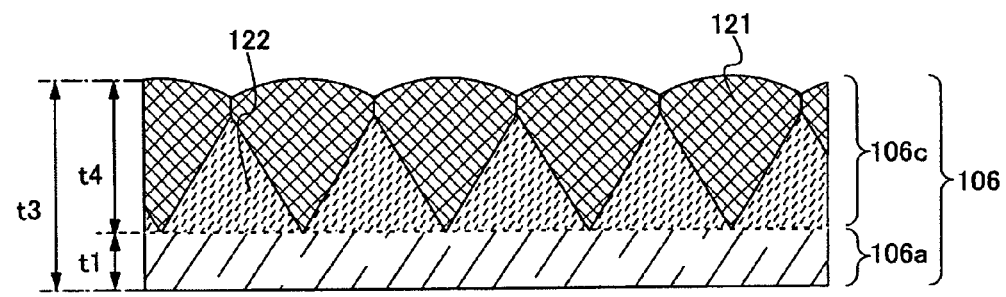

The crystal grain 121 has an inverted conical or inverted pyramidal shape. The term "inverted conical or inverted pyramidal shape" means a three-dimensional shape that is enclosed by a base which is surrounded by a closed curve or a closed polyline and is formed with a plurality of planes, and one face including a line that connects a point on the closed curve or polyline with a vertex which is away from the base or plural faces including lines that connect points thereon with the vertex; and the vertex exists on a substrate side. That is, an "inverted conical or inverted pyramidal shape" is a shape of the crystal grain 121 which grows approximately radially in a direction in which the semiconductor layer 106 to which an impurity element serving as a donor is added is deposited, from a position away from the interface between the gate insulating layer 104 and the semiconductor layer 106 to which an impurity element serving as a donor is added. Each of crystal nuclei formed in a dispersed manner grows along crystal orientation at the same time as formation of the semiconductor layer to which an impurity element serving as a donor is added, whereby the crystal grains start to grow from the crystal nuclei so as to spread radially in an in-plane direction of a plane perpendicular to a direction of crystal growth. Further, the crystal grain 121 includes a single crystal or twin crystals. Here, crystal plane directions of a side surface of the crystal grain 121 having an inverted conical or inverted pyramidal shape are aligned and the side surface (the line that connects a point on the closed curve or polyline with a vertex) is straight (FIGS. 2A and 2B). Therefore, it can be considered that the crystal grain 121 is close to a single crystal or a form including twin crystals rather than a form including a plurality of crystals. In the case of the form including twin crystals, the number of dangling bonds is small; therefore, the number of defects and the amount of off-state current are small as compared to the case of the form including a plurality of crystals. Further, the number of grain boundaries is small and the amount of on-state current is large in the case of the form including twin crystals as compared to the case of the form including a plurality of crystals. Note that the crystal grain 121 may include a plurality of crystals.

Note that the term "twin crystals" means that two different crystal grains are bonded to each other with highly favorable consistency at a crystal boundary. In other words, the "twin crystals" has a structure in which a trap level due to crystal defects or the like is hardly formed with crystal lattices continuously arranged at a crystal boundary. Thus, it can be considered that a crystal boundary does not substantially exist in a region having such a crystal structure.

Further, in the semiconductor layer 106 to which an impurity element serving as a donor is added, crystal grains each including a crystalline semiconductor may be adjacent to each other in the semiconductor layer having an amorphous structure. FIG. 2B illustrates such a situation. The semiconductor layer 106 to which an impurity element serving as a donor is added includes the first region 106a and a second region 106c. The first region 106a has an amorphous semiconductor. The second region 106c includes a plurality of adjacent crystal grains 121 and the semiconductor layer 122 having an amorphous structure between the plurality of adjacent crystal grains 121. Furthermore, in the second region 106c, an impurity element serving as a donor is contained in the above crystal grains 121 and the semiconductor layer 122 having an amorphous structure.

In FIG. 2B, the crystal grain 121 includes a single crystal or twin crystals. In addition, in the case where angles of apexes of the crystal grains each having an inversed-conic or inversed-pyramidal shape are substantially similar, a single crystal or twin crystals having substantially similar plane orientation of the crystal grains 121 are included. Thus, in a region which is in contact with the crystal grain 121 having an inversed-conic or inversed-pyramidal shape, a barrier is not easily caused and carriers easily move.

Further, an upper portion of the semiconductor layer 106 to which an impurity element serving as a donor is added which is illustrated in FIGS. 2A and 2B (i.e., the second regions 106b and 106c) includes an impurity element serving as a donor, and thus the upper portion of the semiconductor layer 106 to which an impurity element serving as a donor is added has high crystallinity and high electric conductivity as compared to the conventional semiconductor layer. Therefore, a thin film transistor including the semiconductor layer 106 to which an impurity element serving as a donor is added at a channel formation region has a buried channel structure. Note that in a thin film transistor with a buried structure, carriers move inside the semiconductor layer to which an impurity element serving as a donor is added, that is, a region in a film growth direction which is apart from an interface between the gate insulating layer 104 and the semiconductor layer 106 to which an impurity element serving as a donor is added at a certain distance. Thus, reduction in carrier mobility due to surface scattering of the interface between the semiconductor layer 106 to which an impurity element serving as a donor is added and the gate insulating layer 104 is not caused, whereby the on-state current and mobility can be increased.

The first region 106a is in contact with the gate insulating layer 104 and is provided up to a position of a thickness t1 from the interface with the gate insulating layer 104. The second regions 106b and 106c are in contact with the first region 106a and are provided up to a position of a thickness t2. That is, nuclei generation positions of the crystal grains 121 are controlled in a thickness direction of the semiconductor layer 106 to which an impurity element serving as a donor is added so that the nuclei generation positions are t1 from the interface with the gate insulating layer 104. The nuclei generation positions of the crystal grains 121 are controlled by the concentration of an impurity element suppressing crystallization which is contained in the semiconductor layer 106 to which an impurity element serving as a donor is added (e.g., the concentration of nitrogen).

Note that as an impurity element which suppresses generation of crystal nuclei, an impurity element (e.g., nitrogen) in silicon, which does not trap carriers, is selected. On the other hand, a concentration of an impurity element (e.g., oxygen) which reduces the coordination number of silicon and generates dangling bonds is reduced. Accordingly, the concentration of oxygen is preferably reduced without reducing the concentration of nitrogen. Specifically, it is preferable that the concentration of oxygen be less than or equal to $5 \times 10^{18}$ cm$^{-3}$.

Further, in this embodiment, the semiconductor layer 106 to which an impurity element serving as a donor is added is formed with nitrogen existing on the surface of the gate insulating layer 104. Here, the concentration of nitrogen is important because it determines nuclei generation positions. When the semiconductor layer 106 to which an impurity element serving as a donor is added is formed over the gate insulating layer 104 on which nitrogen exists, first, the first region 106a is formed, and after that, the second regions 106b and 106c are formed. Here, the position of the interface between the first region 106a and the second regions 106b and 106c are determined by the concentration of nitrogen. When the concentration of nitrogen is greater than or equal to $1 \times 10^{20}$ cm$^{-3}$ and less than or equal to $1 \times 10^{21}$ cm$^{-3}$, preferably greater than or equal to $2 \times 10^{20}$ cm$^{-3}$ and less than or equal to $7 \times 10^{20}$ cm$^{-3}$, crystal nuclei are generated, and thus the second regions 106b and 106c are formed. That is, in generation positions of the crystal nuclei from which the crystal grains 121 start to grow, the concentration of nitrogen is greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$. In other words, at apexes of the crystal grains 121 each having an inversed-conic or inversed-pyramidal shape, the concentration of nitrogen is greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$.

Further, the concentration of nitrogen is reduced gradually as a distance from the interface between the gate insulating layer 104 and the semiconductor layer 106 to which an impurity element serving as a donor is added becomes longer. The concentration of nitrogen is preferably reduced by one digit in the range of greater than or equal to 25 nm and less than or equal to 40 nm from the interface between the gate insulating layer 104 and the semiconductor layer 106 to which an impurity element serving as a donor is added, more preferably in the range of greater than or equal to 30 nm and less than or equal to 35 nm.

Note that when an impurity element which suppresses generation of the crystal nuclei exists at a high concentration (the concentration is about greater than or equal to $1\times10^{20}$ cm$^{-3}$), crystal growth is also suppressed; therefore, nitrogen which is to be contained in the semiconductor layer 106 to which an impurity element serving as a donor is added is added to only a surface over which the semiconductor layer is deposited, and alternatively, nitrogen is introduced only in an early stage of deposition of the semiconductor layer 106 to which an impurity element serving as a donor is added.

Further, the buffer layer 108 is provided over the semiconductor layer 106 to which an impurity element serving as a donor is added. By provision of the buffer layer 108, the off-state current can be reduced.

Note that a very thin insulating layer may be provided at the interface between the semiconductor layer 106 to which an impurity element serving as a donor is added and the buffer layer 108. By provision of the very thin insulating layer, an impurity element serving as a donor is not diffused into the buffer layer 108. Thus, electric conductivity of the buffer layer 108 can be held low. As a result, increase in the off-state current can be suppressed.

Next, a method for manufacturing the thin film transistor illustrated in FIGS. 1A and 1B is described. An n-channel thin film transistor has higher carrier mobility than a p-channel thin film transistor. In addition, it is preferable that all thin film transistors formed over one substrate have the same polarity because the number of manufacturing processes can be reduced. Therefore, in this embodiment, a method for manufacturing an n-channel thin film transistor is described.

Figure 3A:
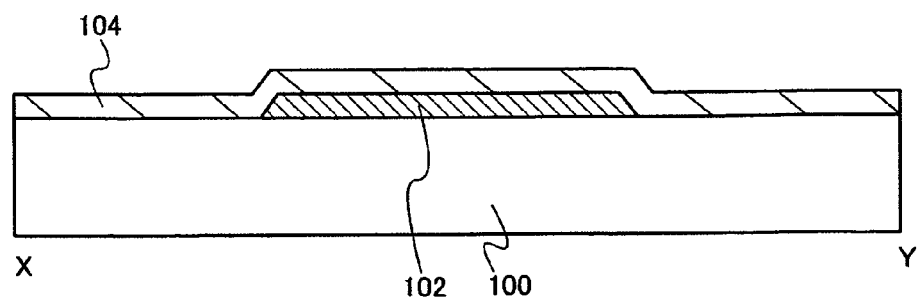
FIGS. 3A to 3D are drawings illustrating an example of a method for manufacturing a thin film transistor according to embodiments.

First, the gate electrode layer 102 is formed over the substrate 100 (see FIG. 3A).

As the substrate 100, a substrate having an insulating surface is preferable. Typically, in addition to a glass substrate and a ceramic substrate, a plastic substrate or the like with heat resistance which can withstand a process temperature of this manufacturing process can be used. In the case where a substrate does not need a light-transmitting property, a substrate in which an insulating layer is provided on a surface of a substrate of a metal such as a stainless steel alloy may be used. As a glass substrate, an alkali-free glass substrate formed using barium borosilicate glass, aluminoborosilicate glass, aluminosilicate glass, or the like may be used. In the case where the substrate 100 is a mother glass, the substrate may have any of the following sizes: the first generation (e.g., 320 mm×400 mm) not only to the seventh generation (e.g., 1870 mm×2200 mm) or the eighth generation (e.g., 2200 mm×2400 mm), but also to the ninth generation (e.g., 2400 mm×2800 mm) or the tenth generation (e.g., 2950 mm×3400 mm).

The gate electrode layer 102 can be formed in a single layer or a stacked layer using a metal material such as molybdenum, titanium, chromium, tantalum, tungsten, aluminum, copper, neodymium, or scandium, or an alloy material which includes any of these materials as a main component. In the case of using aluminum, when an Al—Ta alloy in which aluminum is alloyed with tantalum added thereto is used, hillocks are preferably suppressed, which is preferable. Further, when an Al—Nd alloy in which aluminum is alloyed with neodymium added thereto is used, resistance can be reduced and generation of hillocks can be suppressed, which is more preferable. Alternatively, an AgPdCu alloy or a semiconductor layer typified by polycrystalline silicon doped with an impurity element such as phosphorus may be used. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride layer is stacked over a copper layer is preferable. When a metal layer functioning as a barrier layer is stacked over a layer with low electric resistance, electric resistance can be reduced and diffusion of a metal element from the metal layer into the semiconductor layer can be prevented. Alternatively, a two-layer structure including a titanium nitride layer and a molybdenum layer, or a three-layer structure in which a 50 nm thick tungsten layer, a 500 nm thick alloy layer of aluminum and silicon, and a 30 nm thick titanium nitride layer are stacked may be used. In the case where a three-layer structure is employed, a tungsten nitride layer may be used instead of the tungsten layer of the first conductive layer; an aluminum-titanium alloy layer may be used instead of the aluminum-silicon alloy layer of the second conductive layer; or a titanium layer may be used instead of the titanium nitride layer of the third conductive layer. For example, when a molybdenum layer is stacked over an aluminum-neodymium alloy layer, a conductive layer which has excellent heat resistance and electrically low resistance can be formed.

The gate electrode layer 102 can be formed in such a manner that a conductive layer is formed over the substrate 100, using the above material by a sputtering method or a vacuum evaporation method, a mask is formed over the conductive layer by a photolithography method, an inkjet method, or the like, and the conductive layer is etched using the mask. Alternatively, the gate electrode layer 102 can be formed by discharging a conductive nanopaste of silver, gold, copper, or the like over the substrate by an inkjet method and baking the conductive nanopaste. Note that a nitride layer of any of the above metal materials may be provided between the substrate 100 and the gate electrode layer 102 as barrier metal which increases adhesion between the substrate 100 and the gate electrode layer 102 and prevents diffusion to a base. Here, the conductive layer is formed over the substrate 100, and etching is performed using a resist mask which is formed using a photomask.

Note that it is preferable that side surfaces of the gate electrode layer 102 be tapered. This is in order to reduce defective formation at a stepped portion because the semiconductor layer and the wiring layers are formed over the gate electrode layer 102. In order that the side surfaces of the gate electrode layer 102 are tapered, etching may be performed while the resist mask is made to recede. For example, by making an oxygen gas contained in an etching gas, etching can be performed while the resist mask is made to recede.

Through the step of forming the gate electrode layer 102, a gate wiring (a scanning line) can also be formed at the same time. Further, a capacitor line included in a pixel portion can also be formed at the same time. Note that the term "scanning line" used herein means a wiring which selects a pixel, while the term "capacitor line" means a wiring which is connected to one electrode of a storage capacitor in a pixel. However, without limitation thereto, the gate electrode layer 102 and either or both a gate wiring and a capacitor wiring may be formed separately.

Figure 3B:
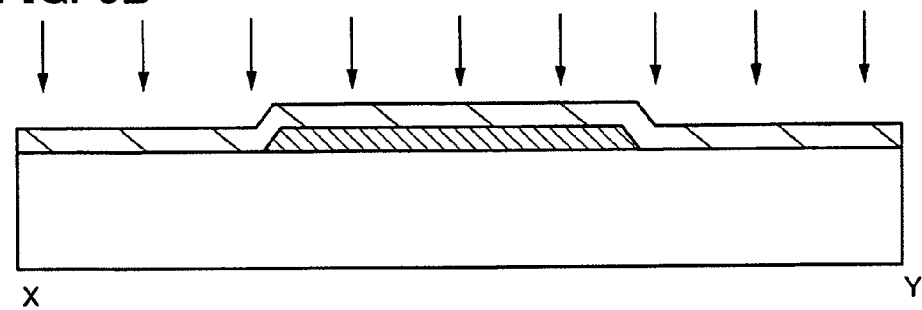
Figure 3C:
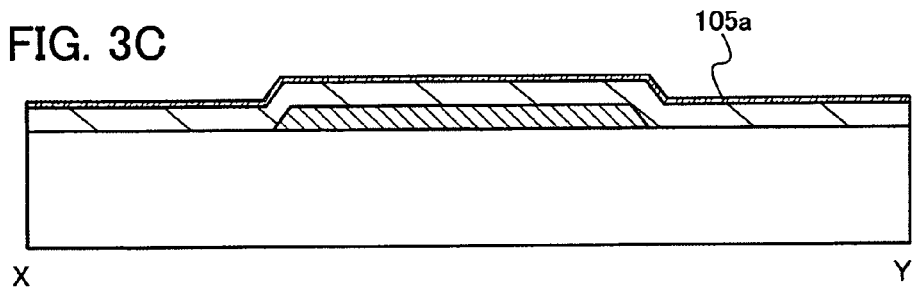
Figure 3D:
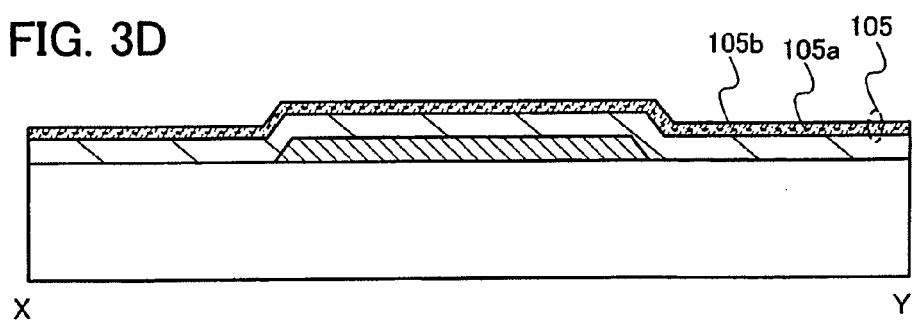

Next, the gate insulating layer 104 is formed so as to cover the gate electrode layer 102 (see FIG. 3B). The gate insulating layer 104 can be formed in a single layer or a stacked layer using a silicon oxide layer, a silicon nitride layer, a silicon oxynitride layer, or a silicon nitride oxide layer by a CVD method, a sputtering method, or the like. Further, in the case where the gate insulating layer 104 is formed by a CVD method, the gate insulating layer 104 can be formed by a plasma CVD method with a high-frequency electric power of 1 MHz to 20 MHz, typically 13.56 MHz, or a high-frequency electric power of 20 MHz to about 120 MHz, typically, 27.12 MHz or 60 MHz. Further, it is preferable that the gate insulating layer 104 be formed using a microwave plasma CVD apparatus with a high frequency (about 1 GHz). When the gate insulating layer 104 is formed by a microwave plasma CVD apparatus with a high frequency, the withstand voltage between a gate electrode and a drain electrode or a source electrode can be improved; therefore, a highly-reliable thin film transistor can be obtained. Further, the gate insulating layer 104 is formed using silicon oxynitride, so that fluctuation in a threshold voltage of a transistor can be suppressed.

For example, silicon oxynitride contains more oxygen than nitrogen and, in the case where measurements are performed using rutherford backscattering spectrometry (RBS) and hydrogen forward scattering (HFS), includes oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

Note that in the case of forming the gate insulating layer 104 using silicon nitride, a thin silicon oxynitride layer is formed over the gate insulating layer 104, whereby deterioration that occur at initial operation of a thin film transistor can be suppressed. Here, the silicon oxynitride layer may be formed extremely thin, which may be as thin as 1 nm or more. The thickness is preferably greater than or equal to 1 nm and less than or equal to 3 nm.

Next, a method for forming the semiconductor layer 106 to which an impurity element serving as a donor is added is described. The semiconductor layer 106 to which an impurity element serving as a donor is added may be formed with a thickness of greater than or equal to 2 nm and less than or equal to 60 nm, preferably greater than or equal to 10 nm and less than or equal to 30 nm. In the semiconductor layer 106 to which an impurity element serving as a donor is added, the concentration of nitrogen is made higher than the concentration of oxygen, so that the concentration of nitrogen is reduced in accordance with a growth direction of crystal grains from the gate insulating film, whereby generation of crystal nuclei of crystal grains is controlled. Next, crystal nuclei of the crystal grains are generated, and then a gas including an impurity element serving as a donor is introduced into the treatment chamber so that the crystal grain diameter of the crystal grains is increased and the deposition speed of a semiconductor layer is increased.

Further, as described above, the semiconductor layer 106 to which an impurity element serving as a donor is added includes crystal grains each having an inversed-conic or inversed-pyramidal shape. For example, the crystal grains each having an inversed-conic or inversed-pyramidal shape can be formed while nuclei generation of the crystal grains is controlled in such a manner that the concentration of oxygen contained in the semiconductor layer 106 to which an impurity element serving as a donor is added is reduced, the concentration of nitrogen is made higher than the concentration of oxygen, and the concentration of nitrogen is reduced in accordance with a growth direction of the crystal grains. Here, it is preferable that the concentration of nitrogen be one or more digits higher than the concentration of oxygen. More specifically, the concentration of oxygen and the concentration of nitrogen at the interface between the gate insulating layer 104 and the semiconductor layer 106 to which an impurity element serving as a donor is added are less than or equal to $5\times10^{18}$ cm$^{-3}$ and greater than or equal to $1\times10^{20}$ cm$^{-3}$ and less than or equal to $1\times10^{21}$ cm$^{-3}$, respectively. Further, the crystal grains each having an inversed-conic or inversed-pyramidal shape are formed in such a manner that the concentration of oxygen is suppressed and the concentration of nitrogen is made higher than the concentration of oxygen.

In the semiconductor layer 106 to which an impurity element serving as a donor is added, the first region 106a is formed using a semiconductor source gas and hydrogen and the second region 106b is formed using a gas including an impurity element serving as a donor in addition to the above semiconductor source gas and hydrogen. As the semiconductor source gas, a silicon hydride gas such as $SiH_4$, $Si_2H_6$, $GeH_4$, and $Ge_2H_6$, a silicon chloride gas such as $SiH_2Cl_2$, $SiHCl_3$, and $SiCl_4$, and a silicon fluoride gas such as $SiF_4$ are given. Further, as the gas including an impurity element serving as a donor, $PH_3$, $AsH_3$, $SbH_3$, $BiH_3$, and the like are given.

One method in which the concentration of oxygen is suppressed and the concentration of nitrogen is made higher than the concentration of oxygen is a method in which the surface of the gate insulating layer 104 contains a large amount of nitrogen before the semiconductor layer 106 to which an impurity element serving as a donor is added is formed. In order that the surface of the gate insulating layer 104 contains a large amount of nitrogen, nitrogen may remain and may be deposited to the surface of the gate insulating layer 104 after the gate insulating layer 104 is formed and before the semiconductor layer 106 to which an impurity element serving as a donor is added is formed. Further, the surface of the gate insulating layer 104 may be processed with plasma generated by a gas including nitrogen. Here, as examples of the gas including nitrogen, ammonia, nitrogen, nitrogen chloride, and nitrogen fluoride are given.

Another method in which the concentration of oxygen is suppressed and the concentration of nitrogen is made higher than the concentration of oxygen is a method in which nitrogen is contained at a high concentration in the gate insulating layer 104 which is in contact with the semiconductor layer 106 to which an impurity element serving as a donor is added.

Accordingly, the gate insulating layer 104 should be formed using silicon nitride. Note that this method is described in Embodiment 3.

Another method in which the concentration of oxygen is suppressed and the concentration of nitrogen is made higher than the concentration of oxygen is a method in which an inner wall of a treatment chamber used for forming the semiconductor layer 106 to which an impurity element serving as a donor is added is covered with a film containing nitrogen at a high concentration. As a material containing nitrogen at a high concentration, silicon nitride can be given, for example. Note that a film which contains nitrogen at a high concentration and covers the inner wall of the treatment chamber may be formed at the same time as the gate insulating layer 104, which is preferable because a step can be simplified. Further, in this case, the gate insulating layer 104 and the semiconductor layer 106 to which an impurity element serving as a donor is added are formed in the same treatment chamber; therefore, a device is downsized. Note that this method is described in Embodiment 4.

Furthermore, another method in which the concentration of oxygen is suppressed and the concentration of nitrogen is made higher than the concentration of oxygen is a method in which the concentration of oxygen included in gases used for forming the semiconductor layer 106 to which an impurity element serving as a donor is added is suppressed and the concentration of nitrogen is increased. At this time, nitrogen may be introduced into only gases used in an early stage of deposition of the semiconductor layer 106 to which an impurity element serving as a donor is added, or the amount of nitrogen to be introduced may be reduced. Note that, this method is described in Embodiment 5.

As described above, one method in which a gas including an impurity element serving as a donor is introduced into a treatment chamber after generation of crystal nuclei of crystal grains is a method in which a gas including an impurity element serving as a donor is introduced into a treatment chamber together with a deposition gas, whereby glow discharge is performed and a semiconductor layer 105 to which an impurity element serving as a donor is added is formed.

As described above, another method in which a gas including an impurity element serving as a donor is introduced into a treatment chamber after generation of crystal nuclei of crystal grains is a method in which a gas including an impurity element serving as a donor is introduced into a treatment chamber after a power supply is turned off and the impurity element serving as a donor is attached to the inside of the treatment chamber and the surface of the first region 106a. After the introduction of the gas including an impurity element serving as a donor is halted, source gases of a semiconductor (silane and hydrogen) are introduced into the treatment chamber and glow discharge is performed so that the second region 106b is deposited while taking in the impurity element serving as a donor, which is attached to the inner wall of the treatment chamber and the first region 106a. Note that this method is described in Embodiment 2.

In order that the concentration of oxygen is suppressed and the concentration of nitrogen is made higher than the concentration of oxygen, any of the methods described above or a combination thereof may be used. In this embodiment, the gate insulating layer 104 has a structure in which a silicon oxynitride layer is stacked over a silicon nitride layer. The gate insulating layer 104 is exposed to ammonia, whereby the surface of the gate insulating layer 104 is supplied with nitrogen.

Figure 6:
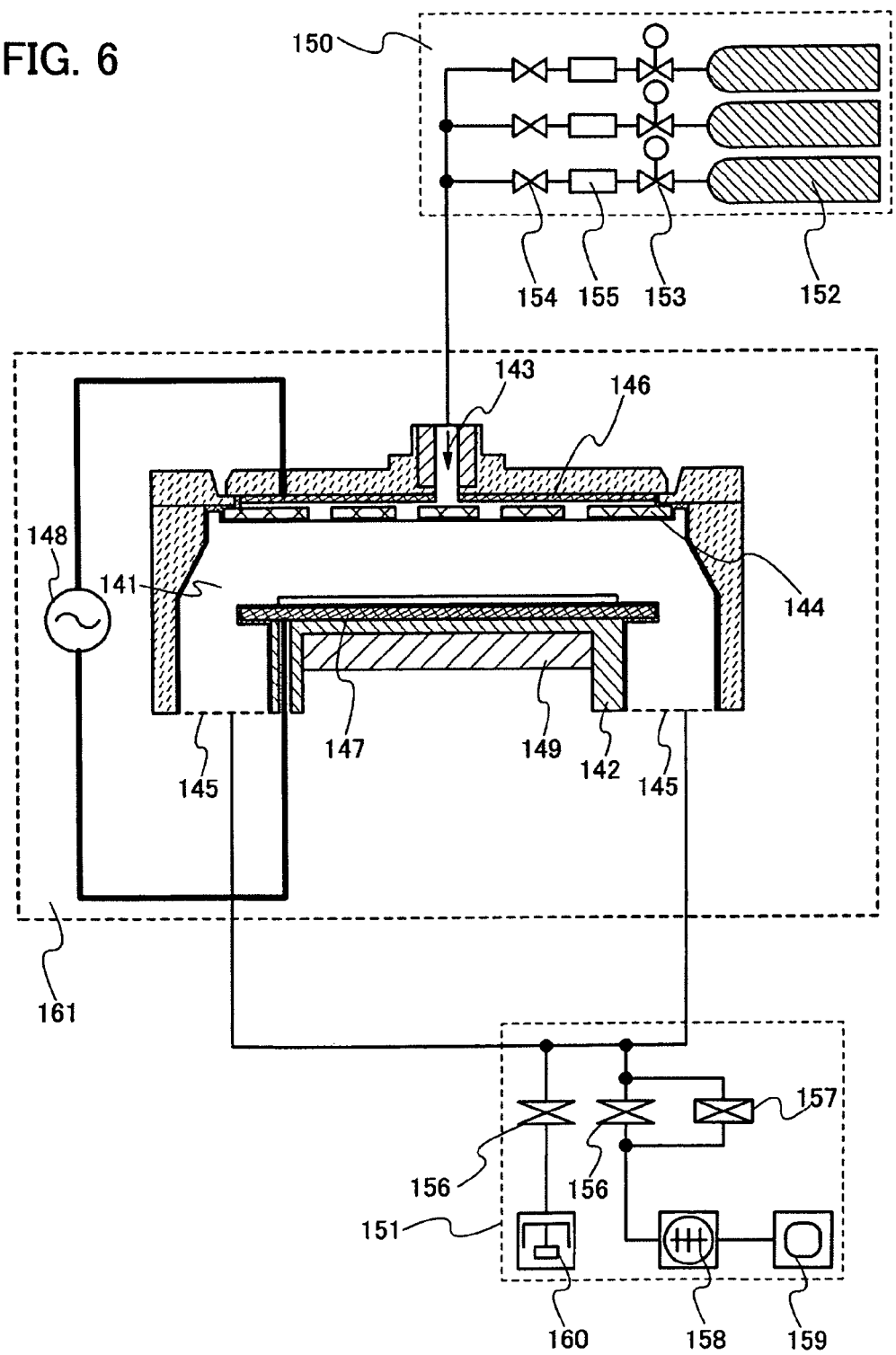
FIG. 6 is a drawing illustrating an apparatus which can be employed in a method for manufacturing a thin film transistor according to embodiments.

Here, an example of forming the gate insulating layer 104, the semiconductor layer 106 to which an impurity element serving as a donor is added, the source and drain regions 110 is described in detail. These layers are formed by a CVD method or the like. Further, the gate insulating layer 104 has a stacked-layer structure in which a silicon oxynitride layer is formed over a silicon nitride layer. By employing such a structure, the silicon nitride layer can prevent an element included in the substrate which adversely affects electric characteristics (an element such as sodium in the case where the substrate is a glass substrate) from entering the semiconductor layer 106 to which an impurity element serving as a donor is added or the like. FIG. 6 is a schematic view illustrating a CVD apparatus which is used for forming these layers.

A plasma CVD apparatus 161 illustrated in FIG. 6 is connected to a gas supply means 150 and an exhaust means 151.

The plasma CVD apparatus 161 illustrated in FIG. 6 includes a treatment chamber 141, a stage 142, a gas supply portion 143, a shower plate 144, an exhaust port 145, an upper electrode 146, a lower electrode 147, an alternate-current power source 148, and a temperature control portion 149.

The treatment chamber 141 is formed using a material having rigidity and the inside thereof can be evacuated to vacuum. The treatment chamber 141 is provided with the upper electrode 146 and the lower electrode 147. Note that in FIG. 6, a structure of a capacitive coupling type (a parallel plate type) is illustrated; however, another structure such as that of an inductive coupling type can be used, as long as plasma can be generated in the treatment chamber 141 by applying two or more different high-frequency powers.

When treatment is performed with the plasma CVD apparatus illustrated in FIG. 6, a given gas is supplied from the gas supply portion 143. The supplied gas is introduced into the treatment chamber 141 through the shower plate 144. High-frequency power is applied with the alternate-current power source 148 connected to the upper electrode 146 and the lower electrode 147 to excite the gas in the treatment chamber 141, whereby plasma is generated. Further, the gas in the treatment chamber 141 is exhausted through the exhaust port 145 which is connected to a vacuum pump. Further, the temperature control portion 149 makes it possible to perform plasma treatment while an object to be processed is being heated.

The gas supply means 150 includes a cylinder 152 which is filled with a reactive gas, a pressure adjusting valve 153, a stop valve 154, a mass flow controller 155, and the like. The treatment chamber 141 includes a shower plate which is processed into a plate-like shape and provided with a plurality of pores, between the upper electrode 146 and the substrate 100. A reactive gas introduced into the upper electrode 146 is introduced into the treatment chamber 141 from these pores through an inner hollow structure.

The exhaust means 151 which is connected to the treatment chamber 141 has a function of vacuum evacuation and a function of controlling the pressure inside the treatment chamber 141 to be maintained at a predetermined level when a reactive gas is made to flow. The exhaust means 151 includes in its structure a butterfly valve 156, a conductance valve 157, a turbo molecular pump 158, a dry pump 159, and the like. In the case of arranging the butterfly valve 156 and the conductance valve 157 in parallel, the butterfly valve 156 is closed and the conductance valve 157 is operated, so that the evacuation speed of the reactive gas is controlled, and thus the pressure in the treatment chamber 141 can be kept in a predetermined range. Moreover, the butterfly valve 156 having higher conductance is opened, so that high-vacuum evacuation can be performed.

In the case of performing ultra-high vacuum evacuation up to a pressure lower than $10^{-5}$ Pa on the treatment chamber 141, a cryopump 160 is preferably used together. Alternatively, when exhaust is performed up to ultra-high vacuum as ultimate vacuum, the inner wall of the treatment chamber 141 may be polished into a mirror surface, and the treatment chamber 141 may be provided with a heater for baking in order to reduce deflation from the inner wall.

Note that as illustrated in FIG. 6, precoating treatment is performed so that a film which covers the entire treatment chamber 141 is formed. Accordingly, impurity elements attached to the inner wall of the treatment chamber or impurity elements contained in the inner wall of the treatment chamber are prevented from being mixed into the element. In this embodiment, a film containing silicon as a main component may be formed by the precoating treatment. For example, amorphous silicon or the like may be formed. However, oxygen is preferably not contained in this film.

A mode of a series of steps from a step of forming of the gate insulating layer 104 to a step of forming the impurity semiconductor layer 109 having one conductivity type is described below with reference to FIG. 7. Note that the gate insulating layer 104 is formed by stacking a silicon oxynitride layer over a silicon nitride layer.

Figure 7:
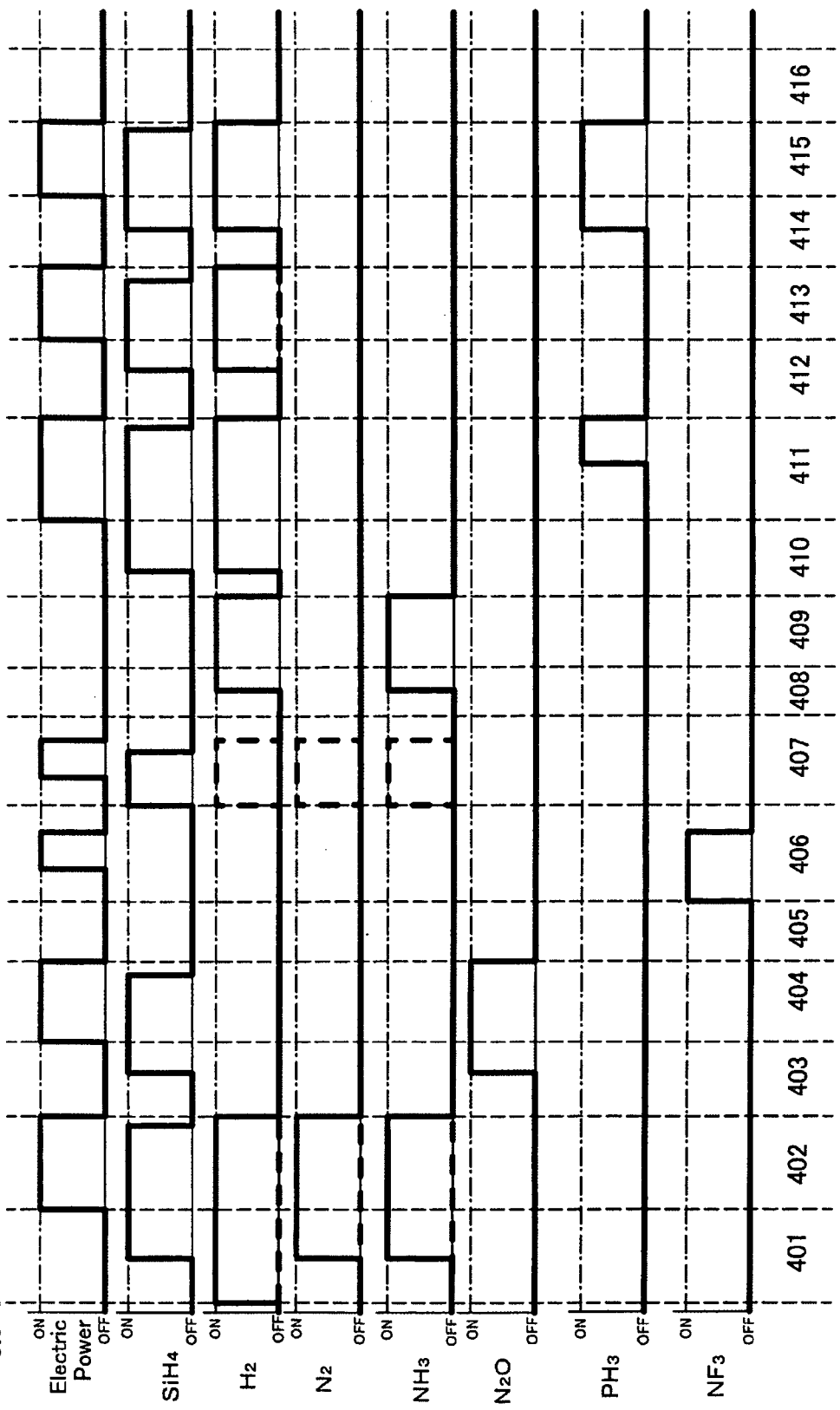
FIG. 7 is a drawing illustrating an example of a method for manufacturing a thin film transistor according to embodiments.

First, a substrate provided with the gate electrode layer 102 is heated in a treatment chamber 141 of a CVD apparatus, and in order to form a silicon nitride layer, source gases used for depositing silicon nitride are introduced into the treatment chamber 141 (preliminary treatment 401 in FIG. 7). Here, as an example, $SiH_4$, $H_2$, $N_2$, and $NH_3$ are introduced into the treatment chamber 141 as source gases at flow rates of 40 sccm, 500 sccm, 550 sccm, and 140 sccm, respectively, and are stabilized; further, the pressure in the treatment chamber 141 is set to be 100 Pa, the substrate temperature is set to be 280° C., and plasma discharge is performed at an output of 370 W, so that a silicon nitride layer is formed with a thickness of about 110 nm. After that, only the introduction of $SiH_4$ is halted, and several seconds later, plasma discharge is halted (formation of SiN 402 in FIG. 7). When plasma discharge is halted in a state where there is still $SiH_4$ in the treatment chamber, granular compounds which contain silicon as main components or mealy compounds are formed, which cause reduction in yield.

Next, the source gases used for depositing silicon nitride are exhausted, and source gases used for depositing silicon oxynitride are introduced into the treatment chamber 141 (replacement of gases 403 in FIG. 7). Here, as an example, $SiH_4$ and $N_2O$ are introduced as source gases at flow rates of 30 sccm and 1200 sccm, respectively, and are stabilized; further, the pressure in the treatment chamber is set to be 40 Pa, the substrate temperature is set to be 280° C., and plasma discharge is performed at an output of 50 W, so that a silicon oxynitride layer is formed with a thickness of about 110 nm. After that, in a manner similar to that of the silicon nitride layer, only the introduction of $SiH_4$ is halted, and several seconds later, plasma discharge is halted (formation of SiON 404 in FIG. 7).

Through the above steps, the gate insulating layer 104 can be formed. After formation of the gate insulating layer 104, the substrate 100 is transferred to a load lock chamber from the treatment chamber 141 (unload 405 in FIG. 7).

Next, the substrate 100 is carried out of the treatment chamber 141, and then an $NF_3$ gas is introduced into the treatment chamber 141 and the inside of the treatment chamber 141 is cleaned (cleaning 406 in FIG. 7). After that, treatment for forming a protective film on the inner wall of the treatment chamber is performed. Here, as an example, $SiH_4$ is introduced as a source gas at the flow rate of 300 sccm and is stabilized; further, the pressure in the treatment chamber is set to be 160 Pa, the substrate temperature is set to be 280° C., and plasma discharge is performed at an output of 120 W, so that an amorphous silicon layer is formed as a protective film. After that, the introduction of $SiH_4$ is halted, and several seconds later, plasma discharge is halted (precoating treatment 407 in FIG. 7).

Note that in the precoating treatment, a silicon nitride layer may be formed as a protective film instead of an amorphous silicon layer as illustrated by a broken line in FIG. 7 under conditions similar to those of formation of the silicon nitride layer provided for the gate insulating layer.

After that, the substrate 100 is carried into the treatment chamber 141 (load 408 in FIG. 7).

Next, the surface of the gate insulating layer 104 is supplied with nitrogen. Here, by exposing the surface of the gate insulating layer 104 to an ammonia gas, the surface of the gate insulating layer 104 is supplied with nitrogen (flushing treatment 409 in FIG. 7). Further, hydrogen may be contained in the ammonia gas. Here, as an example, the pressure in the treatment chamber 141 is set to be about 20 Pa to 30 Pa, the substrate temperature is set to be 280° C., and the treatment time is set to be 60 seconds. Further, after the flushing treatment, the pressure is controlled by reducing or applying a pressure in the treatment chamber 141 so that the amount of nitrogen contained in the treatment chamber 141 may be controlled. Note that in the treatment of this step, only exposure to an ammonia gas is performed; however, plasma treatment may be performed. After that, these gases are exhausted and among source gases used for depositing the semiconductor layer 105 to which an impurity element serving as a donor is added, gases other than gases including an impurity element serving as a donor are introduced into the treatment chamber 141 (replacement of gases 410 in FIG. 7).

Next, the semiconductor layer 105 to which an impurity element serving as a donor is added is formed over an entire surface of the gate insulating layer 104 which is supplied with nitrogen. In a later step, the semiconductor layer 105 to which an impurity element serving as a donor is added is patterned into the semiconductor layer 106 to which an impurity element serving as a donor is added. First, the source gases used for depositing the semiconductor layer 105 to which an impurity element serving as a donor is added are introduced into the treatment chamber 141. Here, as an example, $SiH_4$ and $H_2$ are introduced as source gases at flow rates of 10 sccm and 1500 sccm, respectively, and are stabilized; further, the pressure in the treatment chamber 141 is set to be 280 Pa, and the substrate temperature is set to be 280° C., and plasma discharge is performed at an output of 50 W. When the concentration of nitrogen contained in the semiconductor layer is reduced and crystal nuclei of the crystal grains are generated, 10 ppm $PH_3$ (diluted with $H_2$), $SiH_4$, and $H_2$ are introduced into the treatment chamber from the gas supply means 150 at flow rates of 10 sccm, 10 sccm, and 1500 sccm, respectively, while the pressure, the temperature, and the electric power are maintained, so that a semiconductor layer including a layer to which an impurity element serving as a donor is added at an upper portion can be formed with a thickness of about 50 nm. Note that in the case where $PH_3$ is diluted with $SiH_4$, $PH_3$ (diluted with $SiH_4$) and $H_2$ may be used for formation. After that, in a manner similar to that of the silicon nitride layer or the like described above, only the introduction of $SiH_4$ is halted, and several seconds later, plasma discharge is halted (formation of a semiconductor layer 411 in FIG. 7). After that, these gases are exhausted and gases used for depositing a buffer layer 107 are introduced (replacement of gases 412 in FIG. 7).

In the above example, in the source gases used for forming the semiconductor layer 105 to which an impurity element serving as a donor is added, the flow ratio of $H_2$ to $SiH_4$ is set to be 150:1. Therefore, silicon is deposited gradually.

The surface of the gate insulating layer 104 in this embodiment is supplied with nitrogen. As described above, nitrogen suppresses generation of silicon crystal nuclei. Therefore, in an early stage of deposition, silicon crystal nuclei are not generated. This layer which is formed in an early stage of deposition is the first region 106a illustrated in FIGS. 2A and 2B. Since the semiconductor layer 105 to which an impurity element serving as a donor is added is formed under one condition, the first region 106a and the second regions 106b and 106c are formed under the same deposition conditions except for whether or not a gas including an impurity element serving as a donor is introduced. As described above, the surface of the gate insulating layer 104 is supplied with nitrogen, and then a semiconductor layer 105a, to which an impurity element serving as a donor is added, is formed on the surface of the gate insulating layer 104, whereby a semiconductor layer containing nitrogen (the first region 106a illustrated in FIGS. 2A and 2B) is formed. The semiconductor layer 105a to which an impurity element serving as a donor is added is deposited while the concentration of nitrogen is reduced. When the concentration of nitrogen is less than or equal to a certain value, crystal nuclei are generated. After that, by introducing gases including an impurity element serving as a donor into the treatment chamber, crystal nuclei grow while taking in the impurity element serving as a donor and the crystal grains 121 are formed. In addition, a semiconductor layer 105b to which an impurity element serving as a donor is added is formed. That is, a semiconductor layer containing nitrogen and an impurity element serving as a donor (the second regions 106b and 106c illustrated in FIGS. 2A and 2B) is formed. Because crystal growth proceeds faster due to the impurity element serving as a donor, the deposition time of the semiconductor layer 105b including the crystal grain 121 whose crystal grain diameter is increased can be shortened.

Next, the buffer layer 107 is formed over the entire surface of the semiconductor layer 105 to which an impurity element serving as a donor is added. The buffer layer 107 is patterned to be the buffer layer 108 in a later step. Here, the buffer layer is formed using an amorphous semiconductor. First, source gases used for depositing the buffer layer 107 are introduced into the treatment chamber. Here, as an example, $SiH_4$ and $H_2$ are introduced as source gases at flow rates of 280 sccm and 300 sccm, respectively, and are stabilized; further, the pressure in the treatment chamber is set to be 170 Pa, the substrate temperature is set to be 280° C., and plasma discharge is performed at an output of 60 W, so that a semiconductor layer can be formed with a thickness of about 150 nm. After that, in a manner similar to that of the above silicon nitride layer and the like, only the introduction of $SiH_4$ is halted, and several seconds later, plasma discharge is halted (formation of an a-Si layer 413 in FIG. 7). And then, these gases are exhausted, and gases used for depositing the impurity semiconductor layer 109 having one conductivity type are introduced (replacement of gases 414 in FIG. 7).

Note that before formation of the buffer layer 107, the substrate is transferred to an air atmosphere from the treatment chamber so that an oxide film may be formed over the surface of the semiconductor layer 105 to which an impurity element serving as a donor is added. Alternatively, the surface of the semiconductor layer 105 to which an impurity element serving as a donor is added may be subjected to oxygen plasma irradiation, water plasma irradiation, nitrogen plasma irradiation, or the like so that a silicon oxide film or a silicon nitride film may be formed over the surface of the semiconductor layer 105 to which an impurity element serving as a donor is added.

Next, the impurity semiconductor layer 109 having one conductivity type is formed over an entire surface of the buffer layer 107. In a later step, the impurity semiconductor layer 109 having one conductivity type is patterned into the source and drain regions 110. The concentration of an impurity element serving as a donor contained in the impurity semiconductor layer 109 having one conductivity type may be such a concentration as to make favorable ohmic contact with the wiring layers 112 illustrated in FIGS. 1A and 1B. Typically, it is preferable that the concentration be $1\times10^{19}$ $cm^{-3}$ to $1\times10^{21}$ $cm^{-3}$. First, source gases used for depositing the impurity semiconductor layer 109 having one conductivity type are introduced into the treatment chamber 141. Here, as an example, $SiH_4$ and a mixed gas in which $PH_3$ is diluted with $H_2$ by 0.5 vol % are introduced as source gases at flow rates of 100 sccm and 170 sccm, respectively, and are stabilized; further, the pressure in the treatment chamber 141 is set to be 280 Pa, and the substrate temperature is set to be 280° C., and plasma discharge is performed at an output of 60 W, so that a semiconductor layer can be formed with a thickness of about 50 nm. After that, in a manner similar to that of the silicon nitride layer or the like described above, only the introduction of $SiH_4$: is halted, and several seconds later, plasma discharge is halted (formation of an impurity semiconductor layer having one conductivity type 415 in FIG. 7). After that, these gases are exhausted (exhaust 416 in FIG. 7).

Figure 4A:
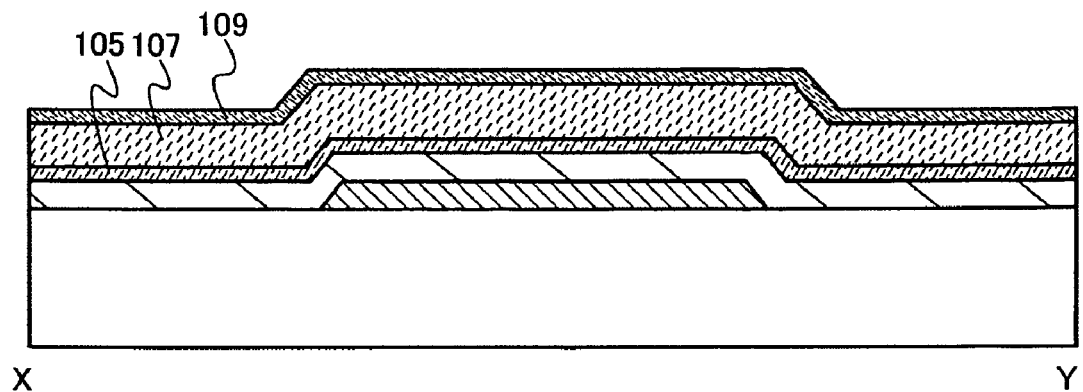
FIGS. 4A to 4C are drawings illustrating an example of a method for manufacturing a thin film transistor according to embodiments.

As described above, steps of forming components up to the impurity semiconductor layer 109 having one conductivity type can be performed (see FIG. 4 A).

Next, a conductive layer 111 is formed over the impurity semiconductor layer 109 having one conductivity type.

The conductive layer 111 can be formed in a single layer or a stacked layer of aluminum, copper, titanium, neodymium, scandium, molybdenum, chromium, tantalum, tungsten, or the like. The conductive layer 111 may be formed using an aluminum alloy to which an element to prevent a hillock is added (e.g., an aluminum-neodymium alloy or the like which can be used for the gate electrode layer 102). Alternatively, crystalline silicon to which an impurity element which serves as a donor is added may be used. The conductive layer 111 may have a stacked-layer structure in which a layer on the side which is in contact with the crystalline silicon to which an impurity element which serves as a donor is added is formed using titanium, tantalum, molybdenum, tungsten, or nitride of any of these elements and aluminum or an aluminum alloy is formed thereover. Further alternatively, the conductive layer 111 may have a stacked-layer structure in which an upper side and a lower side of aluminum or an aluminum alloy are sandwiched between titanium, tantalum, molybdenum, tungsten, or nitride of any of these elements. For example, the conductive layer 111 preferably has a three-layer structure in which an aluminum layer is sandwiched between molybdenum layers.

The conductive layer 111 is formed by a CVD method, a sputtering method or a vacuum evaporation method. Further, the conductive layer 111 may be formed by discharging a conductive nanopaste of silver, gold, copper, or the like by a screen printing method, an inkjet method, or the like and baking the conductive nanopaste.

Figure 4B:
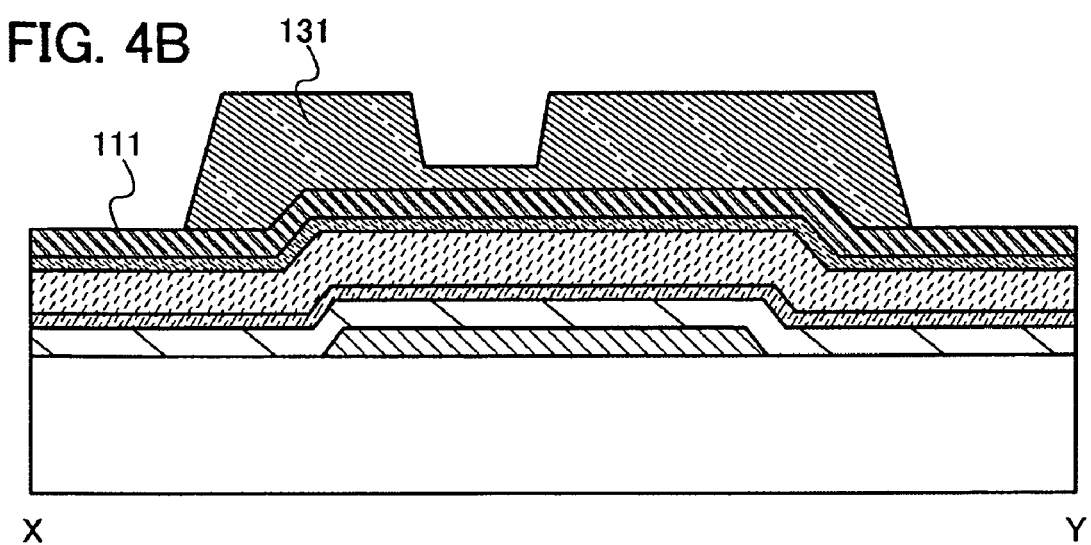
Figure 4C:
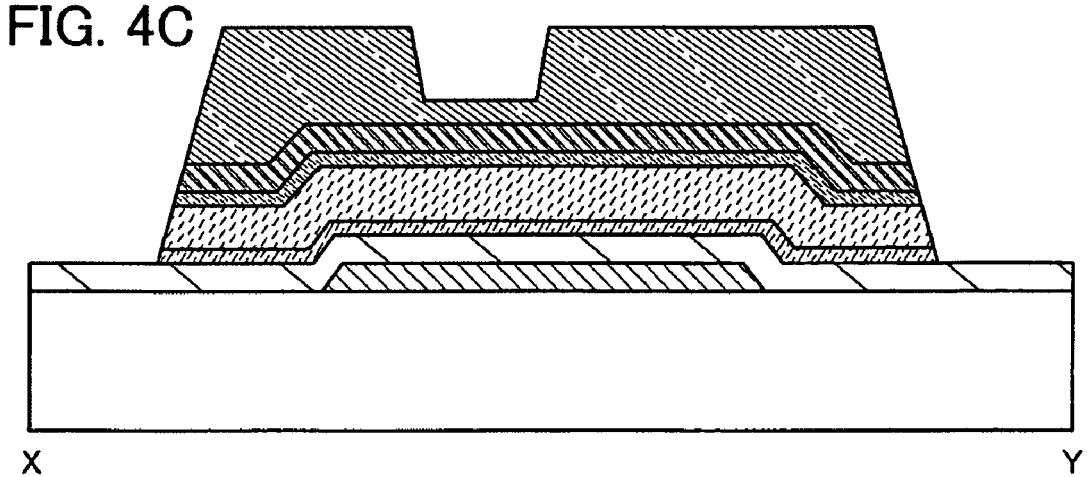

Next, a first resist mask 131 is formed over the conductive layer 111 (see FIG. 4B). The first resist mask 131 has two regions with different thicknesses and can be formed using a multi-tone mask. The multi-tone mask is used, so that the number of photomasks to be used and the number of manufacturing processes are reduced, which is preferable. In this embodiment, the resist mask formed using a multi-tone mask can be used in a step of forming a pattern of the semiconductor layer and a step of separating the semiconductor layer 109 into source and drain regions.

A multi-tone mask is a mask capable of light exposure with multi-level light intensity, and typically, light exposure is performed with three levels of light intensity to provide an exposed region, a half-exposed region, and an unexposed region. When the multi-tone mask is used, one-time light exposure and development process allows a resist mask with plural thicknesses (typically, two levels of thicknesses) to be formed. Therefore, by using a multi-tone mask, the number of photomasks can be reduced.

Figure 8A:
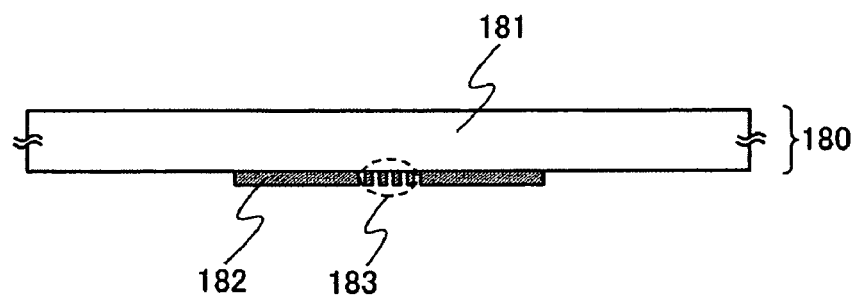
Figure 8A:
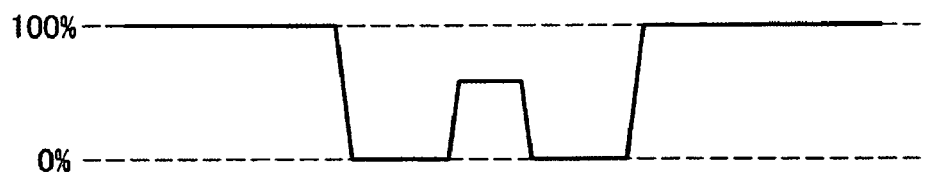
Figure 8B:
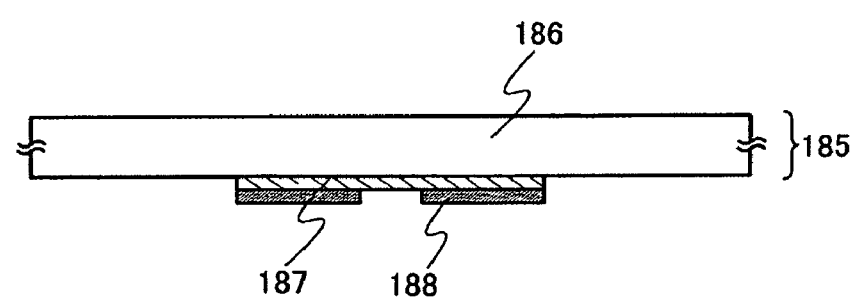
Figure 8B:
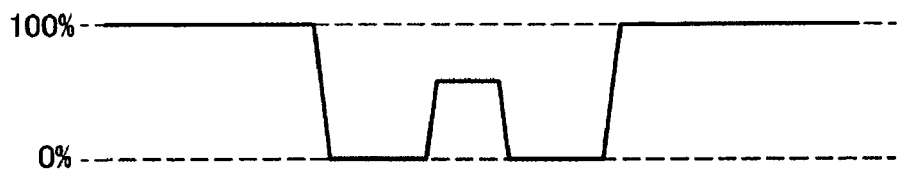

FIGS. 8A-1 and 8B-1 are cross-sectional views of typical multi-tone photomasks. FIG. 8A-1 illustrates a gray-tone mask 180 and FIG. 8B-1 illustrates a half-tone mask 185.

The gray-tone mask 180 illustrated in FIG. 8A-1 includes a light shielding portion 182 formed using a light shielding film on a substrate 181 having a light-transmitting property, and a diffraction grating portion 183 provided with a pattern of the light shielding film.

The diffraction grating portion 183 has slits, dots, meshes, or the like that are provided at intervals which are less than or equal to the resolution limit of light used for the exposure, whereby the light transmittance can be controlled. Note that the slits, dots, or mesh provided at the diffraction grating portion 183 may be provided periodically or nonperiodically.

For the substrate 181 having a light-transmitting property, a quartz substrate or the like can be used. The light shielding film for forming the light shielding portion 182 and the diffraction grating portion 183 may be formed using chromium, chromium oxide, or the like.

In the case where the gray-tone mask 180 is irradiated with light for light exposure, as illustrated in FIG. 8A-2, the transmittance in the region overlapping with the light shielding portion 182 is 0%, and the transmittance in the region where both the light shielding portion 182 and the diffraction grating portion 183 are not provided is 100%. Further, the transmittance at the diffraction grating portion 183 is basically in the range of 10% to 70%, which can be adjusted by the interval of slits, dots, or mesh of the diffraction grating, or the like.

The half-tone mask 185 illustrated in FIG. 8B-1 includes a semi-light-transmitting portion 187 which is formed, on a substrate 186 having a light-transmitting property, using a semi-light-transmitting film, and a light shielding portion 188 formed using a light shielding film.

The semi-light-transmitting portion 187 can be formed using a film of MoSiN, MoSi, MoSiO, MoSiON, CrSi or the like. The light shielding portion 188 is preferably formed using chromium, chromium oxide, or the like in a manner similar to that of the light shielding film of the gray-tone mask.

In the case where the half-tone mask 185 is irradiated with light for light exposure, as illustrated in FIG. 8B-2, the transmittance in the region overlapping with the light shielding portion 188 is 0%, and the transmittance in the region where both the light shielding portion 188 and the semi-light-transmitting portion 187 are not provided is 100%. Further, the transmittance in the semi-light-transmitting portion 187 is basically in the range of 10% to 70%, which can be adjusted by the kind, the thickness, or the like of the material to be formed.

By light exposure using the multi-tone mask and development, a resist mask which includes regions having different thicknesses can be formed.

Next, with the use of the first resist mask 131, the semiconductor layer 105, the buffer layer 107, the impurity semiconductor layer 109 having one conductivity type, and the conductive layer 111 are etched. Through this step, the semiconductor layer 105, the buffer layer 107, the impurity semiconductor layer 109 having one conductivity type, and the conductive layer 111 are separated into each element (see FIG. 4C). After that, the first resist mask 131 is removed.

Here, the first resist mask 131 is made to recede to form a second resist mask 132. Ashing using oxygen plasma may be performed in order that the resist mask is made to recede.

Figure 5A:
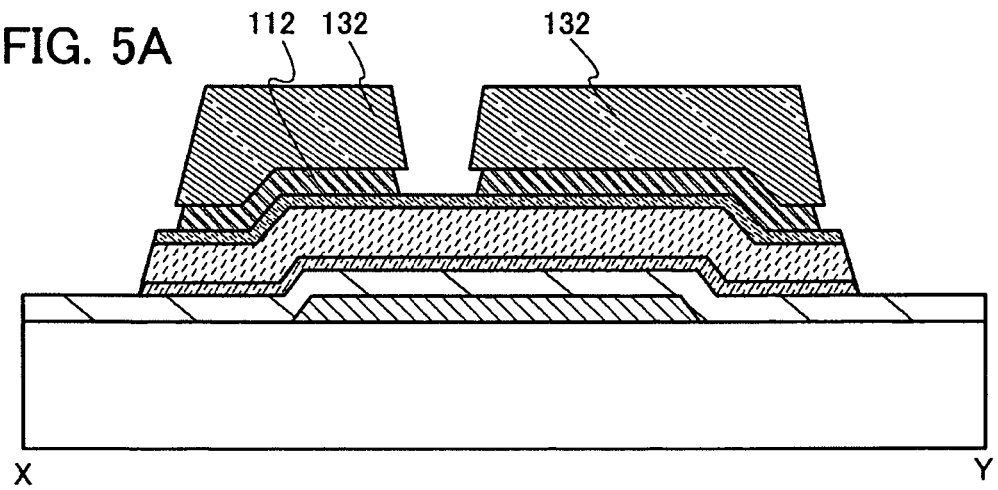
FIGS. 5A to 5C are drawings illustrating an example of a method for manufacturing a thin film transistor according to embodiments.

Next, with the use of the second resist mask 132, the conductive layer 111 is etched to form the wiring layers 112 (see FIG. 5A). The wiring layers 112 form the source and drain electrodes. It is preferable that this etching of the conductive layer 111 be performed by wet etching. By wet etching, the conductive layer is isotropically etched, a side surface of the conductive layer recedes to an inner side than that of the second resist mask 132, and thus the wiring layers 112 are formed. Accordingly, the side surfaces of the wiring layers 112 are not aligned with the side surfaces of the etched impurity semiconductor layer 109 having one conductivity type, and the side surfaces of the source and drain regions 110 are formed outside the side surfaces of the wiring layers 112. The wiring layers 112 serve not only as source and drain electrodes but also as a signal line. However, without limitation thereto, a signal line may be provided separately from the wiring layers 112.

Figure 5B:
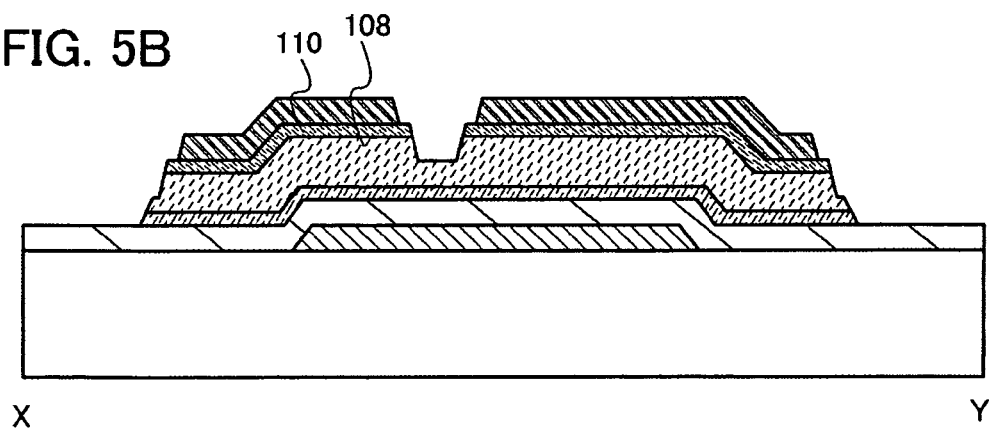

Next, in a state where the second resist mask 132 is formed, the impurity semiconductor layer 109 having one conductivity type and part of the buffer layer 107 are etched to form the source and drain regions 110 and the buffer layer 108 (see FIG. 5B).

Next, in a state where the second resist mask 132 is formed, dry etching is preferably performed. Here, a condition of dry etching is set so that the exposed region of the buffer layer 108 is not damaged and the etching rate with respect to the buffer layer 108 can be low. In other words, a condition which gives almost no damages to the exposed surface of the buffer layer 108 and hardly reduces the thickness of the exposed region of the buffer layer 108 is applied. As an etching gas, a chlorine based gas, typically, a $Cl_2$ gas or the like is used. There is no particular limitation on an etching method, and an ICP method, a CCP method, an ECR method, a reactive ion etching (RIE) method, or the like can be used.

An example of a condition of dry etching which can be used here is as follows: the flow rate of $Cl_2$ gas is 100 sccm; the pressure in a chamber is 0.67 Pa; the temperature of the lower electrode is −10° C.; an RF power (13.56 MHz) of 2000 W is applied to the coil of upper electrode to generate plasma with no power (i.e., 0 W, non-biased) applied to the substrate 100 side; and thus etching is performed for 30 seconds. The temperature of the inner wall of the chamber is preferably about 80° C.

Next, in a state where the second resist mask 132 is formed, plasma treatment is preferably performed. Here, plasma treatment is preferably performed using water plasma, for example.

Water plasma treatment can be performed in such a manner that a gas containing water typified by water vapor ($H_2O$ vapor) as its main component is introduced into a reaction space to generate plasma. The second resist mask 132 can be removed with water plasma. Further, when water plasma treatment is performed or water plasma treatment is performed after exposure to air, an oxide film is formed over the exposed buffer layer 108 in some cases.

Note that without the use of water plasma treatment, dry etching may be performed under such a condition that the exposed region of the buffer layer 108 is not damaged and an etching rate with respect to the buffer layer 108 is low.

As described above, after the pair of source and drain regions 110 are formed, dry etching is further performed under such a condition that the buffer layer 108 is not damaged, whereby an impurity element such as a residue existing on the exposed region of the buffer layer 108 can be removed. Further, dry etching is performed, and then water plasma treatment is performed, whereby the second resist mask 132 can also be removed. By water plasma treatment, insulation between the source and drain regions can be secured, and thus in a thin film transistor which is completed, the off-state current can be reduced, the on-state current can be increased, and variation in the electric characteristics can be reduced.

Note that order of steps of plasma treatment and the like is not limited thereto. After the second resist mask 132 is removed, etching with non-bias applied or plasma treatment may be performed.

Figure 5C:
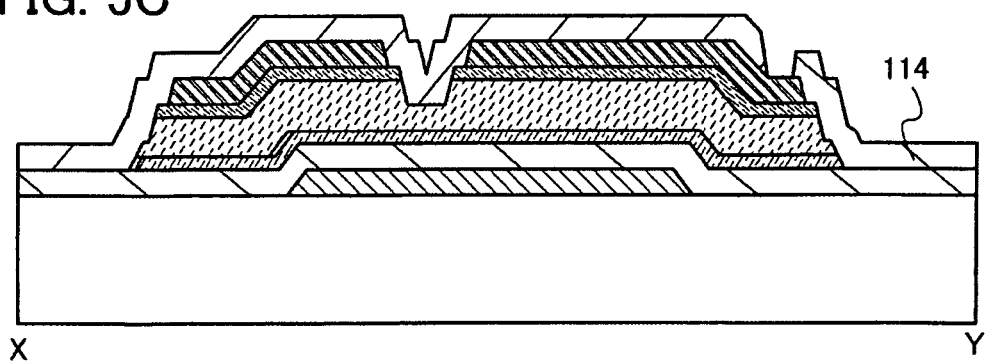

As described above, a thin film transistor according to this embodiment can be manufactured (see FIG. 5B). The thin film transistor according to this embodiment can be applied to a switching transistor provided in a pixel of a display device typified by a liquid crystal display device. Therefore, the insulating layer 114 which covers this thin film transistor and has an opening is formed (see FIG. 5C). The opening can be formed by a photolithography method. After that, the pixel electrode layer 116 is formed over the insulating layer 114 so as to be connected through the opening. Thus, a switching transistor provided in a pixel of a display device, which is illustrated in FIGS. 1A and 1B, can be manufactured.

Note that the insulating layer 114 can be formed in a manner similar to that of the gate insulating layer 104. The insulating layer 114 is preferably a dense silicon nitride layer such that entry of a contaminant impurity element such as an organic substance, a metal, or moisture floating in the atmosphere can be prevented.

Note that the pixel electrode layer 116 can be formed using a conductive composition including a conductive macromolecule (also referred to as a conductive polymer) having a light-transmitting property. The pixel electrode layer 116 preferably has a sheet resistance of less than or equal to 10000 $\Omega/cm^2$ and a light transmittance of greater than or equal to 70% at a wavelength of 550 nm. Further, the resistance of the conductive macromolecule included in the conductive composition is preferably less than or equal to 0.1 $\Omega \cdot cm$. As a conductive macromolecule, a so-called $\pi$ electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

Further, the pixel electrode layer 116 can be formed using indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

The pixel electrode layer 116 may be etched by a photolithography method to be patterned in a manner similar to that of the wiring layer 112 or the like.

Note that although not illustrated, an insulating layer formed using an organic resin by a spin coating method or the like may be present between the insulating layer 114 and the pixel electrode layer 116.

As described above in this embodiment, a thin film transistor having high on-state current and low off-state current can be obtained.

Embodiment 2

In this embodiment, a method for manufacturing a thin film transistor illustrated in FIGS. 1A and 1B which is different from that of Embodiment 1 will be described. In this embodiment, a semiconductor layer which includes crystal grains each having an inversed-conic or inversed-pyramidal shape and to which an impurity element serving as a donor is added is formed in a manner similar to that of Embodiment 1. However, there is a difference in a method for adding an impurity element serving as a donor to a semiconductor layer to which an impurity element serving as a donor is added.

Figure 9:
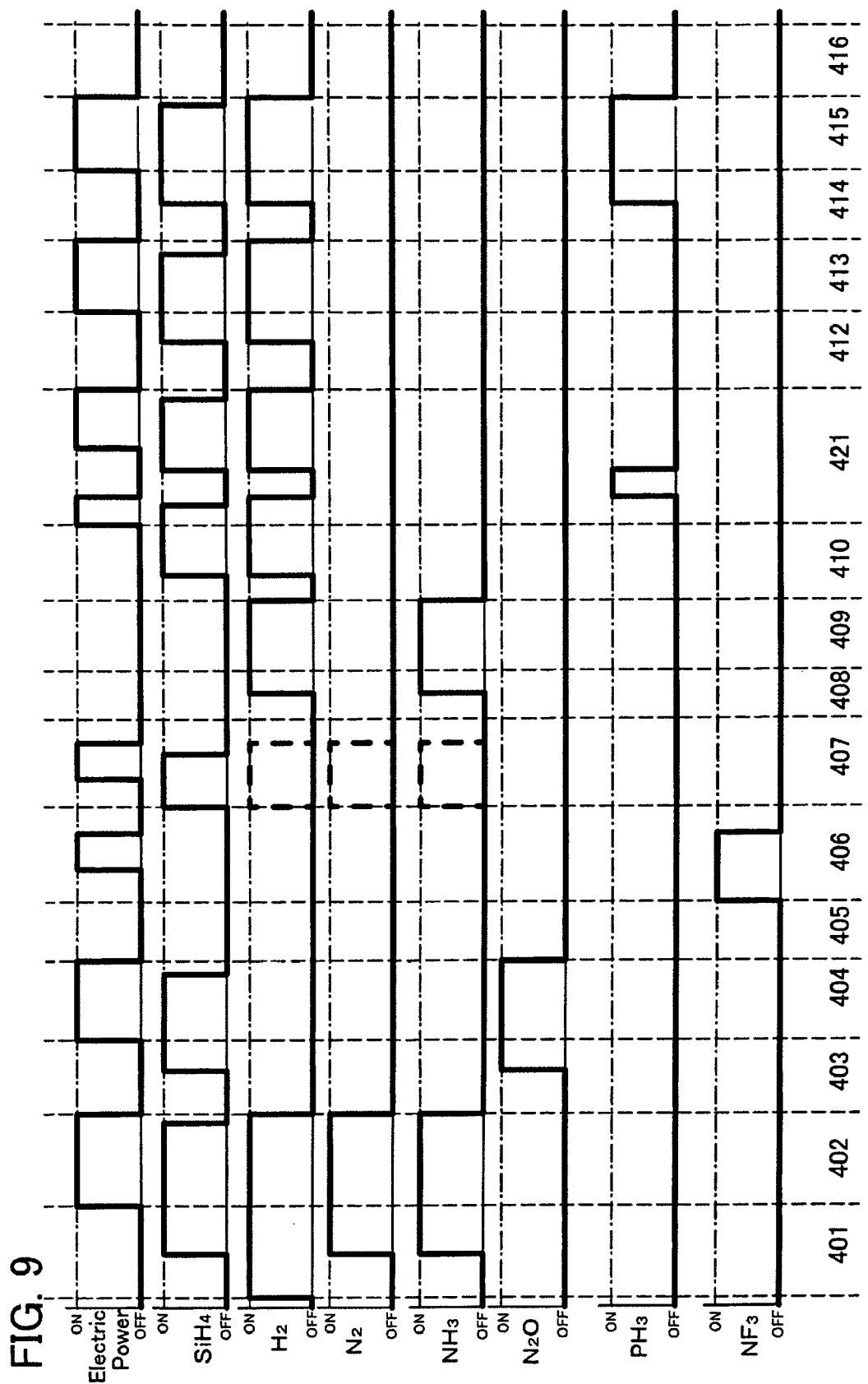
FIG. 9 is a drawing illustrating an example of a method for manufacturing a thin film transistor according to embodiments.

As illustrated in FIG. 9, the preliminary treatment 401 to the flash treatment 409 in which nitrogen is supplied to the surface of the gate insulating layer 104 are performed in a manner similar to that of Embodiment 1.

Next, gases used for the flash treatment are exhausted, and as for source gases which is used for depositing the semiconductor layer 105 to which an impurity element serving as a donor is added, gases other than gases including an impurity element serving as a donor are introduced into the treatment chamber 141 (replacement of gases 410 in FIG. 9).

Next, the semiconductor layer 105 to which an impurity element serving as a donor is added is formed over an entire surface of the gate insulating layer 104 to which nitrogen is supplied. The semiconductor layer 105 to which an impurity element serving as a donor is added is patterned to be the semiconductor layer 106 to which an impurity element serving as a donor is added in a later step. Here, as an example, first, $SiH_4$ and $H_2$ are introduced as source gases at flow rates of 10 sccm and 1500 sccm, respectively, and are stabilized; further, the pressure in the treatment chamber is set to be 280 Pa, the substrate temperature is set to be 280° C., and plasma discharge is performed at an output of 50 W. When the concentration of nitrogen contained in the semiconductor layer is reduced and the crystal nuclei of the crystal grains are generated, only the introduction of $SiH_4$ is halted. Several seconds later, plasma discharge is halted, and then the introduction of $H_2$ is halted. Next, a pressure control valve in the treatment chamber is completely opened in order to introduce 0.5 vol % $PH_3$ (diluted with $H_2$) into the treatment chamber from the gas supply means 150 at the flow rate of 170 sccm for 60 seconds so that an impurity element serving as a donor is attached to the inside of the treatment chamber and the surface of the semiconductor layer 105a to which an impurity element serving as a donor is added. Then, the introduction of 0.5 vol % $PH_3$ (diluted with $H_2$) is halted. Next, $SiH_4$ and $H_2$ are introduced as source gases at flow rates of 10 sccm and 1500 sccm, respectively, and are stabilized; further, the pressure in the treatment chamber is set to be 280 Pa, the substrate temperature is set to be 280° C., and plasma discharge is performed at an output of 50 W, so that a semiconductor layer to which an impurity element serving as a donor is added can be formed with a thickness of about 50 nm. After that, in a manner similar to that of the above silicon nitride layer and the like, only the introduction of $SiH_4$ is halted, and several seconds later, plasma discharge is halted (formation of a semiconductor layer 421 in FIG. 9). And then, these gases are exhausted, and gases used for depositing the buffer layer 107 are introduced (replacement of gases 412 in FIG. 9).

In the above example, in source gases used for forming the semiconductor layer 105 to which an impurity element serving as a donor is added, the flow ratio of $H_2$ to $SiH_4$ is set to be 150:1. Thus, silicon is gradually deposited.

The surface of the gate insulating layer 104 of this embodiment is supplied with nitrogen. As described above, nitrogen suppresses generation of silicon crystal nuclei. Thus, the silicon crystal nuclei are not generated in an early stage of deposition. This layer formed in the early stage of deposition is to be the first region 106a illustrated in FIGS. 2A and 2B. Since the semiconductor layer 105 is formed under one condition, the first region 106a and the second region 106b are formed under the same deposition conditions except for whether or not a gas including an impurity element serving as a donor is introduced. As described above, nitrogen is supplied to the surface of the gate insulating layer 104, and the semiconductor layer 105 to which an impurity element serving as a donor is added is formed over the surface of the gate insulating layer 104, so that a semiconductor layer containing nitrogen (the first region 106a illustrated in FIGS. 2A and 2B) is formed. The formation of the semiconductor layer 105 to which an impurity element serving as a donor is added proceeds while the concentration of nitrogen is reduced. When the concentration of nitrogen is reduced to less than or equal to a certain value, the crystal nuclei are generated. After that, the gas including an impurity element serving as a donor is temporarily introduced into the treatment chamber. By introduction of the gas including an impurity element serving as a donor into the treatment chamber, the crystal nuclei grow while taking in the impurity element serving as a donor and the crystal grains 121 are formed. In addition, the semiconductor layer 105b to which an impurity element serving as a donor is added is formed. That is, a semiconductor layer containing nitrogen and an impurity element serving as a donor (the second regions 106b and 106c illustrated in FIGS. 2A and 2B) is formed. Because crystal growth proceeds faster due to the impurity element serving as a donor, the deposition time of the semiconductor layer 105b including the crystal grains 121 whose crystal grain diameter is increased can be shortened.

Next, the buffer layer 107 and an impurity semiconductor layer having one conductivity type are formed over an entire surface of the semiconductor layer 105 to which an impurity element serving as a donor is added in manners similar to those of Embodiment 1.

Through the above process, at least gases including an impurity element serving as a donor are attached to a semiconductor layer in which crystal nuclei of the crystal grains are generated, so that a semiconductor layer which contains an impurity element serving as a donor, in which the concentration of oxygen can be suppressed and the concentration of nitrogen can be made higher than the concentration of oxygen, which includes crystal grains each having an inversed-conic or inversed-pyramidal shape, and to which an impurity element serving as a donor is added, can be formed.

Embodiment 3

In this embodiment, a method for manufacturing a thin film transistor illustrated in FIGS. 1A and 1B which is different from those of Embodiments 1 and 2 will be described. In this embodiment, a semiconductor layer which includes crystal grains each having an inversed-conic or inversed-pyramidal shape and to which an impurity element serving as a donor is added is formed in a manner similar to that of Embodiment 1. However, there is a difference in a method for adding nitrogen to a semiconductor layer. Note that in this embodiment, description on a method for adding an impurity element serving as a donor is made using Embodiment 1; however, Embodiment 2 can be used as appropriate.

In this embodiment, a gate insulating layer which is in contact with a semiconductor layer is formed using silicon nitride, so that the concentration of nitrogen contained in the semiconductor layer is controlled, whereby a semiconductor layer which includes crystal grains each having an inversed-conic or inversed-pyramidal shape is formed. A series of steps from a step of forming the gate insulating layer 104 to a step of forming the impurity semiconductor layer 109 having one conductivity type is described below with reference to FIG. 10.

Figure 10:
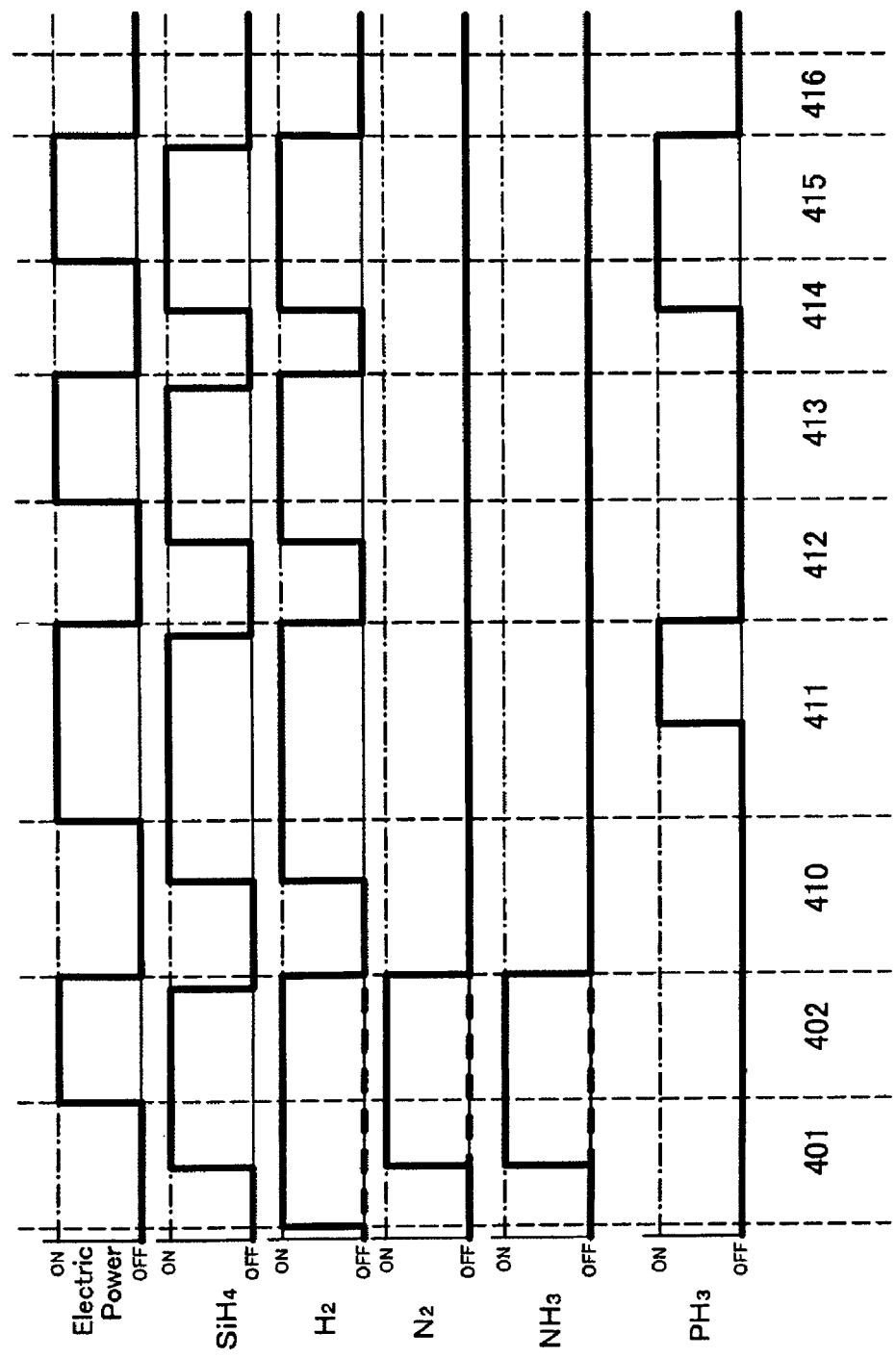
FIG. 10 is a drawing illustrating an example of a method for manufacturing a thin film transistor according to embodiments.

First, a substrate provided with the gate electrode layer 102 is heated in a treatment chamber of a CVD apparatus, and in order to form a silicon nitride layer, source gases used for depositing silicon nitride are introduced into the treatment chamber (preliminary treatment 401 in FIG. 10). Here, as an example, $SiH_4$, $H_2$, $N_2$, and $NH_3$ are introduced as source gases at flow rates of 40 sccm, 500 sccm, 550 sccm, and 140 sccm, respectively, and are stabilized; further, the pressure in the treatment chamber is set to be 100 Pa, the substrate temperature is set to be 280° C., and plasma discharge is performed at an output of 370 W, so that a silicon nitride layer is formed with a thickness of about 300 nm. After that, only the introduction of $SiH_4$ is halted, and several seconds later, plasma discharge is halted (formation of SiN 402 in FIG. 10).

Next, the source gases used for depositing silicon nitride are exhausted, and source gases used for depositing the semiconductor layer 105 are introduced into the treatment chamber (replacement of gases 410 in FIG. 10).

Next, the semiconductor layer 105 to which an impurity element serving as a donor is added is formed over the entire surface of the gate insulating layer 104. The semiconductor layer 105 to which an impurity element serving as a donor is added is patterned to be the semiconductor layer 106 to which an impurity element serving as a donor is added in a later step. First, source gases used for depositing the semiconductor layer 105 to which an impurity element serving as a donor is added are introduced into the treatment chamber. Here, as an example, first, $SiH_4$ and $H_2$ are introduced as source gases at flow rates of 10 sccm and 1500 sccm, respectively, and are stabilized; further, the pressure in the treatment chamber is set to be 280 Pa, the substrate temperature is set to be 280° C., and plasma discharge is performed at an output of 50 W. When the concentration of nitrogen contained in the semiconductor layer is reduced and the crystal nuclei of the crystal grains are generated, 10 ppm $PH_3$ (diluted with $H_2$), $SiH_4$, and $H_2$ are introduced into the treatment chamber from the gas supply means 150 at the flow rates of 10 sccm, 10 sccm, and 1500 sccm while the pressure, the temperature, and the electric power are maintained, so that a semiconductor layer including a layer to which an impurity element serving as a donor is added at an upper portion can be formed with a thickness of about 50 nm. After that, in a manner similar to that of the above silicon nitride layer and the like, only the introduction of $SiH_4$ is halted, and several seconds later, plasma discharge is halted (formation of a semiconductor layer 411 in FIG. 10). And then, these gases are exhausted, and gases used for depositing the buffer layer 107 are introduced (replacement of gases 412 in FIG. 10).

In the above example, in source gases used for forming the semiconductor layer 105 to which an impurity element serving as a donor is added, the flow ratio of $H_2$ to $SiH_4$ is set to be 150:1. Thus, silicon is gradually deposited.

In the gate insulating layer 104 of this embodiment, at least an uppermost layer which is in contact with the semiconductor layer 105 to which an impurity element serving as a donor is added is formed using silicon nitride. Thus, there is a large amount of nitrogen in the surface of the gate insulating layer 104. As described above, nitrogen suppresses generation of silicon crystal nuclei. Thus, the silicon crystal nuclei are not generated in an early stage of deposition. This layer formed in the early stage of deposition is to be the first region 106a illustrated in FIGS. 2A and 2B. Since the semiconductor layer 105 to which an impurity element serving as a donor is added is formed under one condition, the first region 106a and the second regions 106b and 106c are formed under the same deposition conditions except for whether or not a gas including an impurity element serving as a donor is introduced. As described above, nitrogen is supplied to the surface of the gate insulating layer 104, and the semiconductor layer 105 to which an impurity element serving as a donor is added is formed over the surface of the gate insulating layer 104, so that a semiconductor layer containing nitrogen (the first region 106a illustrated in FIGS. 2A and 2B) is formed. The formation of the semiconductor layer to which an impurity element serving as a donor is added proceeds while the concentration of nitrogen is reduced. When the concentration of nitrogen is reduced to less than or equal to a certain value, the crystal nuclei are generated. After that, the gas including an impurity element serving as a donor is introduced into the treatment chamber. Accordingly, the crystal nuclei grow while taking in the impurity element serving as a donor and the crystal grains 121 are formed. In addition, the semiconductor layer 105b to which an impurity element serving as a donor is added is formed. That is, a semiconductor layer containing nitrogen and an impurity element serving as a donor (the second regions 106b and 106c illustrated in FIGS. 2A and 2B) is formed. Because crystal growth proceeds faster due to the impurity element serving as a donor, the deposition time of the semiconductor layer 105b including the crystal grain 121 whose crystal grain diameter is increased can be shortened.

Note that here, as to an impurity element which suppresses generation of crystal nuclei, an impurity element in silicon (e.g., nitrogen) which does not trap carriers is selected. On the other hand, the concentration of an impurity element (e.g., oxygen) which reduces the coordination number of silicon and generates dangling bonds is reduced. Thus, the concentration of oxygen is preferably reduced without reducing the concentration of nitrogen. Specifically, it is preferable that the concentration of oxygen be less than or equal to $5 \times 10^{18}$ cm$^{-3}$.

Next, the buffer layer 107 is formed over the entire surface of the semiconductor layer 105. The buffer layer 107 is patterned to be the buffer layer 108 in a later step. Here, the buffer layer is formed using an amorphous semiconductor. First, source gases used for depositing the buffer layer 107 are introduced into the treatment chamber. Here, as an example, SiH$_4$ and H$_2$ are introduced as source gases at flow rates of 280 sccm and 300 sccm, respectively, and are stabilized; further, the pressure in the treatment chamber is set to be 170 Pa, the substrate temperature is set to be 280° C., and plasma discharge is performed at an output of 60 W, so that a semiconductor layer can be formed with a thickness of about 150 nm. After that, in a manner similar to that of the above silicon nitride layer and the like, only the introduction of SiH$_4$ is halted, and several seconds later, plasma discharge is halted (formation of an a-Si layer 413 in FIG. 10). And then, these gases are exhausted, and gases used for depositing the impurity semiconductor layer 109 having one conductivity type are introduced (replacement of gases 414 in FIG. 10).

Next, the impurity semiconductor layer 109 having one conductivity type is formed over an entire surface of the buffer layer 107. The impurity semiconductor layer 109 having one conductivity type is patterned to be the source and drain regions 110 in a later step. First, source gases used for depositing the impurity semiconductor layer 109 having one conductivity type are introduced into the treatment chamber. Here, as an example, SiH$_4$ and a mixed gas in which PH$_3$ is diluted with H$_2$ by 0.5 vol % are introduced as source gases at flow rates of 100 sccm and 170 sccm, respectively, and are stabilized; further, the pressure in the treatment chamber is set to be 280 Pa, the substrate temperature is set to be 280° C., and plasma discharge is performed at an output of 60 W, so that an impurity semiconductor layer having one conductivity type can be formed with a thickness of about 50 nm. After that, in a manner similar to that of the above silicon nitride layer and the like, only the introduction of SiH$_4$ is halted, and several seconds later, plasma discharge is halted (formation of an impurity semiconductor layer having one conductivity type 415 in FIG. 10). And then, these gases are exhausted (exhaust 416 in FIG. 10).

As described above, at least a gate insulating layer which is in contact with a semiconductor layer is formed using silicon nitride, so that the concentration of oxygen can be suppressed and the concentration of nitrogen can be made higher than the concentration of oxygen, whereby a semiconductor layer which includes crystal grains each having an inversed-conic or inversed-pyramidal shape and to which an impurity element serving as a donor is added can be formed.

Embodiment 4

In this embodiment, a method for manufacturing a thin film transistor illustrated in FIGS. 1A and 1B, which is different from those of Embodiments 1 to 3, will be described. In this embodiment, a semiconductor layer which includes crystal grains each having an inversed-conic or inversed-pyramidal shape and to which an impurity element serving as a donor is added is formed in a manner similar to that of Embodiments 1 and 3. However, there is a difference in a method for adding nitrogen to a semiconductor layer to which an impurity element serving as a donor is added. Note that in this embodiment, description on a method for adding an impurity element serving as a donor is made using Embodiment 1; however, Embodiment 2 can be used as appropriate.

In this embodiment, the inside of the treatment chamber is cleaned before deposition of the semiconductor layer. After that, an inner wall of the treatment chamber is covered with a silicon nitride film in order to add nitrogen to the semiconductor layer. Accordingly, the concentration of oxygen is suppressed and the concentration of nitrogen is made higher than the concentration of oxygen. A series of steps from a step of forming the gate insulating layer 104 to a step of forming the impurity semiconductor layer 109 having one conductivity type is described below with reference to FIG. 11.

Figure 11:
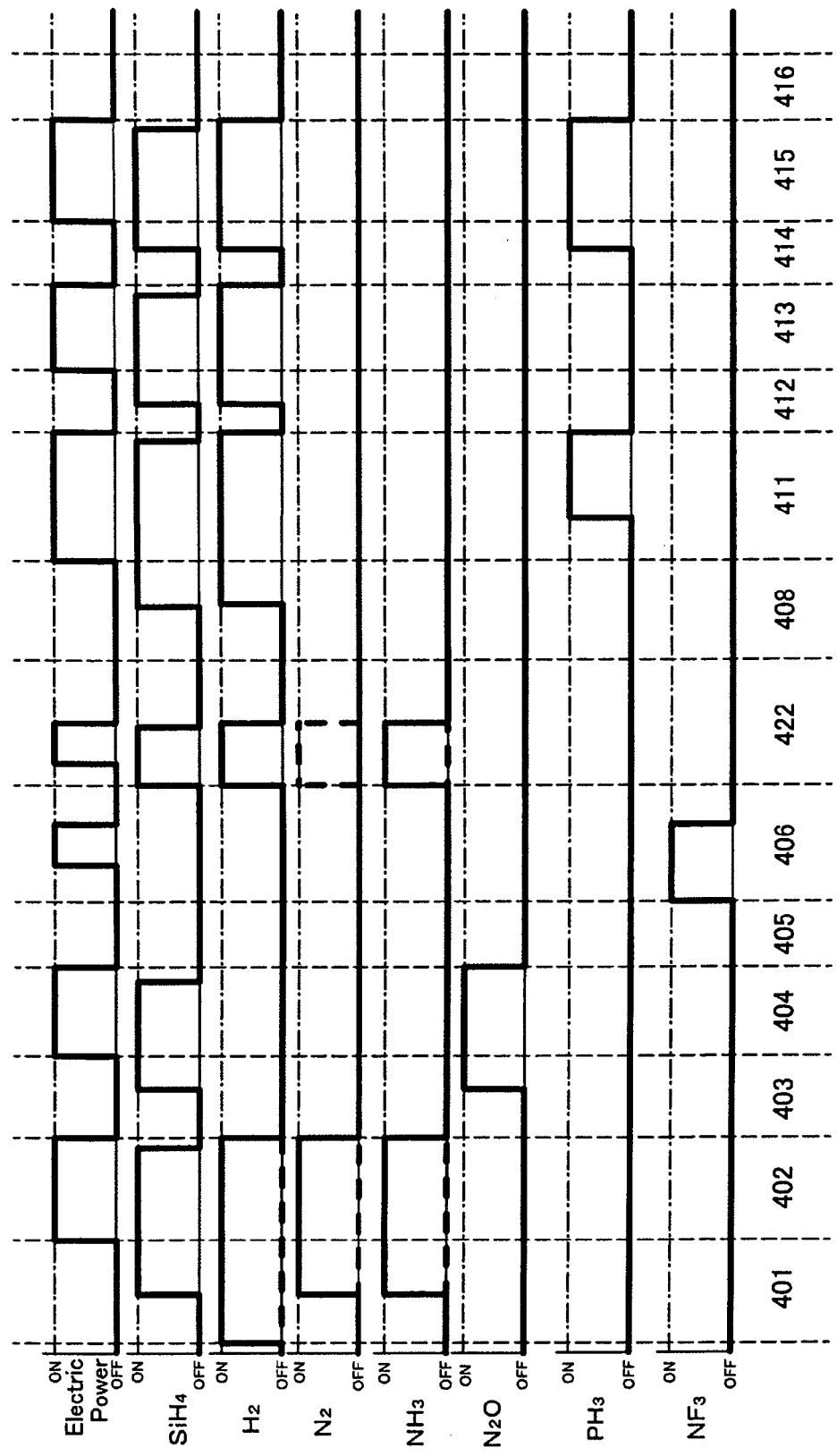
FIG. 11 is a drawing illustrating an example of a method for manufacturing a thin film transistor according to embodiments.

First, a substrate provided with the gate electrode layer 102 is heated in a treatment chamber of a CVD apparatus, and in order to form a silicon nitride layer, source gases used for depositing silicon nitride are introduced into the treatment chamber (preliminary treatment 401 in FIG. 11). Here, as an example, SiH$_4$, H$_2$, N$_2$, and NH$_3$ are introduced as source gases at flow rates of 40 sccm, 500 sccm, 550 sccm, and 140 sccm, respectively, and are stabilized; further, the pressure in the treatment chamber is set to be 100 Pa, the substrate temperature is set to be 280° C., and plasma discharge is performed at an output of 370 W, so that a silicon nitride layer is formed with a thickness of about 110 nm. After that, only the introduction of SiH$_4$ is halted, and several seconds later, plasma discharge is halted (formation of SiN 402 in FIG. 11).

Next, the source gases used for depositing silicon nitride are exhausted, and source gases used for depositing silicon oxynitride are introduced into the treatment chamber (replacement of gases 403 in FIG. 11). Here, as an example, SiH$_4$ and N$_2$O are introduced as source gases at flow rates of 30 sccm and 1200 sccm, respectively, and are stabilized; further, the pressure in the treatment chamber is set to be 40 Pa, the substrate temperature is set to be 280° C., and plasma discharge is performed at an output of 50 W, so that a silicon oxynitride layer is formed with a thickness of about 110 nm. After that, in a manner similar to that of the silicon nitride layer, only the introduction of SiH$_4$ is halted, and several seconds later, plasma discharge is halted (formation of SiON 404 in FIG. 11).

Through the above steps, the gate insulating layer 104 can be formed. After formation of the gate insulating layer 104, the substrate 100 is transferred to a load lock chamber from the treatment chamber 141 (unload 405 in FIG. 11).

Next, the substrate 100 is carried out of the treatment chamber 141, and then an NF$_3$ gas is introduced into the treatment chamber 141 and the inside of the treatment chamber is cleaned (cleaning 406 in FIG. 11). After that, treatment for forming a silicon nitride layer as a protective film is performed (precoating treatment 422 in FIG. 11). Through this treatment, a silicon nitride layer is formed on the inner wall of the treatment chamber 141. After that, the substrate 100 is carried into the treatment chamber 141, and source gases used for depositing the semiconductor layer 105 to which an impurity element serving as a donor is added are introduced into the treatment chamber (load 408 in FIG. 11).

Next, the semiconductor layer 105 to which an impurity element serving as a donor is added is formed over the entire surface of the gate insulating layer 104. The semiconductor layer 105 to which an impurity element serving as a donor is added is patterned to be the semiconductor layer 106 to which an impurity element serving as a donor is added in a later step. First, source gases used for depositing the semiconductor layer 105 to which an impurity element serving as a donor is added are introduced into the treatment chamber. Here, as an example, SiH$_4$ and H$_2$ are introduced as source gases at flow rates of 10 sccm and 1500 sccm, respectively, and are stabilized; further, the pressure in the treatment chamber is set to be 280 Pa, the substrate temperature is set to be 280° C., and plasma discharge is performed at an output of 50 W. When the concentration of nitrogen contained in the semiconductor layer is reduced and the crystal nuclei of the crystal grains are generated, 10 ppm PH$_3$ (diluted with H$_2$), SiH$_4$, and H$_2$ are introduced into the treatment chamber from the gas supply means 150 at flow rates of 10 sccm, 10 sccm, and 1500 sccm, respectively, while the pressure, the temperature, and the electric power are maintained, so that a semiconductor layer including a layer to which an impurity element serving as a donor is added at an upper portion can be formed with a thickness of about 50 nm. After that, in a manner similar to that of the above silicon nitride layer and the like, only the introduction of SiH$_4$ is halted, and several seconds later, plasma discharge is halted (formation of a semiconductor layer 411 in FIG. 11). And then, these gases are exhausted, and gases used for depositing the buffer layer 107 are introduced (replacement of gases 412 in FIG. 11).

In the above example, in source gases used for forming the semiconductor layer 105, the flow ratio of H$_2$ to SiH$_4$ is set to be 150:1. Thus, silicon is gradually deposited.

In this embodiment, a silicon nitride layer is formed as a protective film in the treatment chamber. Thus, nitrogen is added to the semiconductor layer 105 by exposing the protective film to plasma. As described above, nitrogen suppresses generation of silicon crystal nuclei. Thus, the silicon crystal nuclei are not generated in an early stage of deposition. This layer formed in the early stage of deposition is to be the first region 106*a* illustrated in FIGS. 2A and 2B. The first region 106*a* and the second regions 106*b* and 106*c* are formed under the same deposition conditions except for whether or not a gas including an impurity element serving as a donor is introduced. As described above, plasma includes nitrogen contained in the protective film. Thus, a semiconductor layer containing nitrogen (the first region 106*a* illustrated in FIGS. 2A and 2B) is formed by forming the semiconductor layer 105 with the use of the plasma reaction. The formation of the semiconductor layer containing nitrogen proceeds while the concentration of nitrogen is reduced. When the concentration of nitrogen is reduced to less than or equal to a certain value, the crystal nuclei are generated. And then, the crystal nuclei grow and the crystal grains 121 are formed. After that, the gas including an impurity element serving as a donor is introduced into the treatment chamber. Accordingly, the crystal nuclei grow while taking in the impurity element serving as a donor and the crystal grains 121 are formed. In addition, the semiconductor layer 105*b* to which an impurity element serving as a donor is added is formed. That is, a semiconductor layer containing nitrogen and an impurity element serving as a donor (the second regions 106*b* and 106*c* illustrated in FIGS. 2A and 2B) is formed. Because crystal growth proceeds faster due to the impurity element serving as a donor, the deposition time of the semiconductor layer 105*b* including the crystal grain 121 whose crystal grain diameter is increased can be shortened.

Next, the buffer layer 107 is formed over the entire surface of the semiconductor layer 105. The buffer layer 107 is patterned to be the buffer layer 108 in a later step. Here, the buffer layer is formed using an amorphous semiconductor. First, source gases used for depositing the buffer layer 107 are introduced into the treatment chamber. Here, as an example, SiH$_4$ and H$_2$ are introduced as source gases at flow rates of 280 sccm and 300 sccm, respectively, and are stabilized; further, the pressure in the treatment chamber is set to be 170 Pa, the substrate temperature is set to be 280° C., and plasma discharge is performed at an output of 60 W, so that a semiconductor layer can be formed with a thickness of about 150 nm. After that, in a manner similar to that of the above silicon nitride layer and the like, only the introduction of SiH$_4$ is halted, and several seconds later, plasma discharge is halted (formation of an a-Si layer 413 in FIG. 11). And then, these gases are exhausted, and gases used for depositing the impurity semiconductor layer 109 having one conductivity type are introduced (replacement of gases 414 in FIG. 11).

Next, the impurity semiconductor layer 109 having one conductivity type is formed over the entire surface of the buffer layer 107. The impurity semiconductor layer 109 having one conductivity type is patterned to be the source and drain regions 110 in a later step. First, source gases used for depositing the impurity semiconductor layer 109 having one conductivity type are introduced into the treatment chamber. Here, as an example, SiH$_4$ and a mixed gas in which PH$_3$ is diluted with H$_2$ by 0.5 vol % are introduced as source gases at flow rates of 100 sccm and 170 sccm, respectively, and are stabilized; further, the pressure in the treatment chamber is set to be 280 Pa, the substrate temperature is set to be 280° C., and plasma discharge is performed at an output of 60 W, so that a semiconductor layer can be formed with a thickness of about 50 nm. After that, in a manner similar to that of the above silicon nitride layer and the like, only the introduction of SiH$_4$ is halted, and several seconds later, plasma discharge is halted (formation of an impurity semiconductor layer 415 in FIG. 11). And then, these gases are exhausted (exhaust 416 in FIG. 11).

As described above, at least an inner wall of a treatment chamber is covered with a silicon nitride film just before formation of a semiconductor layer, so that the concentration of oxygen can be suppressed and the concentration of nitrogen can be made higher than the concentration of oxygen, whereby a semiconductor layer which includes crystal grains each having an inversed-conic or inversed-pyramidal shape can be formed.

Further, by covering the inner wall of the treatment chamber with the protective film, elements and the like which are contained in the inner wall of the treatment chamber are prevented from being mixed into the semiconductor layer.

Note that in the above description, the gate insulating layer 104 is formed by stacking a silicon oxynitride layer over a silicon nitride layer. Thus, a mode is described in which the cleaning treatment and the precoating treatment are performed after formation of the gate insulating layer 104; however, this embodiment may be implemented in combination with Embodiments 2 and 3. That is, the gate insulating layer 104 may be formed using silicon nitride, and the formation of the gate insulating layer 104 may also serve as precoating treatment. Since the formation of the gate insulating layer 104 serves as precoating treatment, steps can be simplified, and throughput can be improved.

Embodiment 5

In this embodiment, a method for manufacturing a semiconductor device which is different from those of Embodiments 1 to 4 will be described. In this embodiment, a semiconductor layer which includes crystal grains each having an inversed-conic or inversed-pyramidal shape and to which an impurity element serving as a donor is added is formed in a manner similar to that of Embodiment 1. However, there is a difference in a method for adding nitrogen to a semiconductor layer to which an impurity element serving as a donor is added. Note that in this embodiment, description on a method for adding an impurity element serving as a donor is made using Embodiment 1; however, Embodiment 2 can be used as appropriate.

In this embodiment, nitrogen is mixed into gases in an early stage of deposition of a semiconductor layer so that the concentration of oxygen can be suppressed and the concentration of nitrogen can be made higher than the concentration of oxygen. A series of steps from a step of forming the gate insulating layer 104 to a step of forming the impurity semiconductor layer 109 having one conductivity type is described below with reference to FIG. 12.

Figure 12:
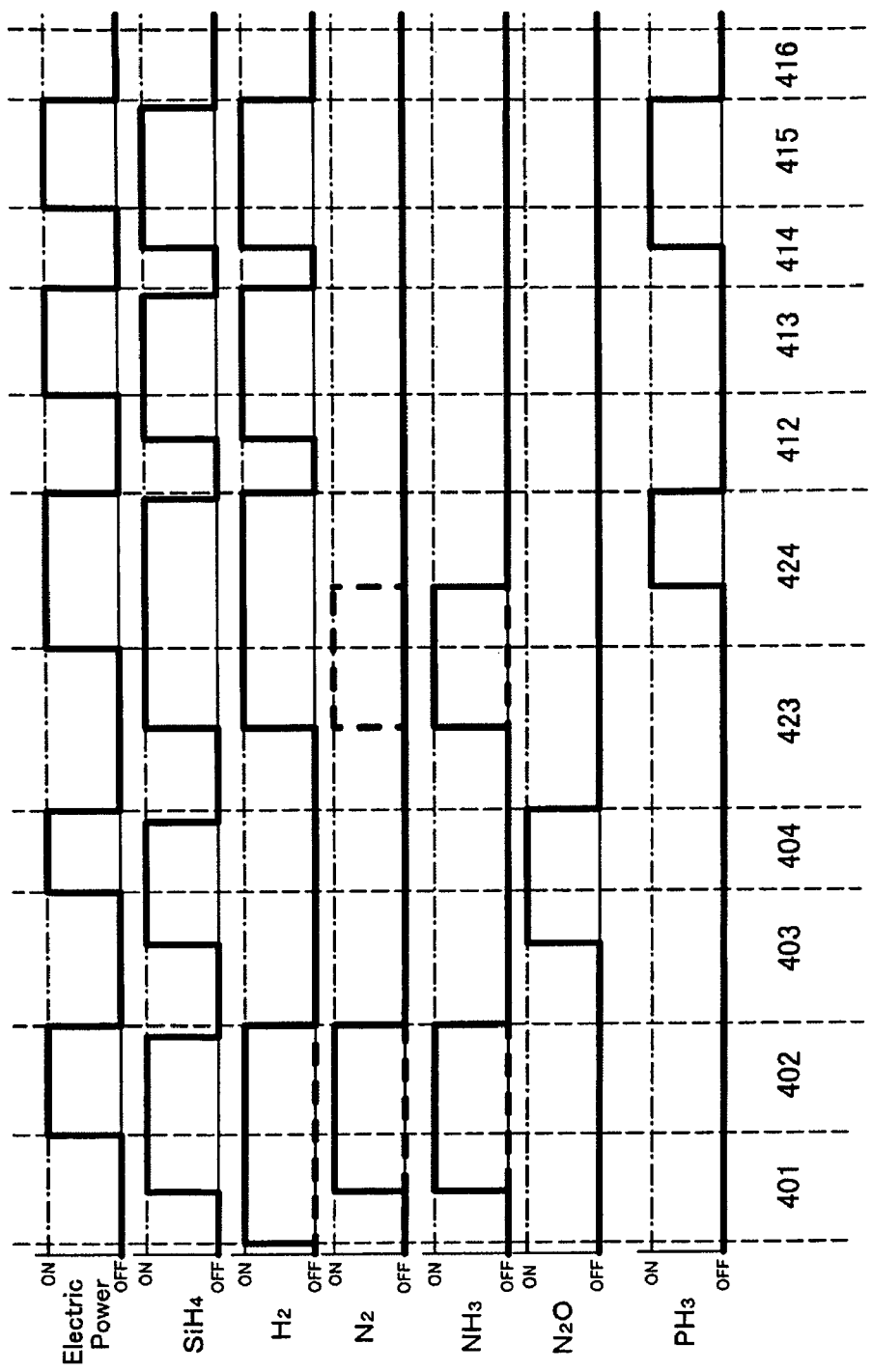
FIG. 12 is a drawing illustrating an example of a method for manufacturing a thin film transistor according to embodiments.

First, a substrate provided with the gate electrode layer 102 is heated in a treatment chamber of a CVD apparatus, and source gases used for depositing a silicon nitride layer are introduced into the treatment chamber (preliminary treatment 401 in FIG. 12). Here, as an example, $SiH_4$, $H_2$, $N_2$, and $NH_3$ are introduced as source gases at flow rates of 40 sccm, 500 sccm, 550 sccm, and 140 sccm, respectively, and are stabilized; further, the pressure in the treatment chamber is set to be 100 Pa, the substrate temperature is set to be 280° C., and plasma discharge is performed at an output of 370 W, so that a silicon nitride layer is formed with a thickness of about 110 nm. After that, only the introduction of $SiH_4$ is halted, and several seconds later, plasma discharge is halted (formation of SiN 402 in FIG. 12).

Next, the source gases used for depositing silicon nitride are exhausted, and source gases used for depositing silicon oxynitride are introduced into the treatment chamber (replacement of gases 403 in FIG. 12). Here, as an example, $SiH_4$ and $N_2O$ are introduced as source gases at flow rates of 30 sccm and 1200 sccm, respectively, and are stabilized; further, the pressure in the treatment chamber is set to be 40 Pa, the substrate temperature is set to be 280° C., and plasma discharge is performed at an output of 50 W, so that a silicon oxynitride layer can be formed with a thickness of about 110 nm. After that, in a manner similar to that of the silicon nitride layer and the like, only the introduction of $SiH_4$ is halted, and several seconds later, plasma discharge is halted (formation of SiON 404 in FIG. 12). And then, these gases are exhausted, and gases used for depositing the semiconductor layer 105 are introduced (replacement of gases 423 in FIG. 12).

Next, the semiconductor layer 105 to which an impurity element serving as a donor is added is formed over the entire surface of the gate insulating layer 104. The semiconductor layer 105 to which an impurity element serving as a donor is added is patterned to be the semiconductor layer 106 to which an impurity element serving as a donor is added in a later step. Here, as an example, $SiH_4$, $H_2$, and 100 ppm $NH_3$ (diluted with $H_2$) are introduced as source gases at flow rates of 10 sccm, 1200 sccm, and 300 sccm, respectively, and are stabilized; further, the pressure in the treatment chamber is set to be 280 Pa, the substrate temperature is set to be 280° C., and plasma discharge is performed at an output of 50 W. After that the introduction of only $NH_3$ (diluted with $H_2$) is halted, and 10 ppm $PH_3$ (diluted with $H_2$) is introduced at the flow rate of 10 sccm so that a semiconductor layer to which an impurity element serving as a donor is added is grown. Accordingly, a semiconductor layer including a layer to which an impurity element serving as a donor is added at an upper portion can be formed with a thickness of about 50 nm. After that, in a manner similar to that of the above silicon nitride layer and the like, only the introduction of $SiH_4$ is halted, and several seconds later, plasma discharge is halted (formation of a semiconductor layer 424 in FIG. 12). Note that $N_2$ may be used instead of $NH_3$. Further, both $N_2$ and $NH_3$ may be used. And then, these gases are exhausted, and gases used for depositing the buffer layer 107 are introduced (replacement of gases 412 in FIG. 12).

In the above example, in source gases used for forming the semiconductor layer 105 to which an impurity element serving as a donor is added, the flow ratio of $H_2$ to $SiH_4$ is set to be 150:1. Thus, silicon is gradually deposited.

In this embodiment, nitrogen is included in gases used for depositing the semiconductor layer 105 to which an impurity element serving as a donor is added in an early stage of deposition. As described above, nitrogen suppresses generation of silicon crystal nuclei. Thus, the silicon crystal nuclei are not generated in the early stage of deposition. This layer formed in the early stage of deposition is to be the first region 106a illustrated in FIGS. 2A and 2B. The first region 106a and the second regions 106b and 106c are formed under the same deposition conditions except for whether or not a gas including an impurity element serving as a donor is introduced. As described above, nitrogen is supplied to the surface of the gate insulating layer 104 and the semiconductor layer 105 to which an impurity element serving as a donor is added is formed over the surface of the gate insulating layer 104, so that a semiconductor layer containing nitrogen (the first region 106a illustrated in FIGS. 2A and 2B) is formed. The formation of the semiconductor layer containing nitrogen proceeds while the concentration of nitrogen is reduced. When the concentration of nitrogen is reduced to less than or equal to a certain value, the crystal nuclei are generated. And then, the crystal nuclei grow and the crystal grains 121 are formed. In addition, the semiconductor layer 105b to which an impurity element serving as a donor is added is formed. That is, a semiconductor layer containing nitrogen and an impurity element serving as a donor (the second regions 106b and 106c illustrated in FIGS. 2A and 2B) is formed. Because crystal growth proceeds faster due to the impurity element serving as a donor, the deposition time of the semiconductor layer 105b including the crystal grain 121 whose crystal grain diameter is increased can be shortened.

Next, the buffer layer 107 is formed over the entire surface of the semiconductor layer 105 to which an impurity element serving as a donor is added. The buffer layer 107 is patterned to be the buffer layer 108 in a later step. Here, the buffer layer 107 is formed using an amorphous semiconductor. First, source gases used for depositing the buffer layer 107 are introduced into the treatment chamber. Here, as an example, $SiH_4$ and $H_2$ are introduced as source gases at flow rates of 280 sccm and 300 sccm, respectively, and are stabilized; further, the pressure in the treatment chamber is set to be 170 Pa, the substrate temperature is set to be 280° C., and plasma discharge is performed at an output of 60 W, so that a semiconductor layer can be formed with a thickness of about 150 nm. After that, in a manner similar to that of the above silicon nitride layer and the like, only the introduction of $SiH_4$ is halted, and several seconds later, plasma discharge is halted (formation of an a-Si layer 413 in FIG. 12). And then, these gases are exhausted, and gases used for depositing the impurity semiconductor layer 109 having one conductivity type are introduced (replacement of gases 414 in FIG. 12).

Next, the impurity semiconductor layer 109 having one conductivity type is formed over an entire surface of the buffer layer 107. The impurity semiconductor layer 109 having one conductivity type is patterned to be the source and drain regions 110 in a later step. First, source gases used for depositing the impurity semiconductor layer 109 having one conductivity type are introduced into the treatment chamber. Here, as an example, $SiH_4$ and 0.5 vol % $PH_3$ diluted with $H_2$ are introduced as source gases at flow rates of 100 sccm and 170 sccm, respectively, and are stabilized; further, the pressure in the treatment chamber is set to be 280 Pa, the substrate temperature is set to be 280° C., and plasma discharge is performed at an output of 60 W, so that an impurity semiconductor layer having one conductivity type can be formed with a thickness of about 50 nm. After that, in a manner similar to that of the above silicon nitride layer and the like, only the introduction of $SiH_4$ is halted, and several seconds later, plasma discharge is halted (formation of an impurity semiconductor layer having one conductivity type 415 in FIG. 12). And then, these gases are exhausted (exhaust 416 in FIG. 12).

As described above, nitrogen is mixed into gases in an early stage of deposition of a semiconductor layer so that the concentration of oxygen can be suppressed and the concentration of nitrogen can be made higher than the concentration of oxygen, whereby a semiconductor layer which includes crystal grains each having an inversed-conic or inversed-pyramidal shape can be formed.

Embodiment 6

In this embodiment, an example of a mode of a thin film transistor will be described with reference to drawings. In this embodiment, a thin film transistor is formed without the use of a multi-tone mask.

Figure 13A:
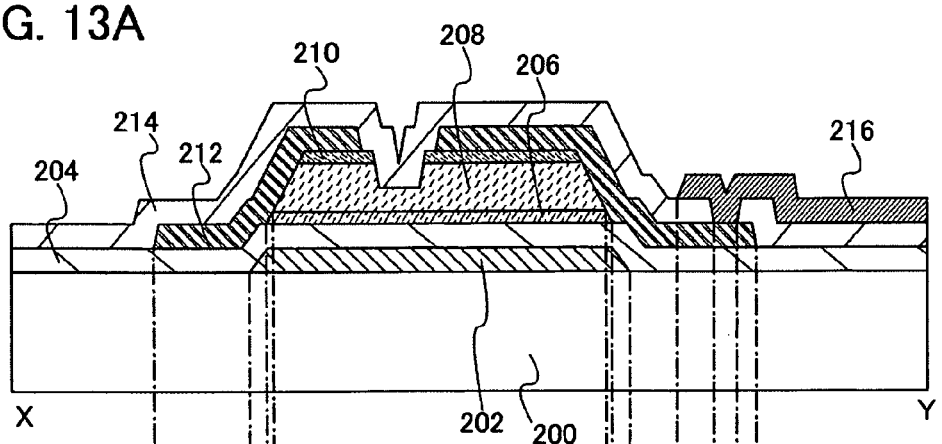
FIGS. 13A and 13B are drawings illustrating an example of a thin film transistor according to embodiments.
Figure 13B:
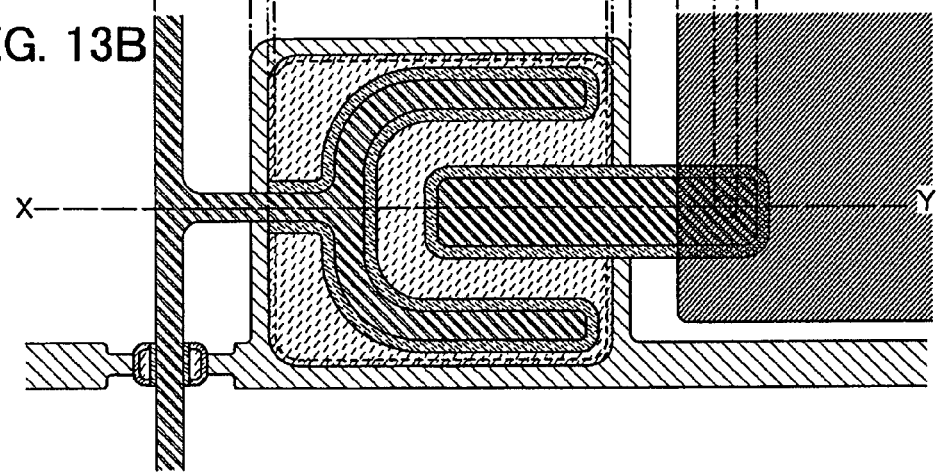

FIGS. 13A and 13B are a top view and a cross-sectional view of a thin film transistor according to this embodiment. A thin film transistor illustrated in FIG. 13A includes a gate electrode layer 202 over a substrate 200; a gate insulating layer 204 covering the gate electrode layer 202; a semiconductor layer 206 to which an impurity element serving as a donor is added provided over and in contact with the gate insulating layer 204; and a buffer layer 208 in contact with the semiconductor layer 206 to which an impurity element serving as a donor is added. The thin film transistor includes source and drain regions 210 provided over and in contact with the buffer layer 208, and wiring layers 212 in contact with the gate insulating layer 204 and the source and drain regions 210. The wiring layers 212 form source and drain electrodes. In addition, the thin film transistor includes, over the wiring layers 212, an insulating layer 214 which functions as a protective film. Moreover, each layer is patterned into a desired shape.

Note that the thin film transistor illustrated in FIGS. 13A and 13B can be applied to a pixel transistor provided for a pixel portion of a liquid crystal display device, in a manner similar to that of the thin film transistor illustrated in FIGS. 1A and 1B. Therefore, in the example which is illustrated in FIGS. 13A and 13B, an opening is provided in the insulating layer 214 and a pixel electrode layer 216 is provided over the insulating layer 214 so that the pixel electrode layer 216 and the wiring layers 212 are connected to each other.

In addition, one of the source and drain electrodes is formed so as to have a U shape (a reversed C shape), and surrounds the other of the source and drain electrodes. The distance between the source and drain electrodes is kept almost constant (see FIG. 13B).

The source and drain electrodes of the thin film transistor have the above shape, whereby a channel width of the thin film transistor can be increased, and thus the amount of current is increased. In addition, variation in electric characteristics can be reduced. Further, decrease in reliability due to deviation of a mask pattern in a manufacturing process can be suppressed. However, without limitation thereto, one of the source and drain electrodes does not necessarily have a U shape.

The semiconductor layer 206 to which an impurity element serving as a donor is added of this embodiment has similar functions to the semiconductor layer 106 to which an impurity element serving as a donor is added in Embodiment 1 and can be formed using a material and by a method which are similar to those of the semiconductor layer 106 to which an impurity element serving as a donor is added in Embodiment 1. Further, the semiconductor layer 206 to which an impurity element serving as a donor is added of this embodiment can be formed by any of the methods described in Embodiments 2 to 5. Thus, in this embodiment, detailed description on formation of the semiconductor layer 206 to which an impurity element serving as a donor is added is omitted.

A method for manufacturing the thin film transistor illustrated in FIGS. 13A and 13B is described. An n-channel thin film transistor has higher carrier mobility than a p-channel thin film transistor. It is preferable that all thin film transistors formed over one substrate have the same polarity because the number of manufacturing processes can be reduced. Therefore, in this embodiment, a method for manufacturing an n-channel thin film transistor is described.

Figure 14A:
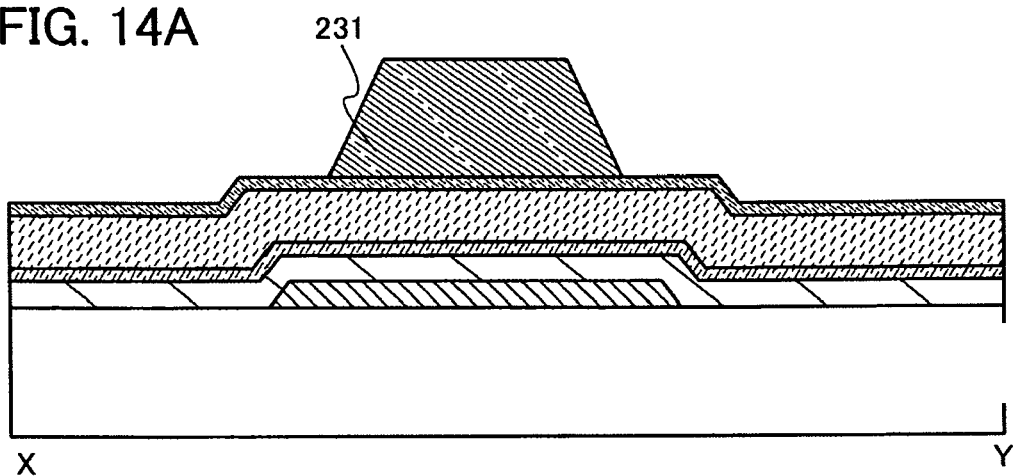
FIGS. 14A and 14B are drawings illustrating an example of a method for manufacturing a thin film transistor according to embodiments.

First, the gate electrode layer 202 is formed over the substrate 200 (see FIG. 14A).

As the substrate 200, a substrate which is similar to the substrate 100 in Embodiment 1 can be used.

The gate electrode layer 202 can be formed using a material and by a method which are similar to those of the gate electrode layer 102 in Embodiment 1.

Next, the gate insulating layer 204 which covers the gate electrode layer 202 is formed. The gate insulating layer 204 can be formed using a material and by a method which are similar to those of the gate insulating layer 104 in Embodiment 1.

Here, treatment for supplying nitrogen may be performed on the gate insulating layer 204. As the treatment for supplying nitrogen, treatment of exposing the gate insulating layer 204 to an ammonia gas, which is described in Embodiment 1, can be given as an example.

Next, a semiconductor layer 205 to which an impurity element serving as a donor is added, a buffer layer 207, and an impurity semiconductor layer 209 having one conductivity type are formed over the gate insulating layer 204. After that, a first resist mask 231 is formed over the impurity semiconductor layer 209 having one conductivity type.

The semiconductor layer 205 to which an impurity element serving as a donor is added can be formed in a manner similar to that of the semiconductor layer 105 to which an impurity element serving as a donor is added in Embodiment 1. The buffer layer 207 can be formed in a manner similar to that of the buffer layer 107 in Embodiment 1. The impurity semiconductor layer 209 having one conductivity type can be formed in a manner similar to that of the impurity semiconductor layer 109 having one conductivity type in Embodiment 1.

Figure 14B:
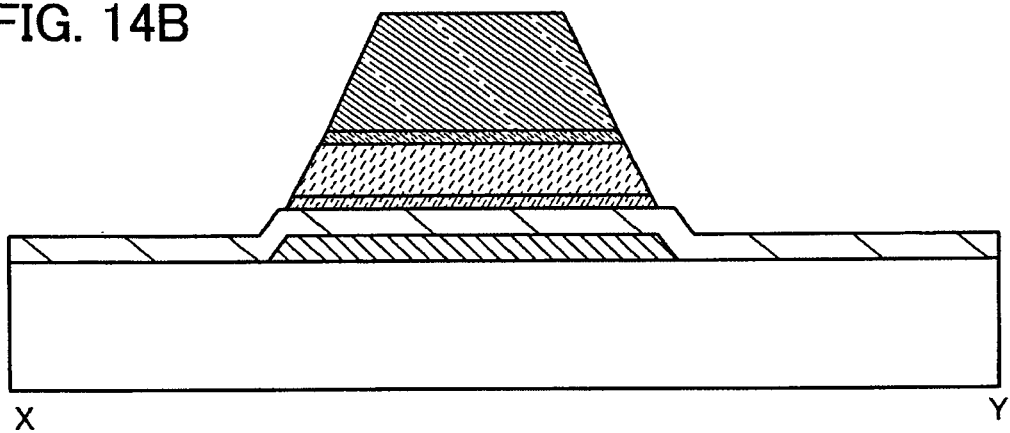
Figure 15A:
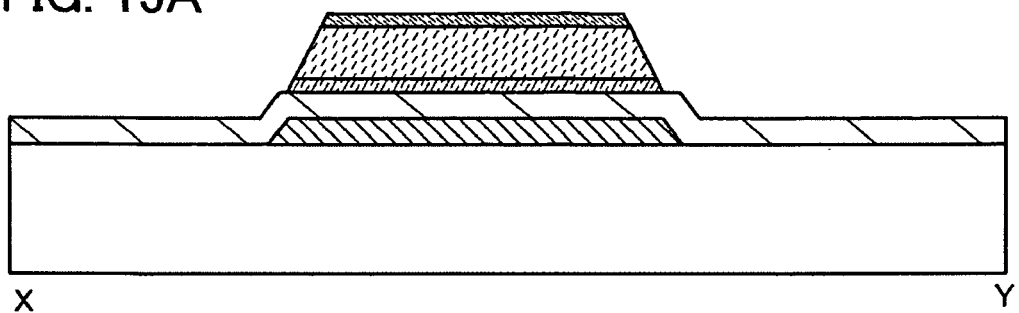
FIGS. 15A to 15C are drawings illustrating an example of a method for manufacturing a thin film transistor according to embodiments.

Next, the buffer layer 207 and the impurity semiconductor layer 209 having one conductivity type are etched to form an island-shaped semiconductor layer with the use of the first resist mask 231 (see FIG. 14B). After that, the first resist mask 231 is removed (see FIG. 15A).

Figure 15B:
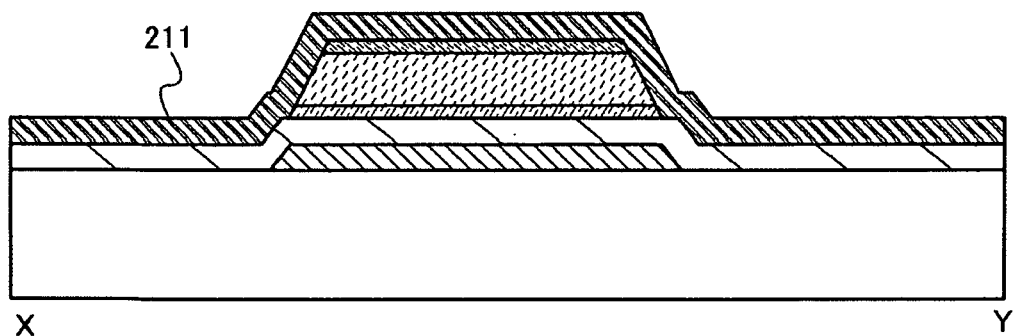
Figure 15C:
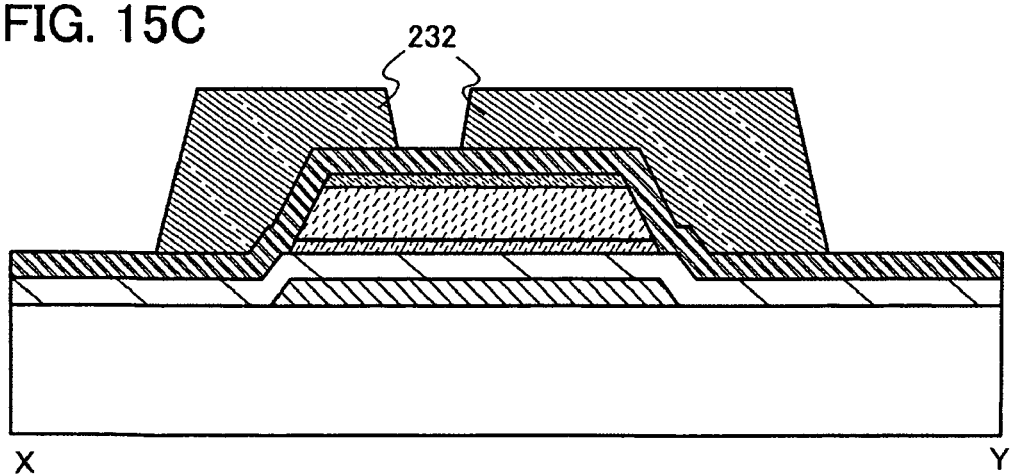

Next, a conductive layer 211 is formed so as to cover the etched semiconductor layer 205, the buffer layer 207, and the impurity semiconductor layer 209 having one conductivity type (see FIG. 15B). The conductive layer 211 can be formed using a material and by a method which are similar to those of the conductive layer 111. After that, a second resist mask 232 is formed over the conductive layer 211 (see FIG. 15C).

Figure 16A:
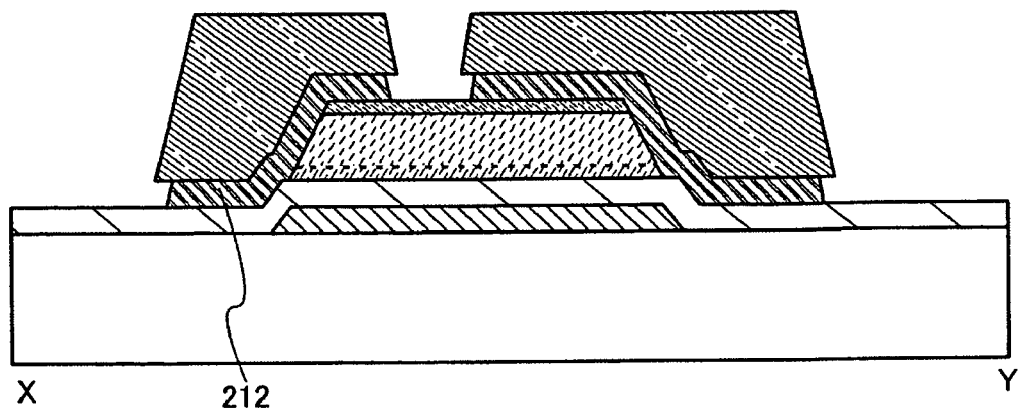
FIGS. 16A to 16C are drawings illustrating an example of a method for manufacturing a thin film transistor according to embodiments.

Next, the conductive layer 211 is etched using the second resist mask 232 to form the wiring layers 212 (see FIG. 16A). The wiring layers 212 form source and drain electrodes. The etching of the conductive layer 211 is preferably performed by wet etching. By wet etching, the conductive layer is isotropically etched, a side surface of the conductive layer recedes to an inner side than that of the second resist mask 232, and thus the wiring layers 212 are formed. Thus, the side surfaces of the wiring layers 212 are not aligned with the side surfaces of the etched impurity semiconductor layer 209 having one conductivity type, and the side surfaces of the source and drain regions are formed outside of the side surfaces of the wiring layers 212. The wiring layers 212 function not only as source and drain electrodes but also as a signal line. However, without limitation thereto, a signal line may be provided separately from the wiring layers 212.

Figure 16B:
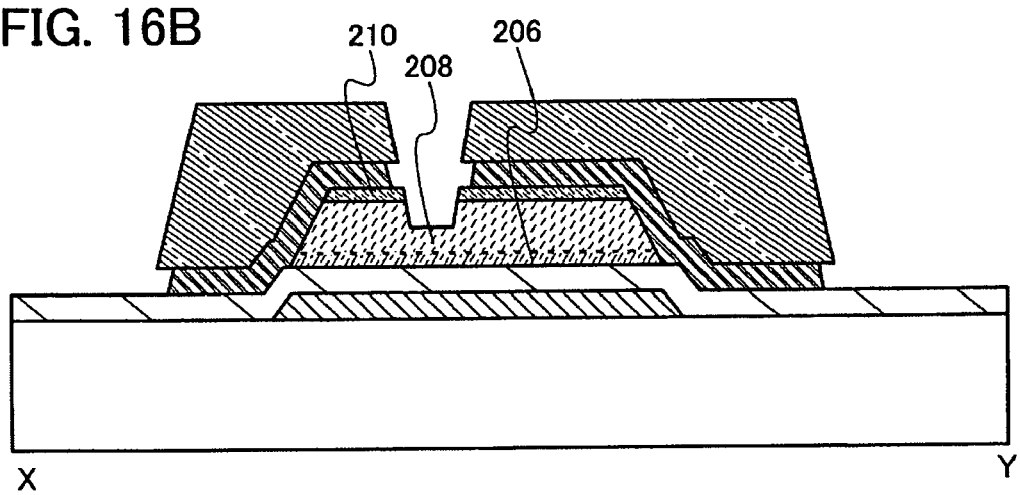

Next, the impurity semiconductor layer 209 having one conductivity type and part of the upper part of the buffer layer 207 of the island-shaped semiconductor layer, are etched with the use of the second resist mask 232 (see FIG. 16B). The semiconductor layer 206, the buffer layer 208, and the source and drain regions 210 are formed up to here.

Figure 16C:
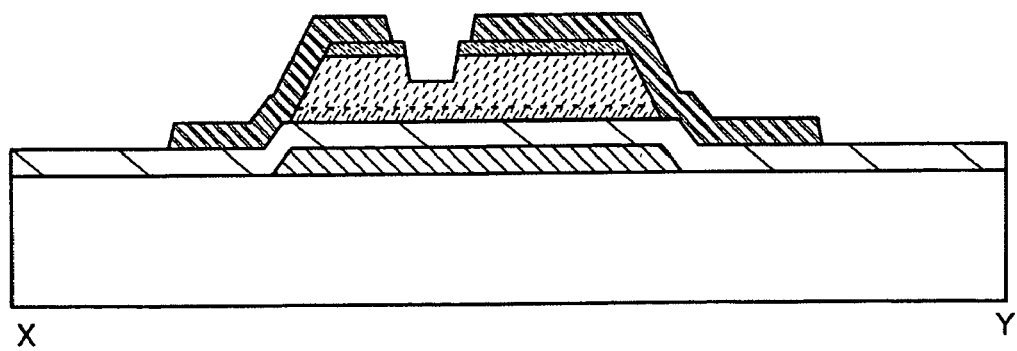

Then, dry etching may be performed under such a condition that the buffer layer 208 is not damaged and the etching rate with respect to the buffer layer 208 is low, with the second resist mask 232 formed in a manner similar to that of Embodiment 1. Furthermore, the second resist mask 232 may be removed by water plasma treatment (see FIG. 16C).

Through the above steps, the thin film transistor according to this embodiment can be manufactured. The thin film transistor according to this embodiment can be employed for a switching transistor provided for a pixel of a display device typified by a liquid crystal display device, in a manner similar to that of the thin film transistor described in Embodiment 1. Thus, the insulating layer 214 which covers this thin film transistor is formed. In the insulating layer 214, an opening which reaches the source and drain electrodes which include the wiring layers 212 is formed. This opening can be formed by a photolithography method. After that, the pixel electrode layer 216 is provided over the insulating layer 214 so as to be connected through the opening. As described above, the switching transistor provided for a pixel of a display device, which is illustrated in FIGS. 13A and 13B, can be manufactured.

Note that the insulating layer 214 can be formed in a manner similar to that of the insulating layer 114 in Embodiment 1. Further, the pixel electrode layer 216 can be formed in a manner similar to that of the pixel electrode layer 116 in Embodiment 1.

Although not illustrated, an insulating layer formed using an organic resin film by a spin coating method or the like may be formed between the insulating layer 214 and the pixel electrode layer 216.

As described above in this embodiment, a thin film transistor having high on-state current and low off-state current can be obtained without the use of a multi-tone mask.

Embodiment 7

In this embodiment, a liquid crystal display device including the thin film transistor described in Embodiment 6 will be described below as a mode of a display device. Here, a vertical alignment (VA) liquid crystal display device will be described with reference to FIG. 17, FIG. 18, and FIG. 19. The VA liquid crystal display device employs one mode for controlling alignment of liquid crystal molecules of a liquid crystal panel. The VA liquid crystal display device employs a mode in which liquid crystal molecules are vertical to a panel surface when voltage is not applied. In particular, in this embodiment, it is devised that a pixel is divided into several regions (sub-pixels) so that molecules are aligned in different directions in the respective regions. This is referred to as multi-domain or multi-domain design. In the following description, a liquid crystal display device with multi-domain design is described.

Figure 17:
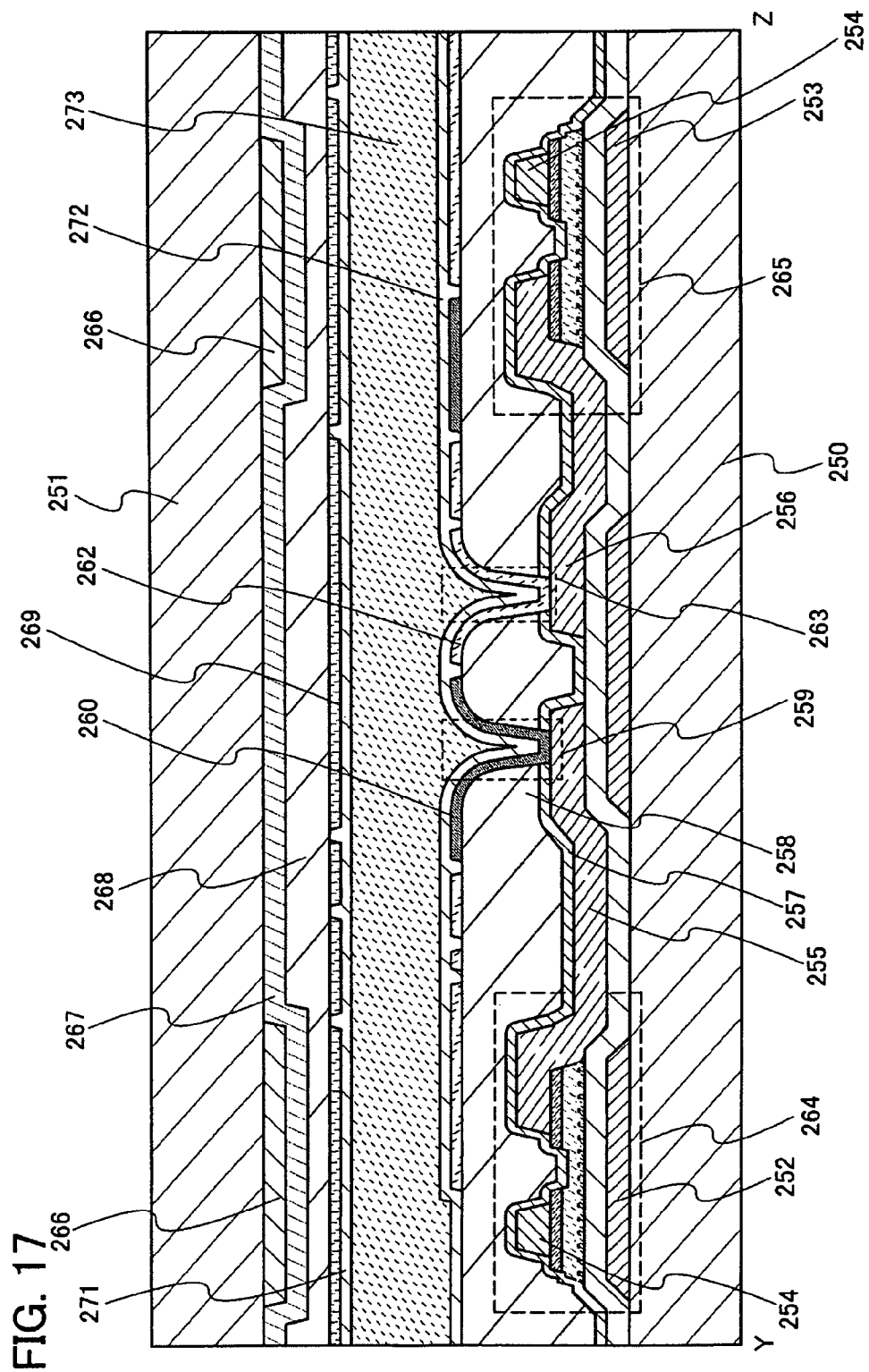
FIG. 17 is a drawing illustrating an electronic device and the like for which a thin film transistor according to embodiments can be employed.
Figure 18:
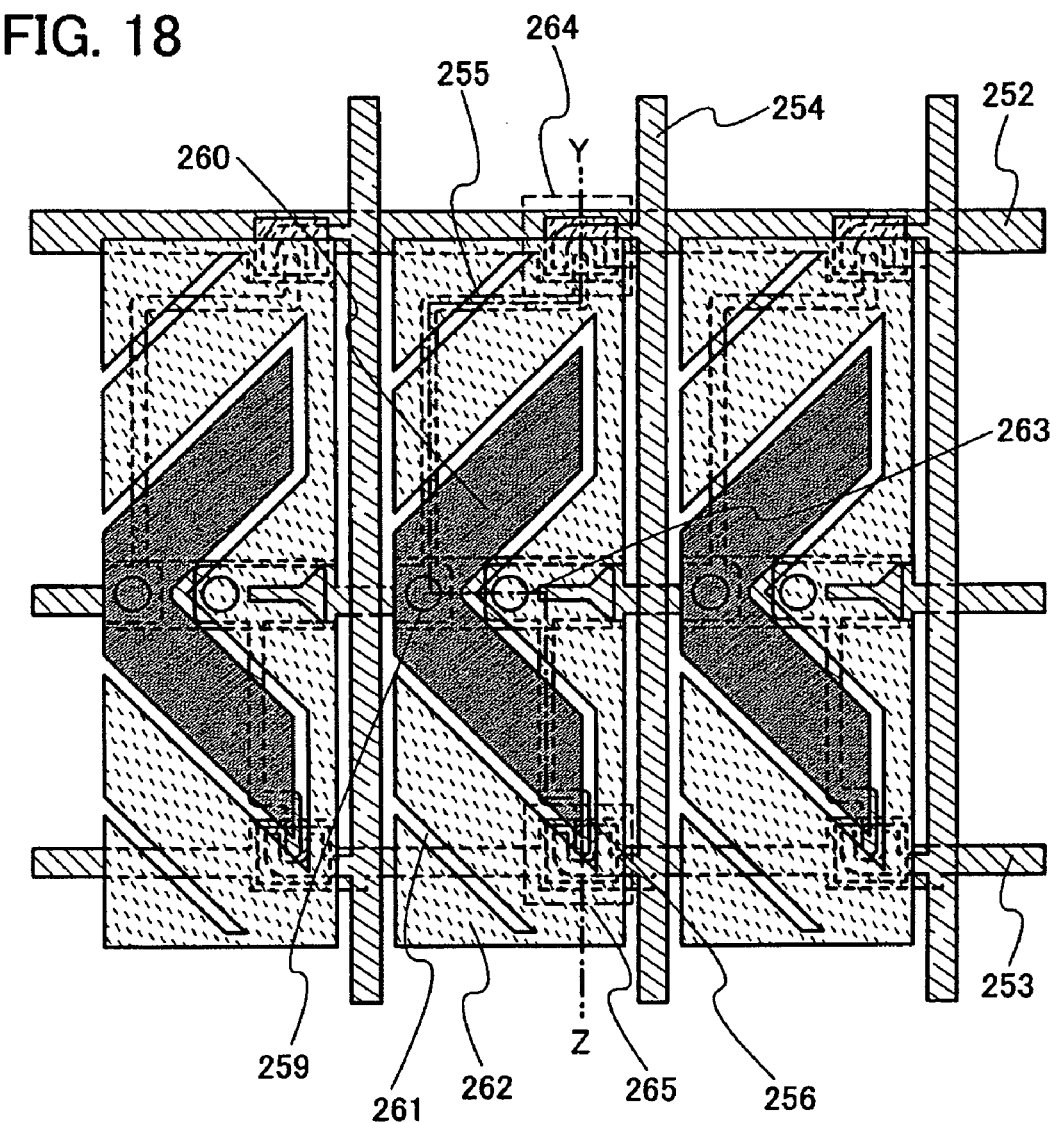
FIG. 18 is a drawing illustrating an electronic device and the like for which a thin film transistor according to embodiments can be employed.

FIG. 17 and FIG. 18 illustrate a pixel structure of a VA liquid crystal display device. FIG. 18 is a plan view of a pixel structure described in this embodiment. FIG. 17 illustrates a cross-sectional structure along a line Y-Z in FIG. 18. The following description will be given with reference to FIG. 17 and FIG. 18.

In the pixel structure described in this embodiment, a plurality of pixel electrodes 260 and 262 is included in one pixel provided over a substrate 250, and thin film transistors 264 and 265 are connected to the pixel electrodes 260 and 262, respectively, through a planarization layer 258 and an insulating layer 257. Each of the thin film transistors is driven by a different gate signal. That is, a pixel of multi-domain design has a structure in which signals applied to the pixel electrodes 260 and 262 are independently controlled.

The pixel electrode 260 is connected to the thin film transistor 264 through a wiring 255 in a contact hole 259. In an opening 263, the pixel electrode 262 is connected to the thin film transistor 265 through a wiring 256. A gate electrode 252 of the thin film transistor 264 and a gate electrode 253 of the thin film transistor 265 are separated so that different gate signals can be given thereto. In contrast, a wiring 254 functioning as a data line is used in common for the thin film transistors 264 and 265. The thin film transistors 264 and 265 can be manufactured by the method described in Embodiment 6.

The pixel electrodes 260 and 262 have different shapes and are separated by a slit 261. The pixel electrode 262 surrounds the pixel electrode 260, which has a V-shape. Timings of voltage application are varied between the pixel electrode 260 and the pixel electrode 262 by the thin film transistor 264 and the thin film transistor 265, so that alignment of liquid crystals is controlled. When different gate signals are supplied to the gate electrode 252 and the gate electrode 253, operation timings of the thin film transistor 264 and the thin film transistor 265 can be varied. An alignment film 272 is formed over the pixel electrodes 260 and 262.

Figure 19:
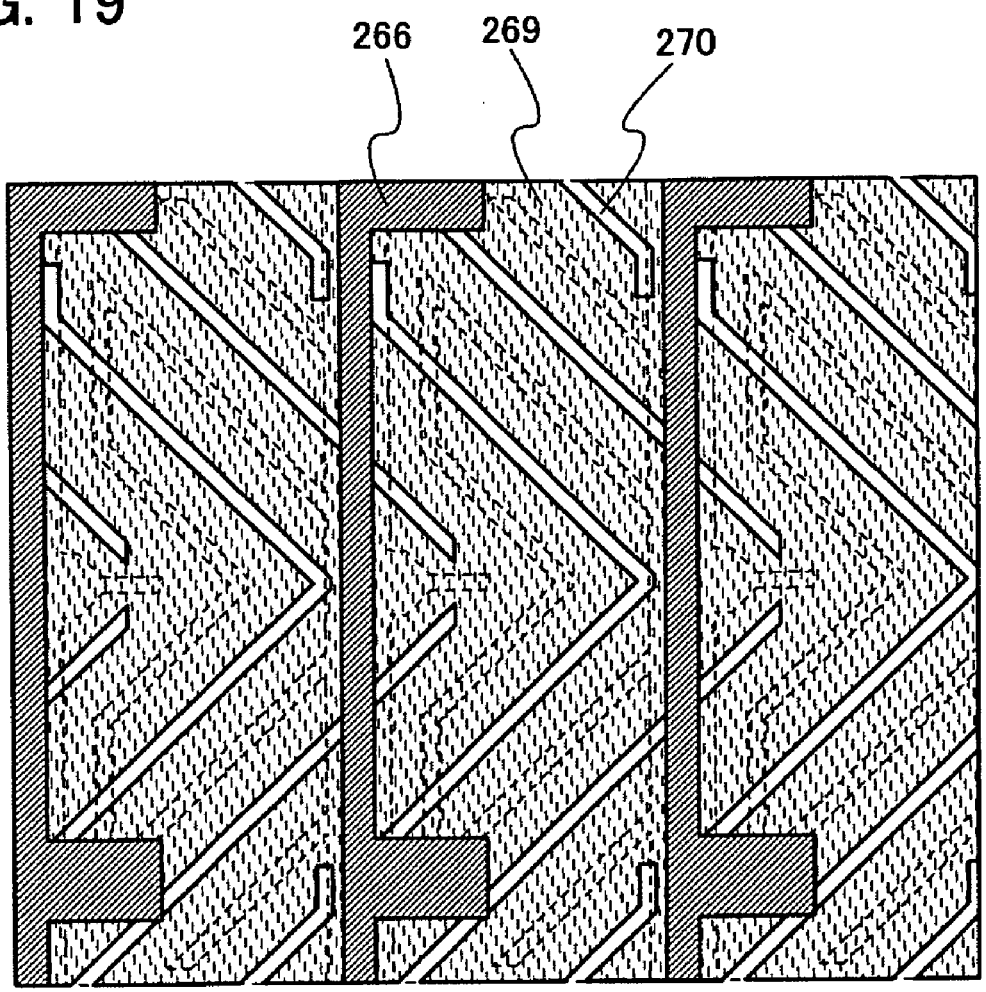
FIG. 19 is a drawing illustrating an electronic device and the like for which a thin film transistor according to embodiments can be employed.

A counter substrate 251 is provided with a light shielding film 266, a coloring film 267, and a counter electrode 269. In addition, a planarization layer 268 is formed between the coloring film 267 and the counter electrode 269 so that alignment disorder of liquid crystals is prevented. Further, an alignment film 271 is formed on the counter electrode 269. FIG. 19 illustrates a pixel structure on the side of the counter substrate 251. A slit 270 is formed in the counter electrode 269 that is used in common between different pixels. The slit 270 and the slit 261 of the pixel electrodes 260 and 262 are alternately arranged; thus, an oblique electric field is generated, and the alignment of liquid crystals can be controlled. As a result, a direction of alignment of the liquid crystals can be made different depending on location and the viewing angle can be widened.

In this specification, a substrate, a coloring film, a light shielding film, and a planarization layer form a color filter. Note that either the light shielding film or the planarization layer, or both of them are not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

The pixel electrode 260 and the counter electrode 269 support a liquid crystal layer 273 so that a first liquid crystal element is formed. Further, the pixel electrode 262 and the counter electrode 269 support the liquid crystal layer 273 so that a second liquid crystal element is formed. Furthermore, the multi-domain structure is employed in which the first liquid crystal element and the second liquid crystal element are provided for one pixel.

Although a VA liquid crystal display device is described here as a liquid crystal display device, this embodiment is not limited thereto. That is, the element substrate formed using the thin film transistor described in Embodiment 6 can also be applied to an FFS mode liquid crystal display device, an IPS mode liquid crystal display device, a TN mode liquid crystal display device, and the like.

Moreover, although the thin film transistor manufactured by the method described in Embodiment 6 is used in the above description, the thin film transistor manufactured by any of the methods described in Embodiments 1 to 5 can be used.

As described above, a liquid crystal display device can be manufactured. Since a thin film transistor having high on-state current and low off-state current is used as a pixel transistor in the liquid crystal display device of this embodiment, the liquid crystal display device with excellent image quality (e.g., high contrast) and low power consumption can be manufactured.

Embodiment 8

Figure 20A:
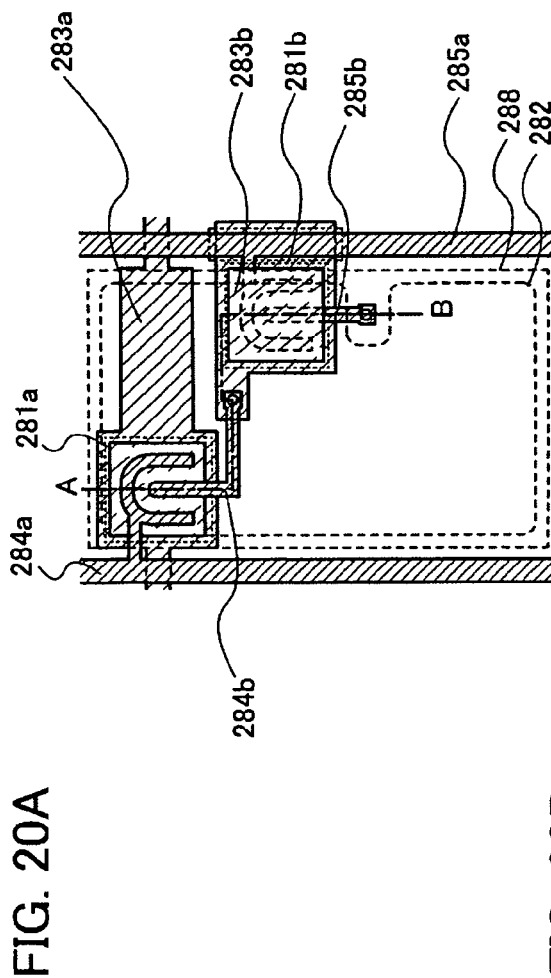
FIGS. 20A and 20B are drawings illustrating an electronic device and the like, for which a thin film transistor according to embodiments can be employed.
Figure 20B:
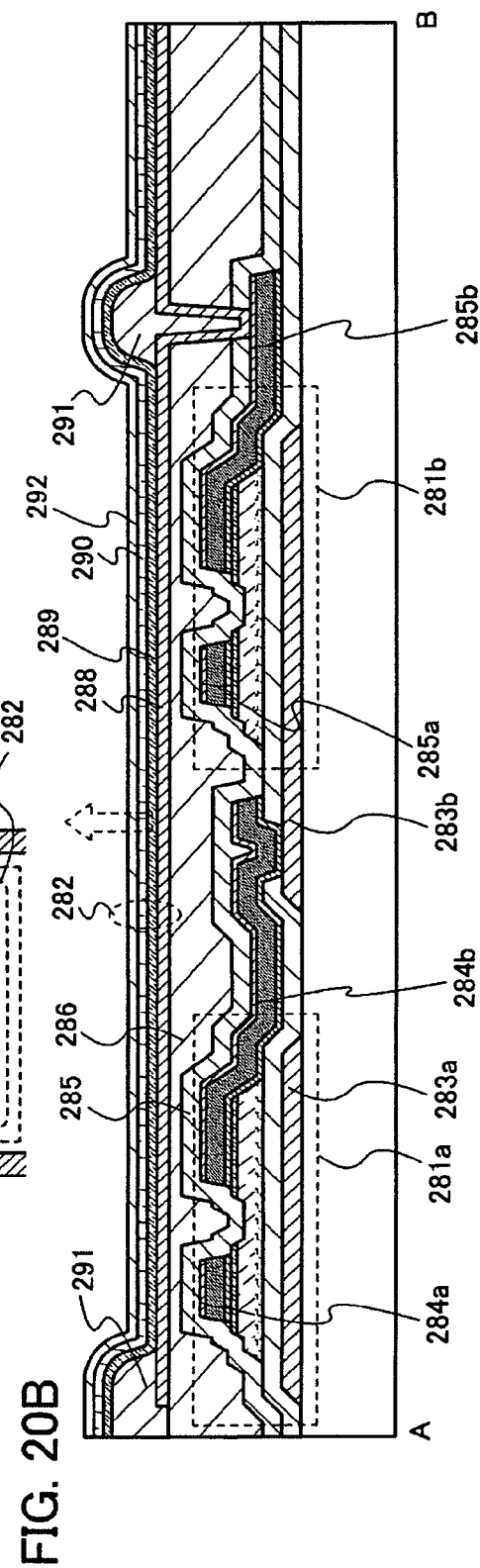

In this embodiment, a light-emitting display device including the thin film transistor described in Embodiment 6 will be described below as a mode of a display device, and a mode of a structure of a pixel included in the light-emitting display device will be described. FIG. 20A illustrates a plan view of a pixel. FIG. 20B illustrates a cross-sectional structure of the pixel along a line A-B in FIG. 20A.

In this embodiment, a display device which includes a light-emitting element utilizing electroluminescence is used as a light-emitting display device. Light-emitting elements utilizing electroluminescence are broadly classified according to whether a light-emitting material is an organic compound or an inorganic compound. In general, the former is referred to as an organic EL element, and the latter as an inorganic EL element. In addition, the manufacturing process of the thin film transistor in accordance with Embodiment 6 is used in this embodiment; however, the manufacturing process of the thin film transistor is not limited thereto, and the manufacturing process of the thin film transistor in accordance with Embodiment 1 can be used.

In the case of an organic EL element, by applying voltage to a light-emitting element, electrons and holes are injected from a pair of electrodes into a layer including an organic compound with a light-emitting property to cause a current flow. Then, by recombination of these carriers (electrons and holes), the organic compound with a light-emitting property forms an excited state, and light is emitted when the excited state returns to a ground state. Due to the above mechanism, such a light-emitting element is referred to as a current excitation type light-emitting element.

Inorganic EL elements are classified according to their element structures, into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin-film type inorganic EL element has a structure in which a light-emitting layer is interposed between dielectric layers and the light-emitting layer interposed between the dielectric layers is further interposed between electrodes, and adopts local emission in which inner shell electron transition of a metal ion is utilized as the mechanism of light emission. Note that the description is given here using an organic EL element as a light-emitting element.

In FIGS. 20A and 20B, a first thin film transistor 281a is a switching thin film transistor for controlling input of a signal to a pixel electrode, and a second thin film transistor 281b is a driving thin film transistor for controlling current or voltage supply to a light-emitting element 282.

A gate electrode of the first thin film transistor 281a is connected to a scanning line 283a, one of source and drain regions is connected to a signal line 284a, and the other of the source and drain regions is connected to a gate electrode 283b of the second thin film transistor 281b through a wiring 284b. One of source and drain regions of the second thin film transistor 281b is connected to a power source line 285a, and the other of the source and drain regions is connected to a pixel electrode (a cathode 288) of a light-emitting element through a wiring 285b. A gate electrode, a gate insulating film, and the power source line 285a of the second thin film transistor 281b form a capacitor element, and the other of the source and drain electrodes of the first thin film transistor 281a is connected to the capacitor element.

The capacitor element corresponds to a capacitor element for holding a potential difference between the gate electrode and the source electrode or between the gate electrode and the drain electrode (hereinafter referred to as a gate voltage) of the second thin film transistor 281b when the first thin film transistor 281a is turned off, and is not necessarily provided.

In this embodiment, although the first thin film transistor 281a and the second thin film transistor 281b are n-channel thin film transistors, either or both the first thin film transistor 281a and the second thin film transistor 281b may be p-channel thin film transistors.

An insulating layer 285 is formed over the first thin film transistor 281a and the second thin film transistor 281b, a planarization layer 286 is formed over the insulating layer 285, a contact hole is formed in the planarization layer 286 and the insulating layer 285, and the cathode 288 is formed so as to be connected to the wiring 285b in the contact hole. The planarization layer 286 is preferably formed using an organic resin such as an acrylic resin, polyimide, or polyamide, or a siloxane polymer. Since the cathode 288 has unevenness in the contact hole, a partition wall 291 having an opening is provided to cover the uneven portion of the cathode 288. In the opening of the partition wall 291, an EL layer 289 is formed so as to be in contact with the cathode 288, and an anode 290 is formed so as to cover the EL layer 289. A protective insulating film 292 is formed so as to cover the anode 290 and the partition wall 291.

The light-emitting element 282 having a top emission structure is described as a light-emitting element. The light-emitting element 282 with a top emission structure can emit light even in the case where the first thin film transistor 281a and the second thin film transistor 281b overlap one another; thus, a larger light emission area can be secured. However, if a base film of the EL layer 289 has unevenness, the thickness is nonuniform due to unevenness, and the cathode 288 and the anode 290 are short-circuited, so that a display defect is caused. Therefore, it is preferable to provide the planarization layer 286. By provision of the planarization layer 286, the yield can be improved.

The light-emitting element 282 corresponds to a region where the EL layer 289 is sandwiched between the cathode 288 and the anode 290. In the case of the pixel illustrated in FIG. 20, light from the light-emitting element 282 is emitted to the side of the anode 290 as denoted by an outline arrow.

As the cathode 288, any known conductive film can be used as long as it has a low work function and reflects light. For example, Ca, Al, MgAg, AlLi, or the like is preferably used. The EL layer 289 may be formed using a single layer or using a plurality of layers by stacking the plurality of layers. When the EL layer 289 is formed using a plurality of layers, an electron-injecting layer, an electron-transporting layer, a light-emitting layer, a hole-transporting layer, and a hole-injecting layer are stacked in this order over the cathode 288. Except for the light-emitting layer, it is not necessary to form, for example, the electron-injecting layer, the electron-transporting layer, the hole-transporting layer, and the hole-injecting layer, and they may be formed as needed. The anode 290 is formed using a light-transmitting conductive material such as a conductive film having a light-transmitting property formed using indium oxide including tungsten oxide, indium zinc oxide including tungsten oxide, indium oxide including titanium oxide, indium tin oxide including titanium oxide, ITO, indium zinc oxide, indium tin oxide to which silicon oxide is added, or the like.

A light-emitting element having a top emission structure in which light is extracted from a side opposite to a substrate is described here; however, this embodiment is not limited thereto. That is, a light-emitting element having a bottom emission structure in which light is extracted from the substrate side, or a light-emitting element having a dual emission structure in which light is extracted from both the substrate side and the side opposite to the substrate can also be employed.

Although an organic EL element is described here as a light-emitting element, an inorganic EL element may also be used as a light-emitting element.

Note that, in this embodiment, an example in which the thin film transistor for controlling driving of the light-emitting element (the driving thin film transistor) is connected to the light-emitting element is described; however, a thin film transistor for controlling current may be connected between the driving thin film transistor and the light-emitting element.

As described above, a light-emitting display device can be manufactured. Since a thin film transistor having high on-state current and low off-state current is used as a pixel transistor in the light-emitting display device of this embodiment, the light-emitting display device with excellent image quality (e.g., high contrast) and low power consumption can be manufactured.

Embodiment 9

In this embodiment, an example of a structure of a display panel which is a display device and can apply the above embodiments will be described.

Figure 21A:
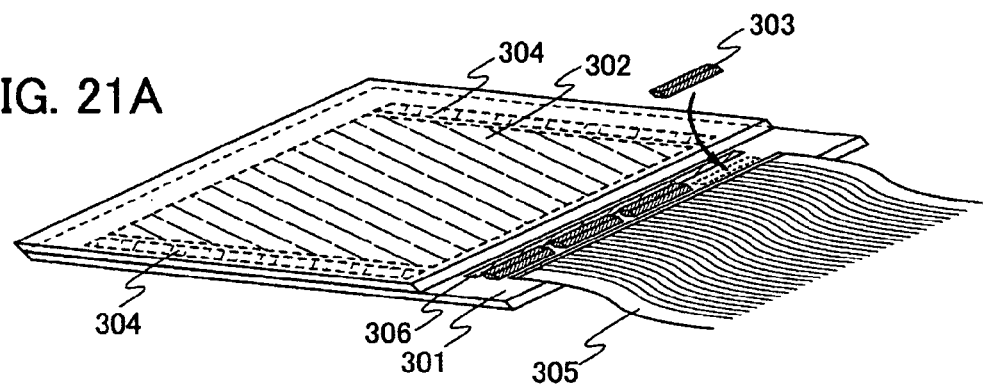
FIGS. 21A to 21C are drawings illustrating electronic devices and the like for which a thin film transistor according to embodiments can be employed.

FIG. 21A illustrates a mode of a display panel in which a pixel portion 302 formed over a substrate 301 is connected to a signal line driver circuit 303 which is formed separately. An element substrate which is provided with the pixel portion 302, a protection circuit 306, and a scanning line driver circuit 304 is formed using the thin film transistor described in any of Embodiments 1 to 6. The signal line driver circuit 303 may be formed using a transistor in which a single crystal semiconductor is used for a channel formation region, a thin film transistor in which a polycrystalline semiconductor is used for a channel formation region, or a transistor in which silicon on insulator (SOI) is used for a channel formation region. A transistor in which SOI is used includes a transistor in which a single crystal semiconductor layer provided over a glass substrate is used for a channel formation region. The pixel portion 302, the signal line driver circuit 303, and the scanning line driver circuit 304 are each supplied with potential of a power source, a variety of signals, and the like through an FPC 305. The protection circuit 306 including the thin film transistor described in any of Embodiments 1 to 6 may be provided either or both between the signal line driver circuit 303 and the FPC 305 and between the signal line driver circuit 303 and the pixel portion 302. The protection circuit 306 may include one or more elements selected from a thin film transistor having another structure, a diode, a resistor element, a capacitor element, or the like.

Note that the signal line driver circuit and the scanning line driver circuit may both be formed over a substrate which is the same as the substrate over which a pixel transistor of the pixel portion is formed.

Figure 21B:
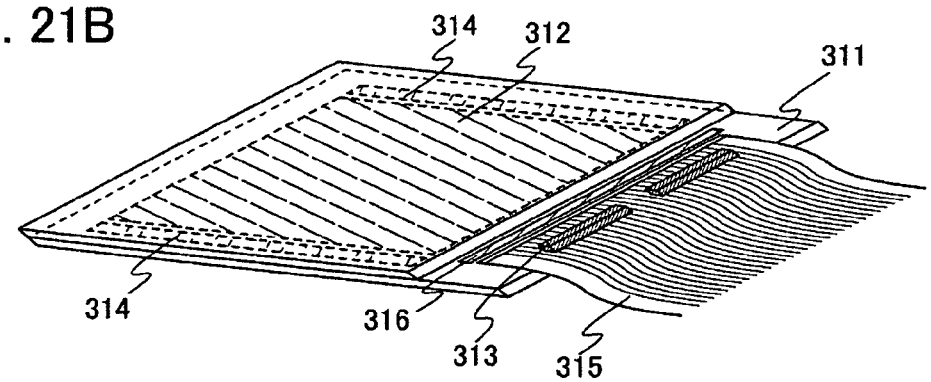

Also, when a driver circuit is separately formed, a substrate provided with the driver circuit is not always required to be attached to a substrate provided with a pixel portion, and may be attached to, for example, an FPC. FIG. 21B illustrates a mode of a display panel in which a signal line driver circuit 313 is formed separately and an FPC 315 is connected to an element substrate provided with a pixel portion 312, a protection circuit 316, and a scanning line driver circuit 314, which are formed over a substrate 311. The pixel portion 312, the protection circuit 316, and the scanning line driver circuit 314 are each formed using a thin film transistor described in any of the above embodiments. The signal line driver circuit 313 is connected to the pixel portion 312 through the FPC 315 and the protection circuit 316. The pixel portion 312, the signal line driver circuit 313, and the scanning line driver circuit 314 are each supplied with potential of a power source, a variety of signals, and the like through the FPC 315.

Figure 21C:
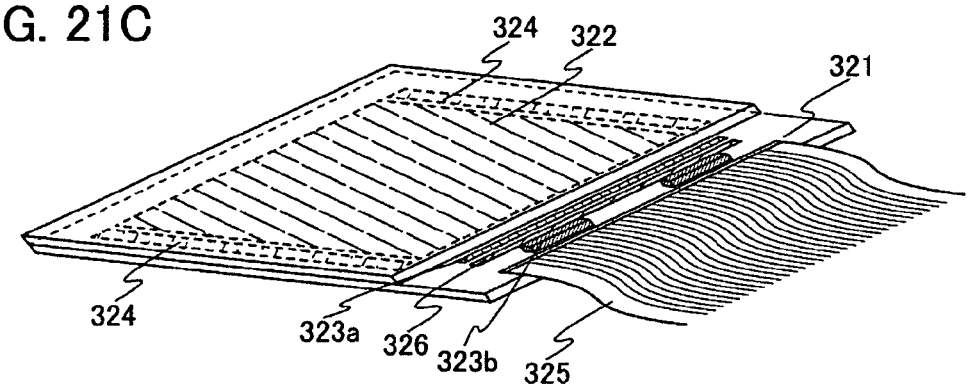

Furthermore, only part of the signal line driver circuit or only part of the scanning line driver circuit may be formed over one substrate as the pixel portion using the thin film transistor described in any of the above embodiments, and the rest may be formed separately and electrically connected to the pixel portion. FIG. 21C illustrates a mode of a display panel in which an analog switch 323a included in the signal line driver circuit is formed over a substrate 321 over which a pixel portion 322 and a scanning line driver circuit 324 are formed, and a shift register 323b included in the signal line driver circuit is formed separately over a different substrate and then attached to the substrate 321. The pixel portion 322, a protection circuit 326, and the scanning line driver circuit 324 are each formed using a thin film transistor described in any of the above embodiments. The shift register 323b included in the signal line driver circuit is connected to the pixel portion 322 through an FPC 325 and the protection circuit 326. The pixel portion 322, the signal line driver circuit, and the scanning line driver circuit 324 are each supplied with a potential of a power source, a variety of signals, and the like through the FPC 325. Further, the protection circuit 326 may be provided between the shift register 323b and the analog switch 323a.

As illustrated in FIGS. 21A to 21C, in display devices of this embodiment, all or part of the driver circuit can be formed over a substrate which is the same as the substrate where a pixel portion is formed, using the thin film transistor described in any of the above embodiments. Note that the structures of the display devices are not limited to the above description. For example, the protection circuit may not be provided if not particularly necessary.

Note that there is no particular limitation on a connection method of the substrate formed separately, and a known method such as a COG method, a wire bonding method, or a TAB method can be used. Further, a connection position is not limited to the position illustrated in FIGS. 21A to 21C, as long as electrical connection is possible. Alternatively, a controller, a CPU, a memory, or the like may be formed separately and connected.

Note that the signal line driver circuit used in this embodiment includes a shift register and an analog switch. In addition to the shift register and the analog switch, another circuit such as a buffer, a level shifter, or a source follower may be included. Further, the shift register and the analog switch are not necessarily provided. For example, a different circuit such as a decoder circuit by which a signal line can be selected may be used instead of the shift register, or a latch or the like may be used instead of the analog switch.

Embodiment 10

An element substrate including a thin film transistor described in this embodiment, a display device including the same, and the like can be employed for a display panel of an active matrix display device. That is, the above embodiments can be applied to all electronic devices which include them as a display portion.

Examples of such electronic devices include cameras such as video cameras and digital cameras, head-mounted displays (goggle-type displays), car navigation systems, projectors, car stereo sets, personal computers, and portable information terminals (e.g., mobile computers, mobile phones, electronic book readers, and the like). Examples of these devices are illustrated in FIGS. 22A to 22D.

Figure 22A:
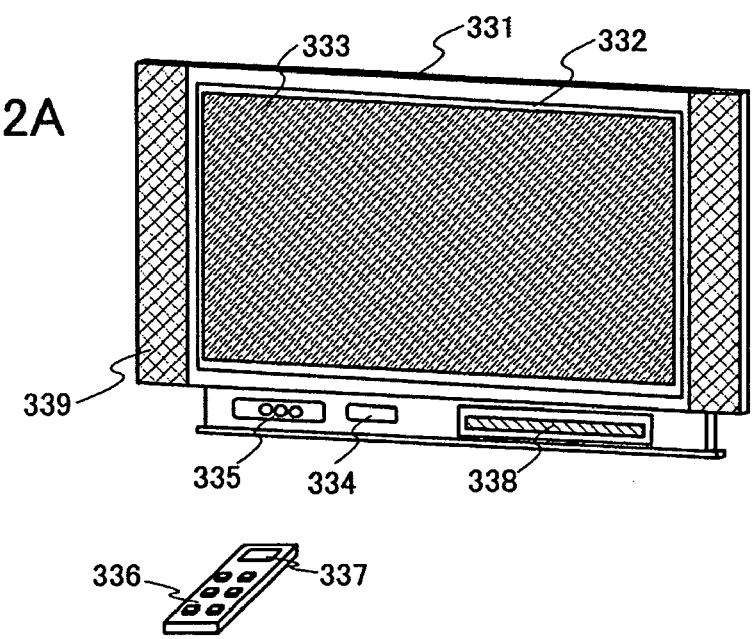
FIGS. 22A to 22D are drawings illustrating electronic devices and the like for which a thin film transistor according to embodiments can be employed.

FIG. 22A illustrates a television device. The television device illustrated in FIG. 22A can be completed by incorporating a display panel employing the above embodiments into a chassis. A main screen 333 is formed using the display panel. In addition, a speaker portion 339, operation switches, and the like are provided as accessory equipment.

As illustrated in FIG. 22A, a display panel 332 which utilizes a display element is incorporated into a chassis 331. The television device can receive general TV broadcast with a receiver 335, and can be connected to a wired or wireless communication network via a modem 334, so that one-way information communication from a sender to a receiver or two-way information communication between a sender and a receiver or between receivers can be performed. The television device can be operated with a switch built in the chassis, or a remote control unit 336 which is provided separately. The remote control unit 336 may also have a display portion 337 for displaying information to be outputted. Further, the display portion 337 may be provided with the thin film transistor described in Embodiments 1 to 6. Furthermore, the television device may include a sub-screen 338 formed using a second display panel for displaying channels, volume, and the like, in addition to the main screen 333. In this structure, the thin film transistor described in Embodiments 1 to 6 can be employed for the main screen 333 and the sub-screen 338.

Figure 23:
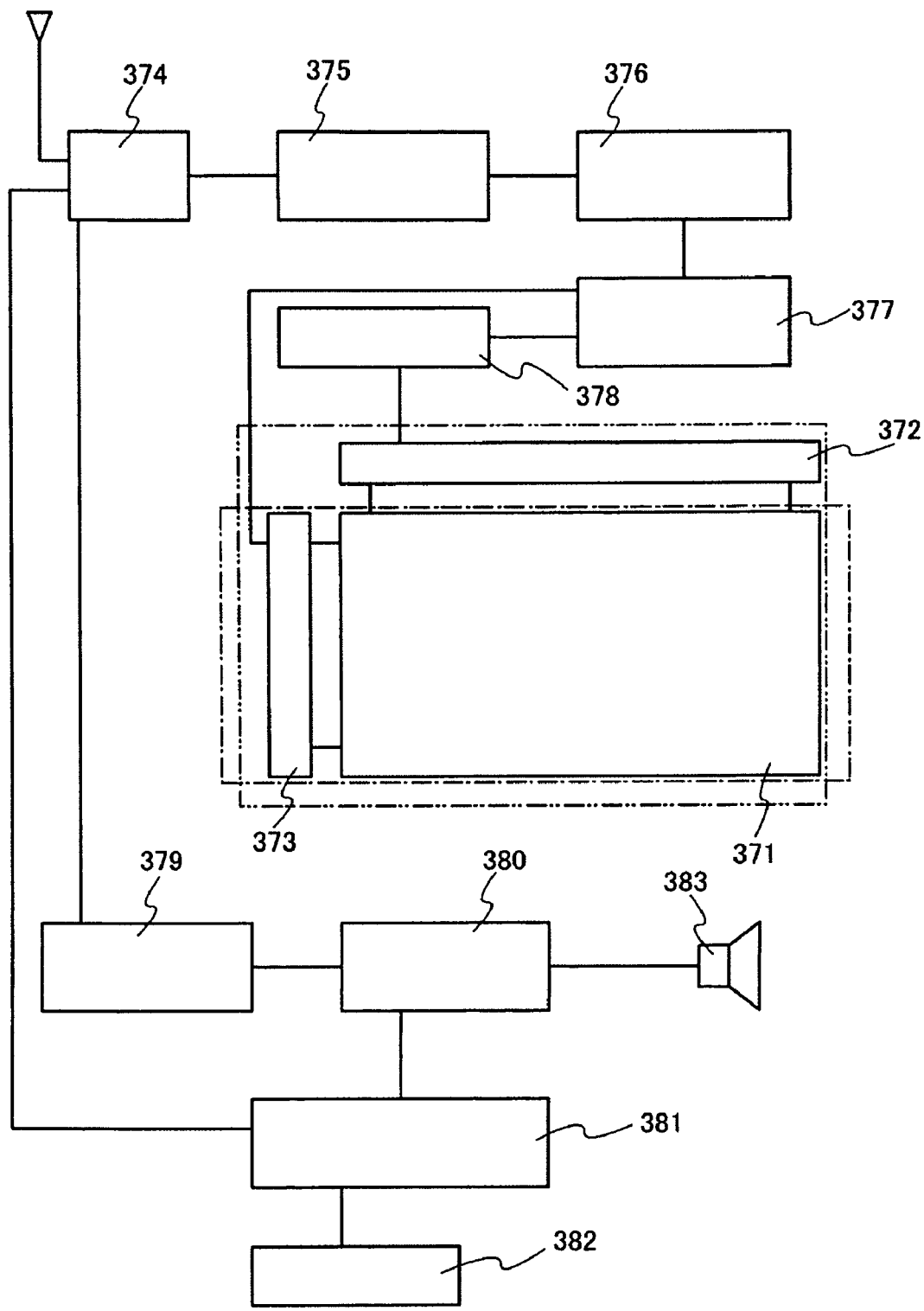
FIG. 23 is a drawing illustrating an electronic device and the like for which a thin film transistor according to embodiments can be employed.

FIG. 23 is a block diagram of a main structure of a television device. A display panel is provided with a pixel portion 371. A signal line driver circuit 372 and a scanning line driver circuit 373 may be mounted on the display panel by a COG method Further, as other external circuits, a video signal amplifier circuit 375 which amplifies a video signal among signals received by a tuner 374, a video signal process circuit 376 which converts the signals output from the video signal amplifier circuit 375 into color signals corresponding to their respective colors of red, green, and blue, a control circuit 377 which converts the video signal so that the video signal can match input specification of a driver IC, and the like are provided on an input side of the video signal. The control circuit 377 outputs signals to both a scanning line side and a signal line side. In the case of digital driving, a signal dividing circuit 378 may be provided on the signal line side and an input digital signal may be divided into m signals and supplied.

An audio signal among signals received by the tuner 374 is transmitted to an audio signal amplifier circuit 379 and an output therefrom is supplied to a speaker 383 through an audio signal processing circuit 380. A control circuit 381 receives control information on a receiving station (receiving frequency) or sound volume from an input portion 382 and transmits the signal to the tuner 374 and the audio signal processing circuit 380.

Needless to say, the display device is not limited to television devices, and may be applied to a variety of applications such as monitors of personal computers, or display media that have a large area, such as information display boards in railway stations, airports, and the like, and street-side advertisement display boards.

As described above, the thin film transistor described in Embodiments 1 to 6 is employed for either or both the main screen 333 and the sub-screen 338, whereby a television device with high image quality and low power consumption can be manufactured.

Figure 22B:
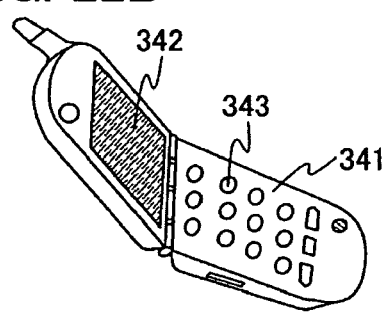

FIG. 22B illustrates an example of a mobile phone 341. The mobile phone 341 includes a display portion 342, an operation portion 343, and the like. The thin film transistor described in Embodiments 1 to 6 is employed for the display portion 342, whereby image quality can be improved and power consumption can be reduced.

Figure 22C:
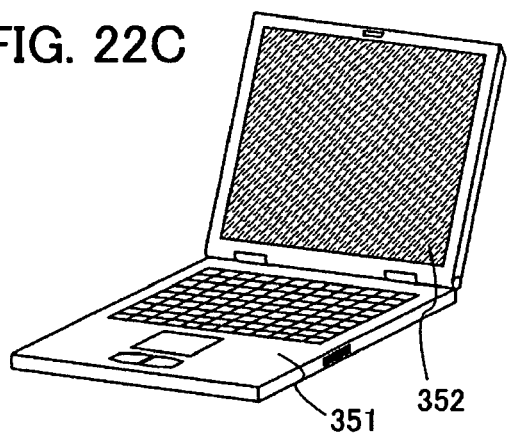

A portable computer illustrated in FIG. 22C includes a main body 351, a display portion 352, and the like. The thin film transistor described in Embodiments 1 to 6 is employed for the display portion 352, whereby image quality can be improved and power consumption can be reduced.

Figure 22D:
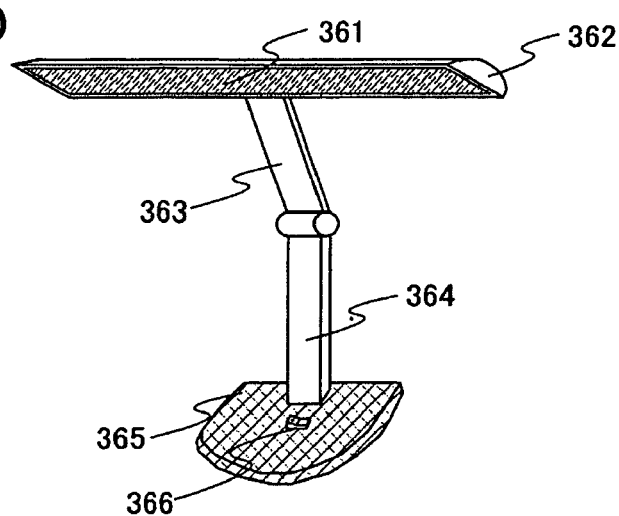

FIG. 22D illustrates a desk lamp including a lighting portion 361, a shade 362, an adjustable arm 363, a support 364, a base 365, a power supply 366, and the like. The desk lamp is manufactured using the light-emitting device which is described in the above embodiments for the lighting portion 361. The thin film transistor described in Embodiments 1 to 6 is employed for the lighting portion 361, whereby image quality can be improved and power consumption can be reduced.

Figure 24A:
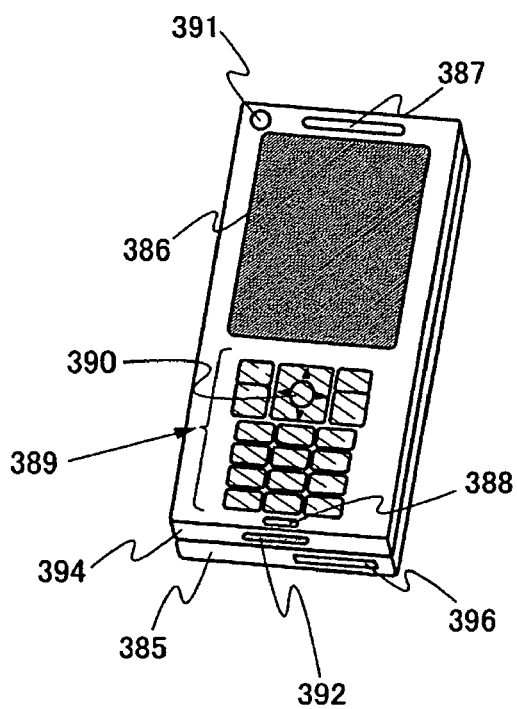
FIGS. 24A to 24C are drawings illustrating an electronic device and the like, for which a thin film transistor according to embodiments can be employed.
Figure 24B:
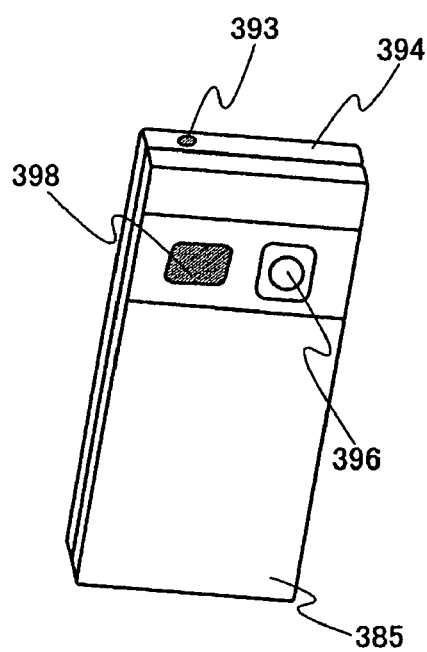
Figure 24C:
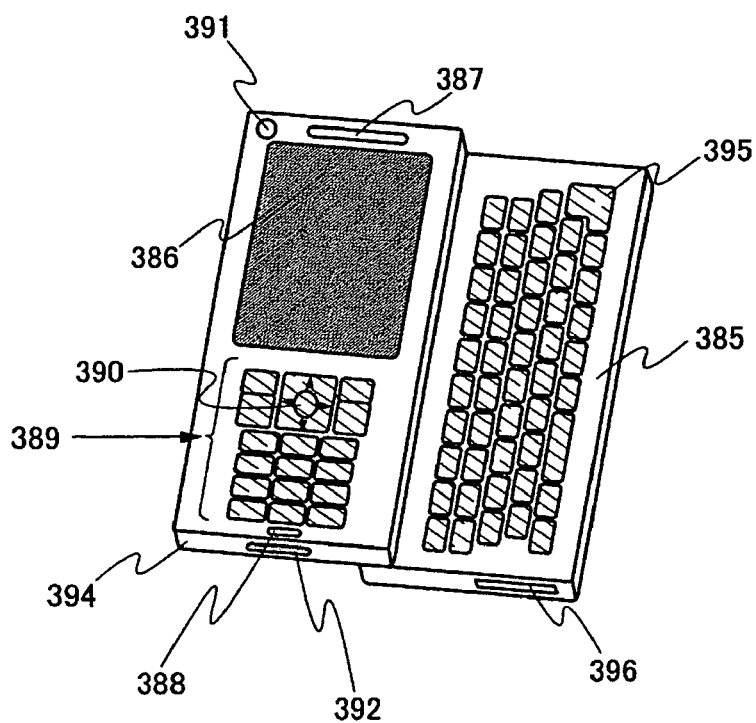

FIGS. 24A to 24C illustrate an example of a mobile phone. For example, an element substrate including the thin film transistor described in Embodiments 1 to 6 and a display device including the element substrate including the thin film transistor described in Embodiments 1 to 6 are employed for a display portion. FIG. 24A is a front view, FIG. 24B is a rear view, and FIG. 24C is a front view in which two chassis are slid. A mobile phone has chassis 394 and 385. The mobile phone has both functions of a mobile phone and a portable information terminal, and incorporates a computer. The mobile phone is an electronic device so-called a smartphone which is capable of various data processing in addition to voice call.

A mobile phone has chassis 394 and 385. The chassis 394 includes a display portion 386, a speaker 387, a microphone 388, operation keys 389, a pointing device 390, a front camera lens 391, a jack 392 for an external connection terminal, an earphone terminal 393, and the like. The chassis 385 includes a keyboard 395, an external memory slot 396, a rear camera 397, a light 398, and the like. In addition, an antenna is incorporated in the chassis 394.

Further, in addition to the above structure, the mobile phone may incorporate a non-contact IC chip, a small memory device, or the like.

The chassis 394 and 385 which overlap with each other in FIG. 24A can be slid, and are developed by being slid as illustrated in FIG. 24C. In the display portion 386, the display device described in Embodiments 1 to 6 can be incorporated, and a display direction can be changed depending on a use mode. Because the front camera lens 391 and the display portion 386 are provided in the same plane, the smartphone can be used as a videophone. A still image and a moving image can be taken by the rear camera 397 and the light 398 by using the display portion 386 as a viewfinder.

The speaker 387 and the microphone 388 can be used for videophone, recording, playback, and the like without being limited to verbal communication. With the use of the operation keys 389, further, operations of incoming and outgoing calls, simple information input for electronic mails or the like, scrolling of a screen displayed on the display portion, cursor movement, and the like are possible.

If much information needs to be handled in documentation, a use as a portable information terminal, and the like, it is convenient to use the keyboard 395. When the chassis 394 and 385 which overlap with each other (FIG. 24A) slide out as illustrated in FIG. 24C, the smartphone is used as a portable information terminal. Further, smooth operation can be conducted by using the keyboard 395 and the pointing device 390. The jack 392 for an external connection terminal can be connected to various cables such as an AC adopter or a USB cable, whereby the mobile phone can be charged or can perform data communication with a personal computer or the like through the jack 392 for an external connection terminal. Furthermore, by inserting a storage medium into the external memory slot 396, a large amount of data can be stored and moved.

The rear face of the chassis 385 (see FIG. 24B) is provided with the rear camera 397 and the light 398, and a still image and a moving image can be taken using the display portion 386 as a viewfinder.

Further, the mobile phone may have an infrared communication function, a USB port, a function of receiving one segment television broadcast, a non-contact IC chip, an earphone jack, or the like, in addition to the above functions and structures.

The thin film transistor described in Embodiments 1 to 6 is employed for a pixel, whereby display quality can be improved and power consumption can be reduced.

This application is based on Japanese Patent Application serial no. 2008-110393 filed with Japan Patent Office on Apr. 21, 2008, the entire contents of which are hereby incorporated by reference.

What is claimed is:

1. A method for manufacturing a semiconductor device comprising steps of:
   introducing a gas in which a silicon hydride gas, a silicon fluoride gas, or a silicon chloride gas and a hydrogen gas are mixed into a treatment chamber;
   generating glow discharge plasma to form a first semiconductor layer over an insulating surface in the treatment chamber, wherein at least a part of the first semiconductor layer includes nitrogen or a nitride in the first semiconductor layer;
   introducing a gas including an impurity element serving as a donor into the treatment chamber after forming the first semiconductor layer; and
   forming a second semiconductor layer over the first semiconductor layer in the treatment chamber, wherein the second semiconductor layer includes the impurity element serving as a donor and includes a crystal region and an amorphous region.

2. The method for manufacturing a semiconductor device according to claim 1 further comprising steps of:
   forming a third amorphous semiconductor layer over the second semiconductor layer; and
   forming a fourth semiconductor layer having one conductivity type which forms source and drain regions over the third amorphous semiconductor layer.

3. The method for manufacturing a semiconductor device according to claim 1,
   wherein before the introduction of the gas in which the silicon hydride gas, the silicon fluoride gas, or the silicon chloride gas and the hydrogen gas are mixed into the treatment chamber, a gas including nitrogen is temporarily introduced into the treatment chamber so that nitrogen which disturbs generation of crystal nuclei remains.

4. The method for manufacturing a semiconductor device according to claim 1,
wherein the impurity element serving as a donor is phosphorus, arsenic, antimony, or bismuth.

5. A method for manufacturing a semiconductor device, comprising steps of:
forming a gate electrode over a substrate which has an insulating surface;
forming a gate insulating layer over the gate electrode;
introducing a gas in which a semiconductor source gas and a dilution gas are mixed into a treatment chamber;
generating glow discharge plasma to form a first semiconductor layer over the gate insulating layer in the treatment chamber, wherein at least a part of the first semiconductor layer includes an impurity element which disturbs generation of crystal nuclei in the first semiconductor layer;
introducing a gas including an impurity element serving as a donor into the treatment chamber after forming the first semiconductor layer;
forming a second semiconductor layer over the first semiconductor layer in the treatment chamber, wherein the second semiconductor layer includes the impurity element serving as a donor and includes a crystal region and an amorphous region;
forming a buffer layer using an amorphous semiconductor over the second semiconductor layer;
forming an impurity semiconductor layer having one conductivity type which forms source and drain regions over the buffer layer; and
forming source and drain electrodes over the impurity semiconductor layer having one conductivity type.

6. The method for manufacturing a semiconductor device according to claim 5,
wherein before the introduction of the gas in which the semiconductor source gas and the dilution gas are mixed into the treatment chamber, a gas including nitrogen is temporarily introduced into the treatment chamber so that nitrogen which disturbs generation of crystal nuclei remains.

7. The method for manufacturing a semiconductor device according to claim 5,
wherein the semiconductor source gas is a silicon hydride gas, a silicon fluoride gas, or a silicon chloride gas, and
wherein the dilution gas is a hydrogen gas.

8. The method for manufacturing a semiconductor device according to claim 5,
wherein the impurity element which disturbs generation of crystal nuclei is nitrogen or a nitride.

9. The method for manufacturing a semiconductor device according to claim 5,
wherein the impurity element serving as a donor is phosphorus, arsenic, antimony, or bismuth.

10. A method for manufacturing a semiconductor device, comprising steps of:
forming a gate electrode over a substrate which has an insulating surface;
forming a gate insulating layer over the gate electrode;
introducing a gas in which a first semiconductor source gas and a first dilution gas are mixed into a treatment chamber;
generating glow discharge plasma to form a first semiconductor layer over the gate insulating layer in the treatment chamber, wherein at least a part of the first semiconductor layer includes an impurity element which disturbs generation of crystal nuclei in the first semiconductor layer;
halting the glow discharge plasma;
halting the introduction of the gas in which the first semiconductor source gas and the first dilution gas are mixed;
introducing a gas including an impurity element serving as a donor into the treatment chamber after forming the first semiconductor layer;
halting the introduction of the gas including an impurity element serving as a donor;
introducing a gas in which a second semiconductor source gas and a second dilution gas are mixed into the treatment chamber;
generating glow discharge plasma;
forming a second semiconductor layer over the first semiconductor layer in the treatment chamber, wherein the second semiconductor layer includes a crystal region and an amorphous region;
forming a buffer layer using an amorphous semiconductor over the second semiconductor layer;
forming an impurity semiconductor layer having one conductivity type which forms source and drain regions over the buffer layer; and
forming source and drain electrodes over the impurity semiconductor layer having one conductivity type.

11. The method for manufacturing a semiconductor device according to claim 10,
wherein before the introduction of the gas in which the first semiconductor source gas and the first dilution gas are mixed into the treatment chamber for forming the first semiconductor layer, a gas including nitrogen is temporarily introduced into the treatment chamber so that nitrogen which disturbs generation of crystal nuclei remains.

12. The method for manufacturing a semiconductor device according to claim 10,
wherein as the gate insulating layer, an insulating layer including nitrogen which disturbs generation of crystal nuclei is formed.

13. The method for manufacturing a semiconductor device according to claim 12,
wherein the insulating layer including nitrogen which disturbs generation of crystal nuclei is deposited in the treatment chamber in advance.

14. The method for manufacturing a semiconductor device according to claim 10,
wherein the first semiconductor source gas is a silicon hydride gas, a silicon fluoride gas, or a silicon chloride gas, and
wherein the first dilution gas is a hydrogen gas.

15. The method for manufacturing a semiconductor device according to claim 10,
wherein the second semiconductor source gas is a silicon hydride gas, a silicon fluoride gas, or a silicon chloride gas, and
wherein the second dilution gas is a hydrogen gas.

16. The method for manufacturing a semiconductor device according to claim 10,
wherein the impurity element which disturbs generation of crystal nuclei is nitrogen or a nitride.

17. The method for manufacturing a semiconductor device according to claim 10,
wherein the impurity element serving as a donor is phosphorus, arsenic, antimony, or bismuth.

* * * * *